US011959166B2

(12) United States Patent
Pfenninger et al.

(10) Patent No.: US 11,959,166 B2
(45) Date of Patent: Apr. 16, 2024

(54) METHODS OF FABRICATING THIN FILMS COMPRISING LITHIUM-CONTAINING MATERIALS

(71) Applicants: Massachusetts Institute of Technology, Cambridge, MA (US); ETH Zurich, Zurich (CH)

(72) Inventors: Reto Max Pfenninger, Olten (CH); Michal Struzik, Warsaw (PL); Inigo Garbayo, Pamplona (ES); Andreas Nenning, Vienna (AT); Jennifer Rupp, Cambridge, MA (US)

(73) Assignees: Massachusetts Institute of Technology, Cambridge, MA (US); ETH Zurich, Zurich (CH)

( * ) Notice: Subject to any disclaimer, the term of this patent is extended or adjusted under 35 U.S.C. 154(b) by 0 days.

(21) Appl. No.: 17/268,344

(22) PCT Filed: Aug. 13, 2019

(86) PCT No.: PCT/US2019/046314
§ 371 (c)(1),
(2) Date: Feb. 12, 2021

(87) PCT Pub. No.: WO2020/036936
PCT Pub. Date: Feb. 20, 2020

(65) Prior Publication Data
US 2021/0332473 A1    Oct. 28, 2021

Related U.S. Application Data

(60) Provisional application No. 62/718,842, filed on Aug. 14, 2018.

(51) Int. Cl.
C23C 14/34    (2006.01)
C23C 14/08    (2006.01)
(Continued)

(52) U.S. Cl.
CPC ........ *C23C 14/3485* (2013.01); *C23C 14/088* (2013.01); *C23C 14/24* (2013.01);
(Continued)

(58) Field of Classification Search
None
See application file for complete search history.

(56) References Cited

U.S. PATENT DOCUMENTS 5,106,821 A * 4/1992 Homma .............. H01L 39/2435
505/476
5,338,625 A    8/1994 Bates et al.
(Continued)

FOREIGN PATENT DOCUMENTS

CN    103137930 A    6/2013
EP    2 800 101 A1    11/2014
(Continued)

OTHER PUBLICATIONS

Morales, M. et al. Characterization of lanthanum lithium titanate thin films deposited by radio frequency sputtering on [100]—oriented MgO substrates Thin Solid Films 418 (2002) 119-128. (Year: 2002).*
(Continued)

*Primary Examiner* — James Lin
(74) *Attorney, Agent, or Firm* — Wolf, Greenfield & Sacks, P.C.

(57) ABSTRACT

Thin films of lithium-containing materials and methods for fabricating them are generally described. In some embodiments, the formation of a first vapor is induced from a first target and the formation of a second vapor is induced from a second target, resulting in the formation of a thin film. In some embodiments, at least a portion of the formation of the first vapor and the formation of the second vapor occurs under vacuum conditions. In some embodiments, the thin
(Continued)

film has a relatively high ionic conductivity, mixed ionic/electronic conductivity, or other properties beneficial for applications such as active electrode materials or solid-state electrolytes.

28 Claims, 20 Drawing Sheets

(51) Int. Cl.
 *C23C 14/24* (2006.01)
 *C23C 14/54* (2006.01)
 *H01M 4/1391* (2010.01)
(52) U.S. Cl.
 CPC ........ *C23C 14/3464* (2013.01); *C23C 14/542* (2013.01); *H01M 4/1391* (2013.01)

(56) References Cited

U.S. PATENT DOCUMENTS

| | | | |
|---|---|---|---|
| 5,824,434 | A | 10/1998 | Kawakami et al. |
| 7,314,682 | B2 | 1/2008 | Thackeray et al. |
| 9,034,525 | B2 | 5/2015 | Babic et al. |
| 9,334,557 | B2 | 5/2016 | Neudecker et al. |
| 9,431,067 | B2 | 8/2016 | Ohwada et al. |
| 2003/0062254 | A1* | 4/2003 | Choi ................ C23C 14/3464 257/E21.585 |
| 2004/0048157 | A1* | 3/2004 | Neudecker .......... H01M 4/5825 427/126.3 |
| 2007/0148553 | A1 | 6/2007 | Weppner |
| 2009/0081554 | A1 | 3/2009 | Takada et al. |
| 2009/0159433 | A1 | 6/2009 | Neudecker et al. |
| 2009/0162755 | A1 | 6/2009 | Neudecker |
| 2010/0203383 | A1 | 8/2010 | Weppner |
| 2012/0237835 | A1 | 9/2012 | Yada et al. |
| 2014/0170465 | A1 | 6/2014 | Visco et al. |
| 2015/0037688 | A1 | 2/2015 | Otsuka et al. |
| 2016/0013513 | A1 | 1/2016 | Gaben |
| 2016/0336583 | A1 | 11/2016 | Smith et al. |
| 2017/0179522 | A1 | 6/2017 | Choi et al. |
| 2017/0309899 | A1 | 10/2017 | Son et al. |
| 2018/0216225 | A1* | 8/2018 | Song .......................... B08B 3/12 |
| 2018/0233745 | A1 | 8/2018 | Yura et al. |
| 2020/0131643 | A1 | 4/2020 | Chan et al. |
| 2021/0214839 | A1* | 7/2021 | Pfenninger .......... C23C 14/3414 |

FOREIGN PATENT DOCUMENTS

| | | |
|---|---|---|
| EP | 2 896 962 A1 | 7/2015 |
| WO | WO 2002/021627 A2 | 3/2002 |
| WO | WO 2005/085138 A1 | 9/2005 |
| WO | WO 2007/004590 A1 | 1/2007 |
| WO | WO 2007/111901 * | 10/2007 |
| WO | WO 2008/090894 A1 | 7/2008 |
| WO | WO 2009/003695 A2 | 1/2009 |
| WO | WO 2009/029746 A1 | 3/2009 |
| WO | WO 2010/090301 A1 | 8/2010 |
| WO | WO 2011/128976 A1 | 10/2011 |
| WO | WO 2012/114193 A1 | 8/2012 |
| WO | WO 2012/173874 A2 | 12/2012 |
| WO | WO 2015/111495 A1 | 7/2015 |
| WO | 2017/116599 A2 | 7/2017 |
| WO | WO 2018/085847 A1 | 5/2018 |
| WO | WO 2018/236394 A1 | 12/2018 |

OTHER PUBLICATIONS

International Search Report and Written Opinion from International Patent Application No. PCT/US19/46314, dated Nov. 1, 2019.

Wikipedia, "Sputter deposition," Dec. 14, 2017. Retrieved on Oct. 9, 2019 from https://en.wikipedia.org/w/index.php?title=Sputter_deposition&oldid=815420228.
International Preliminary Report on Patentability for PCT/US2019/046314 dated Feb. 25, 2021.
[No Author Listed], Next Generation of Energy Storage Uniquely Powered by its Own Supply Chain. Investing News Network. Accessed Nov. 4, 2021 as available Sep. 15, 2020 from <https://web.archive.org/web/20200915104411/https://investingnews.com/company-profiles/vanadiumcorp-tsx-vrb-energy-storage-technology-vanadium-batteries/>.
Ahn et al., Characteristics of perovskite (Li0.5La0.5)TiO3 solid electrolyte thin films grown by pulsed laser deposition for rechargeable lithium microbattery. Electrochimica Acta. Nov. 30, 2004;50(2-3):371-4.
Chen et al., Sol-gel derived Li—La—Zr—O thin films as solid electrolytes for lithium-ion batteries. Journal of Materials Chemistry A. 2014;2:13277-82. Epub Jun. 18, 2014.
Kalita et al., Ionic conductivity properties of amorphous Li—La—Zr—O solid electrolyte for thin film batteries. Solid State Ionics. Dec. 14, 2012;229:14-9. Epub Nov. 17, 2012.
Kim, et al. "Epitaxial growth and lithium ion conductivity of lithium-oxide garnet for an all solid-state battery electrolyte," Dalton Transactions, vol. 42. pp. 13112-13117. Jul. 5, 2013.
Knauth, Inorganic solid Li ion conductors: An overview. Solid State Ionics. Jun. 25, 2009;180(14-6):911-6.
Lobe et al., Radio frequency magnetron sputtering of Li7La3Zr2O12 thin films for solid-state batteries. Journal of Power Sources. Mar. 1, 2016;307:684-9. Epub Feb. 1, 2016.
Murugan et al., Fast lithium ion conduction in garnet-type Li(7)La(3)Zr(2)O(12). Angew Chem Int Ed. 2007;46(41):7778-81. Epub Sep. 5, 2007.
Nong et al., Properties and preparation of Li—La—Ti—Zr—O thin film electrolyte. Materials Letters. Sep. 1, 2015;154:167-9. Epub Apr. 25, 2015.
Pfenniger et al., A low ride on processing temperature for fast lithium conduction in garnet solid-state battery films. Nature Energy. 2019;4:475-83. Epub May 20, 2019.
Rawlence et al., Effect of Gallium Substitution on Lithium-Ion Conductivity and Phase Evolution in Sputtered Li 7-3 x Ga x La 3 Zr 2 O 12 Thin Films. ACS Appl Mater Interfaces. Apr. 25, 2018;10(16):13720-8. Epub Apr. 12, 2018.
Rawlence et al., On the chemical stability of post-lithiated garnet Al-stabilized Li7La3Zr2O12 solid state electrolyte thin films. Nanoscale. 2016;8:14746-53. Epub Jul. 20, 2016.
Schwenzel et al., Developments of high-voltage all-solid-state thin-film lithium ion batteries. Journal of Power Sources. Mar. 9, 2006;154(1):232-8.
Teng, et al. "Recent developments in garnet based solid state electrolytes for thin film batteries," Current Opinion in Solid State and Materials Science, vol. 18, Issue 1. pp. 29-38. Nov. 1, 2013.
Thangadurai et al., Garnet-type solid-state fast Li ion conductors for Li batteries: critical review. Chemical Society Reviews. 2014;43:4714-27. Epub Mar. 31, 2014.
Van Den Broek et al., Interface-Engineered All-Solid-State Li-Ion Batteries Based on Garnet-Type Fast Li+ Conductors. Advanced Energy Materials. 2016;6(19):1600736. 11 pages.
Wang et al., Characterization of Thin-Film Rechargeable Lithium Batteries with Lithium Cobalt Oxide Cathodes. Journal of the Electrochemical Society. Oct. 1996;143(10):3203-13.
Yi et al., Flame made nanoparticles permit processing of dense, flexible, Li+ conducting ceramic electrolyte thin films of cubic-Li7La3Zr2O12 (c-LLZO). Journal of Materials Chemistry A. 2016;4:12947-54. Epub Aug. 1, 2016.

* cited by examiner

US 11,959,166 B2

METHODS OF FABRICATING THIN FILMS COMPRISING LITHIUM-CONTAINING MATERIALS

RELATED APPLICATIONS

This application is a national stage filing under 35 U.S.C. § 371 of International Patent Application No. PCT/US2019/046314, filed on Aug. 13, 2019, and entitled "METHODS OF FABRICATING THIN FILMS COMPRISING LITHIUM-CONTAINING MATERIALS," which claims the benefit under 35 U.S.C. § 119(e) of U.S. Provisional Application No. 62/718,842, filed on Aug. 14, 2018, and entitled "METHODS OF FABRICATING THIN FILMS COMPRISING LITHIUM-CONTAINING MATERIALS," each of which is incorporated herein by reference in its entirety for all purposes.

TECHNICAL FIELD

The fabrication of thin films containing lithium-containing materials is generally described.

BACKGROUND

Many energy storage systems require highly integrated microbattery designs combined with high energy-/power-density electrodes. Solid state electrolyte and electrode materials provide a unique set of features that position them as promising candidates for future high energy-density battery systems. Thin films of lithium-containing materials such as lithium-containing oxides are of particular interest for these applications, but challenges exist for the efficient fabrication of such films.

SUMMARY

Inventive methods of fabricating thin films comprising lithium-containing materials are provided. In some embodiments, the formation of a first vapor is induced from a first target comprising a lithium-containing material and the formation of a second vapor is induced from a second target comprising lithium and nitrogen, resulting in the formation of a thin film. In some embodiments, at least a portion of the formation of the first vapor and the formation of the second vapor occurs under vacuum conditions.

The subject matter of the present invention involves, in some cases, interrelated products, alternative solutions to a particular problem, and/or a plurality of different uses of one or more systems and/or articles.

In some embodiments, methods are provided. In some embodiments, the methods comprise inducing formation of a first vapor from a first target comprising a lithium-containing material and formation of a second vapor from a second target comprising lithium and nitrogen such that the first vapor and the second vapor are deposited on a surface. In some cases, as a result, a thin film comprising a lithium-containing material is formed on the surface. In some embodiments, at least a portion of the formation of the first vapor and at least a portion of the formation of the second vapor occur under vacuum conditions.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shah control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1:
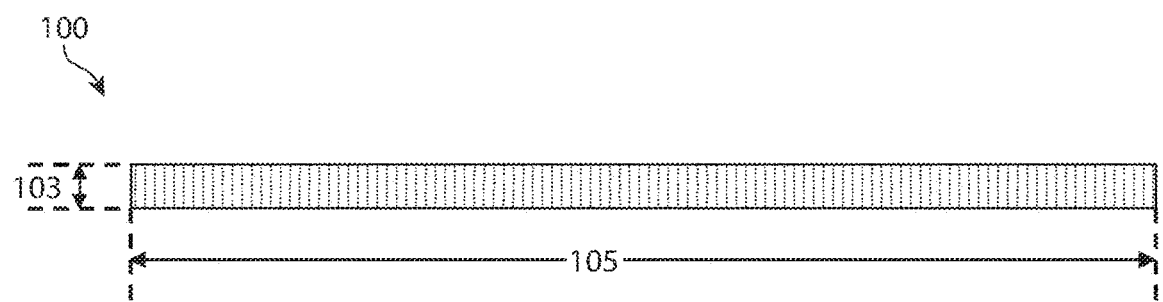
FIG. 1 shows a cross-sectional schematic of a thin film, according to certain embodiments.

Methods and articles related to the fabrication of thin films comprising lithium-containing materials are generally described. The thin films can, in some embodiments, have high lithium content (e.g., high lithium ion content).

In some embodiments, a thin film is provided. In some cases, the thin film contains a lithium-containing material. In some cases, the lithium-containing material is suitable for use as a solid-state electrolyte, as a intercalation-type electrode material, or as a conversion-type electrode material. In some cases, the lithium-containing material is a lithium-containing oxide, such as a lithium metal oxide (e.g., $LiCoO_2$, $Li_7Ti_5O_{12}$) or a ceramic (e.g., in the form of the cubic phase of garnet LLZO, represented herein by the formula the $Li_aLa_bZr_cO_dX_e$). The thin film may comprise the above elements in stoichiometries or crystallographic phases that correspond to high lithium ion conductivities, but are typically difficult to efficiently achieve in thin film form. Achieving such properties in films having high lithium contents may be desirable for certain applications, such as solid state electrolytes or electrodes in solid state batteries or microbatteries. The thin film may be produced, in accordance with certain embodiments, by physical vapor deposition techniques (e.g., pulsed laser deposition, radio frequency sputtering (RF-sputtering)). In some embodiments, fabrication of the thin film involves, under vacuum conditions, inducing the formation of a first vapor from a first target (e.g., a target comprising a lithium-containing material such as a lithium-containing oxide) and the formation of a second vapor from a second target (e.g., a target comprising lithium and nitrogen). In some embodiments, the first vapor and the second vapor are deposited on to a surface to form a thin film. In some embodiments, the first vapor and the second vapor are formed simultaneously, while in some embodiments the first vapor and the second vapor are formed sequentially (sometimes resulting in the formation of an intermediate multilayer thin film comprising alternating layers of different chemical composition that are later treated to be more homogeneous). The use of these methods may result in a lithium-containing thin film (e.g., containing a lithium-containing oxide such as $LiCoO_2$ or the cubic phase of $Li_7La_3Zr_2O_{12}$, optionally with a dopant and optionally comprising nitrogen) with improved properties. In some, but not necessarily all such embodiments, the thin film has a higher total ionic conductivity, lithium ion conductivity, and/or mixed ionic/electronic conductivity as compared to thin films not formed using the methods described herein (e.g., without the use of a second target comprising lithium and nitrogen (e.g., in the form of a lithium nitride during a PVD process)). In some embodiments, the thin films are fabricated a faster rate, or at a lower temperature, using the methods described herein as compared to previous methods.

Lithium-containing materials are promising materials for use in emerging technologies such as electrode materials as well as electrolytes for microbatteries. Certain properties such as high lithium content can be desirable for some such applications, but several fabrication problems exist in transferring the use of lithium-containing materials (e.g., lithium-containing oxides, sulfides, phosphates, or oxynitrides) to thin film form. Without wishing to be bound by any particular theory, the vacuum conditions and high temperatures (e.g., >500° C.) employed during the fabrication of some of these materials (e.g., LLZO) usually lead to partial delithiation of the material, thereby reducing the ionic conductivity and/or mixed ionic/electronic conductivity of the material and consequently the usefulness of the material for these applications. This problem is compounded in the case of thin films, which possess high surface to volume ratios and are therefore even more susceptible to delithiation and other problems, such as poor morphology (e.g., cracks, loose packing, etc.). Additionally, preparation of thin films containing certain phases of the lithium-containing materials (e.g., the highly conductive cubic phase of LLZO) have proven to be elusive. Again without wishing to be bound by any particular theory, it is possible that precise control over the stoichiometry of the thin films comprising lithium-containing materials during fabrication (e.g., precise control over lithium content and/or doping) can lead to the stabilization of certain desirable phases. The methods described herein, some of which involve the use of a second target comprising lithium and nitrogen (e.g., in the form of a lithium nitride) during fabrication of the thin film, provide, in some embodiments, thin films useful for certain applications (e.g., the cubic phase of LLZO for a solid-state electrolyte, or lithium titanium oxide, amorphous silicon, and/or antimony for an active electrode material) and having beneficial properties both in terms of total ionic conductivity, lithium ion conductivity, mixed ionic/electronic conductivity, and/or morphology (e.g., high density and uniformity).

Certain embodiments are related to thin films. For example, FIG. 1 shows a cross-sectional schematic illustration of exemplary thin film 100.

In some embodiments, the thin film comprises certain elements, the presence of which, at least in part, contribute to the thin film having desirable properties (e.g., stability, ionic conductivity, mixed ionic/electronic conductivity, ability to intercalate/deintercalate lithium). In some embodiments, the thin film comprises a lithium-containing material. In some cases, the lithium-containing material is a lithium-containing oxide. Referring back to FIG. 1, thin film 100 comprises a lithium-containing material, according to certain embodiments.

The thin film can comprise a variety of different lithium-containing materials. For example, in some embodiments, the lithium-containing material is an intercalation-type electrode material (e.g., a material into which an ion such as a Li ion can be reversibly inserted). In some embodiments, the lithium-containing material is a conversion-type electrode material (e.g., a material which reacts and changes properties significantly during lithiation). In certain embodiments, the lithium-containing material is a material suitable for use as a solid-state electrolyte (e.g., possessing a high ionic conductivity and a low electronic conductivity).

In some embodiments, the lithium-containing material comprises a lithium metal oxide (i.e., an oxide comprising lithium and at least one other metal). In some cases, the lithium-containing material comprises one or more transition metals. In some cases, the lithium-containing material is a lithium metal oxide comprising one or more transition metals. In some cases, the lithium-containing material comprises cobalt, nickel, iron, boron, manganese, vanadium, or a combination thereof, at lattice sites. In some cases, the lithium-containing material comprises a lithium-containing oxide comprising cobalt, nickel, iron, boron, manganese, vanadium, or a combination thereof, at lattice sites. For example, in some embodiments, the lithium-containing material comprises lithium, cobalt, and oxygen. One non-limiting example is the case in which the lithium-containing oxide comprises $LiCoO_2$, wherein optionally one or more dopants replaces Li, Co, and/or O at one or more lattice sites. In some embodiments, the lithium-containing material comprises lithium, nickel, and oxygen. In some cases, the lithium-containing oxide comprises $LiNiO_2$, wherein optionally one or more dopants replaces Li, Ni, and/or O at one or more lattice sites. In some embodiments, the lithium-containing material (e.g., a lithium-containing oxide) comprises lithium, iron, and oxygen. One such example would be the case where the lithium-containing oxide comprises $LiFeO_2$, wherein optionally one or more dopants replaces Li, Fe, and/or O at one or more lattice sites. As yet another example, in some embodiments, the lithium-containing material comprises lithium, boron, and oxygen, wherein optionally one or more dopants replaces Li, B, and/or O at one or more lattice sites. In some embodiments, the lithium-containing material comprises lithium, manganese, and oxygen. As a non-limiting example, in some embodiments, the lithium-containing oxide comprises $LiMn_2O_4$, wherein optionally one or more dopants replaces Li, Mn, and/or O at one or more lattice sites. Additionally, in some cases, the lithium-containing material comprises lithium, vanadium, and oxygen. For example, in some cases, the lithium-containing oxide comprises $LiVO_3$ or $LiV_2O_5$, wherein optionally one or more dopants replaces Li, V, and/or O at one or more lattice sites. As mentioned above, in some cases, the lithium-containing material (e.g., a lithium-containing oxide) comprises a combination of multiple metals (e.g., transition metals). One such example is the case where the lithium-containing oxide comprises lithium, nickel, manganese, cobalt, and oxygen. One such non-limiting example is the case where the lithium-containing oxide comprises $LiNiMnCoO_2$, wherein optionally one or more dopants replaces Li, Ni, Mn, Co, and/or O.

Another exemplary case is one in which the lithium-containing material (e.g., a lithium-containing oxide) comprises titanium. For example, in some embodiments, the lithium-containing material comprises lithium, titanium, and oxygen. One such example would be the case where the lithium-containing material comprises $Li_4Ti_5O_{12}$ and/or $Li_7Ti_5O_{12}$, wherein optionally one or more dopants replaces Li, Ti, and/or O at one or more lattice sites.

In some cases, the lithium-containing material comprises aluminum. For example, in some embodiments, the lithium-containing material comprises lithium β-alumina, wherein optionally one or more dopants replaces Li, Al, and/or O at one or more lattice sites. In other cases, the lithium-containing material comprises aluminum in combination with other elements at lattice sites. For example, in some embodiments, the lithium-containing material comprises aluminum and silicon at lattice sites. One such embodiment is the case in which the lithium-containing material comprises lithium, aluminum, silicon, and oxygen. For example, in some embodiments, the lithium-containing material comprises $Li_9AlSiO_8$, wherein optionally one or more dopants replaces Li, Al, Si and/or O at one or more lattice sites.

In some embodiments, the lithium-containing material comprises a garnet (i.e., an oxide having the general garnet lattice structure). One non-limiting example of a case where the lithium-containing material comprises a garnet is when the lithium-containing material comprises lithium, lanthanum, zirconium, and oxygen. For example, referring back to FIG. 1, thin film 100 comprises lithium, lanthanum, zirconium, and oxygen, according to certain embodiments. In some embodiments, the lithium-containing material comprises a perovskite (i.e., a material satisfying the general perovskite lattice structure, e.g., an $ABO_3$ structure). One non-limiting example is the case in which the lithium-containing material comprises a lithium lanthanum titanate, wherein optionally one or more dopants replaces Li, La, Ti, and/or O at one or more lattice sites.

The thin film can comprise a variety of different lithium-containing materials besides oxides. For example, in some embodiments, the thin film comprises a lithium-containing sulfide. Certain lithium-containing sulfides display beneficial properties for use as solid-state electrolytes. In some cases, the lithium-containing material comprises germanium, phosphorus, and sulfur at lattice sites. As a particular example, in some embodiments, the lithium-containing material comprises $Li_{10}GeP_2S_{12}$, wherein optionally one or more dopants replaces Li, Ge, P, and/or S at one or more lattice sites. Other classes of lithium-containing materials include, but are not limited to, borates, phosphates and/or oxynitrides. In some cases, the lithium-containing material comprises phosphorus, oxygen, and nitrogen at lattice sites. One such exemplary class of lithium-containing material comprises lithium phosphorus oxynitrides (LIPONs). In some embodiments, the lithium-containing material comprises closo-borates. In some embodiments, the lithium-containing material comprises lithium, one or more transition metals, and phosphates. For example, in some embodiments, the lithium-containing material comprises a lithium iron phosphate (e.g., $LiFePO_4$, wherein optionally one or more dopants replaces Li, Fe, P, and/or O at one or more lattice sites). Lithium vanadium phosphates are also possible lithium-containing materials as used herein. In some cases, the thin film comprises a lithium-containing amorphous silicon material. In some other cases, thin film comprises a lithium-containing amorphous antimony material.

In some, but not necessarily all embodiments, the thin film has a relatively high total ionic conductivity. In some embodiments, the thin film has a total ionic conductivity of at least $1.0 \times 10^{-6}$ S·cm$^{-1}$ at 23° C. Having a relatively high total ion conductivity can, in accordance with certain embodiments, improve the performance of a thin film in certain applications. For example, having a relatively high total ionic connectivity can, in some cases, improve of the performance of a thin film as an electrode or as a solid-state electrolyte (e.g., in a battery or microbattery). Referring back to FIG. 1, in accordance with certain embodiments, exemplary thin film 100 has a relatively high total ionic conductivity. For example, in accordance with certain embodiments, thin film 100 comprises lithium, lanthanum, zirconium, and oxygen, and has a total ionic conductivity of at least $1.0 \times 10^{-5}$ S·cm$^{-1}$ at 23° C. As another example, in some cases, thin film 100 comprises lithium, lanthanum, titanium, and oxygen (e.g., in a perovskite structure), and has a total ionic conductivity of at least $1.0 \times 10^{-6}$ S cm$^{-1}$ at 23° C. As another example, in some cases thin film 100 comprises lithium, phosphorous, nitrogen, and oxygen (e.g., a LiPON material), and has a total ionic conductivity of at least $1.0 \times 10^{-6}$ S·cm$^{-1}$ at 23° C. Other exemplary lithium-containing materials having high total ionic conductivities that the thin film may comprise include but are not limited to lithium-containing sulfides such as $Li_2S$ glasses and LGPS (e.g., containing lithium germanium phosphorus sulfur) materials such as $Li_{10}GeP_2S_{12}$, lithium-containing phosphates such as those containing aluminum and titanium and those containing aluminum, and lithium-containing closo-borates. In some embodiments, the through-thickness total ion conductivity (i.e., total ionic conductivity measured in the thickness-dimension of the thin film) is at least $1.0 \times 10^{-6}$ S·cm$^{-1}$ at 23° C. The through-thickness conductivity may be important for certain applications, such as solid-state electrolytes. In some embodiments, the in-plane total ionic conductivity (i.e., total ionic conductivity measured in the plane formed by the lateral dimensions of the thin film) is at least $1.0 \times 10^{-6}$ S·cm$^{-1}$ at 23° C. In some embodiments, the through-thickness conductivity and the in-plane conductivity of the thin film are similar (e.g., within 50%, within 25%, within 10%, within 5% of each other) or are the same.

The ionic conductivity of a material (e.g., a thin film) generally relates to the conductivity of the material (i.e., the movement of charge in response to an electric field) due to the mobility of ionic charge. The ionic conductivity of solids in particular relates to the mobility of ions within the solid structure (e.g., within the lattice and interstitial space therein). Ionic conductivity can be expressed as a product of three terms: the carrier charge, the number of particles per unit volume (i.e., the concentration of the carriers/ions), and the mobility of the carriers.

Total ionic conductivity refers to ionic conductivity due to the mobility of any ion in a material. Lithium ion conductivity generally refers to ionic conductivity due to the mobility of lithium ions in particular. For example, the lithium ion conductivity of a solid relates to the mobility of lithium ions ($Li^+$) within the solid. In some cases, where lithium ions are the primary mobile ion and/or where lithium content is variable, having a high lithium ion conductivity correlates strongly with total ionic conductivity of a material. Because the lithium ion conductivity of a material can be expressed as the product of the three terms described above, it is evident that solids with a) a high concentration of lithium and/or lithium ions, and/or b) a high lithium ion mobility (e.g., due to having a certain lattice structure or phase), typically have high lithium ion conductivities and consequently high total ionic conductivities.

In certain applications, it is beneficial for the thin film to have a relatively high ionic conductivity and a relatively low electronic conductivity (i.e., conductivity due to the mobility of electronic charge). For example, when used as a solid-state electrolyte in an electrochemical cell (e.g., a Li battery), it may be desirable for the thin film to be able to conduct ions (e.g., $Li^+$ ions) but not electrons/holes (to an appreciable extent) so as to prevent short-circuiting of the electrochemical cell. In some, but not necessarily all embodiments, the thin film is an electronic insulator. As such, in some embodiments, the thin film has an electronic conductivity of less than or equal to $1.0 \times 10^{-5}$ S·cm$^{-1}$, less than or equal to $1.0 \times 10^{-6}$ S·cm$^{-1}$ less than or equal to $1.0 \times 10^{-7}$ S·cm$^{-1}$, less than or equal to $1.0 \times 10^{-8}$ S·cm$^{-1}$, less than or equal to $1.0 \times 10^{-9}$ S·cm$^{-1}$, or less.

The ionic conductivity (e.g., lithium ion conductivity) of a solid can be measured using electrical impedance spectroscopy. For example, the total ionic conductivity of a thin film can be measured by coupling the thin film to electrodes connected to an impedance measurement device. An example of a suitable impedance measurement device is a Zahner IM6 (Germany). The total ionic conductivity of the thin film can be measured by using the impedance measurement using an in-plane geometry to collect Nyquist data in, for example, the frequency range of 1 Hz to 1 MHz at a variety of different temperatures, and then analyzing the Nyquist data with computer software such as ZView 3.4f and/or OriginPro 9.1. Alternatively, the thin film can be coupled to electrodes in such a way that the through-thickness conductivity of the thin film is measured, using the same type of impedance measurement as in the case of in-plane conductivity. A variable temperature experiment (using, for examples a heater to vary the temperature of the thin film) can also be conducted to measure the Arrhenius activation energy of the thin film. Impedance spectroscopy can also be used to measure mixed ionic/electronic conductivity. Four-point probe methods can be used to measure electronic conductivity alone.

As mentioned above, in some embodiments, the thin film has a relatively high total ionic conductivity. In some embodiments, the thin film has a total ionic conductivity of at least $1.0 \times 10^{-6}$ S·cm$^{-1}$ at 23° C. In some embodiments, the thin film has a total ionic conductivity of at least $1.0 \times 10^{-6}$ S·cm$^{-1}$, at least $5.0 \times 10^{-6}$ S·cm$^{-1}$, at least $1.0 \times 10^{-5}$ S·cm$^{-1}$, at least $1.2 \times 10^{-5}$ S·cm$^{-1}$, at least $1.5 \times 10^{-5}$ S·cm$^{-1}$, at least $1.75 \times 10^{-5}$ S·cm$^{-1}$, at least $2.0 \times 10^{-5}$ S·cm$^{-1}$, at least $5.0 \times 10^{-5}$ S·cm$^{-1}$, at least $1.0 \times 10^{-4}$ S·cm$^{-1}$, at least $5.0 \times 10^{-4}$ S·cm$^{-1}$, at least $1.0 \times 10^{-3}$ S·cm$^{-1}$, at least $5.0 \times 10^{-3}$ S·cm$^{-1}$, at least $1.0 \times 10^{-2}$ S·cm$^{-1}$, or more at 23° C. In some embodiments, the thin film has a total ionic conductivity of up to 1.0 S·cm$^{-1}$ at 23° C. In some embodiments, the thin film has a total ionic conductivity of up to $7.5 \times 10^{-1}$ S·cm$^{-1}$, up to $5.0 \times 10^{-1}$ S·cm$^{-1}$, up to $3.0 \times 10^{-1}$ S·cm$^{-1}$, up to $2.0 \times 10^{-1}$ S·cm$^{-1}$, up to $1.0 \times 10^{-1}$ S·cm$^{-1}$, up to $5.0 \times 10^{-2}$ S·cm$^{-1}$, up to $1.0 \times 10^{-2}$ S·cm$^{-1}$, up to $5.0 \times 10^{-3}$ S·cm$^{-1}$, up to $1.0 \times 10^{-3}$ S·cm$^{-1}$, up to $5.0 \times 10^{-4}$ S·cm$^{-1}$, up to $5.0 \times 10^{-4}$ S·cm$^{-1}$, up to $3.0 \times 10^{-4}$ S·cm$^{-1}$, up to $2.0 \times 10^{-4}$ S·cm$^{-1}$, up to $1.0 \times 10^{-4}$ S·cm$^{-1}$, up to $5.0 \times 10^{-5}$ S·cm$^{-1}$, or less at 23° C. Combinations of these ranges are possible. For example, in some embodiments, the thin film has a total ionic conductivity of at least $1.0 \times 10^{-6}$ S·cm$^{-1}$ and up to 1.0 S·cm$^{-1}$ at 23° C., or at least $1.0 \times 10^{-5}$ S·cm$^{-1}$ and up to $1.0 \times 10^{-2}$ S·cm$^{-1}$ at 23° C.

In some embodiments, the thin film has a through-thickness total ionic conductivity falling within any one of these ranges. In some embodiments, the thin film has an in-plane total ionic conductivity falling within any one of these ranges.

In some embodiments, the thin film has a relatively high lithium ion conductivity in particular. In some cases, the lithium-containing material is a lithium superionic conductor (LISICON). In some embodiments, the thin film has a lithium ion conductivity of at least $1.0 \times 10^{-5}$ S·cm$^{-1}$ at 23° C. In some embodiments, the thin film has a lithium ion conductivity of at least $1.0 \times 10^{-6}$ S·cm$^{-1}$ at 23° C., at least $5.0 \times 10^{-6}$ S·cm$^{-1}$, at least $1.0 \times 10^{-5}$ S·cm$^{-1}$, at least $1.2 \times 10^{-5}$ S·cm$^{-1}$, at least $1.5 \times 10^{-5}$ S·cm$^{-1}$, at least $1.75 \times 10^{-5}$ S·cm$^{-1}$, at least $2.0 \times 10^{-5}$ S·cm$^{-1}$, at least $5.0 \times 10^{-5}$ S·cm$^{-1}$, at least $1.0 \times 10^{-4}$ S·cm$^{-1}$, at least $5.0 \times 10^{-4}$ S·cm$^{-1}$, at least $1.0 \times 10^{-3}$ S·cm$^{-1}$, at least $5.0 \times 10^{-3}$ S·cm$^{-1}$, at least $1.0 \times 10^{-2}$ S·cm$^{-1}$, or more at 23° C. In some embodiments, the thin film has a lithium ion conductivity of up to 1.0 S·cm$^{-1}$ at 23° C. In some embodiments, the thin film has a lithium ion conductivity of up to $7.5 \times 10^{-1}$ S·cm$^{-1}$, up to $5.0 \times 10^{-1}$ S·cm$^{-1}$, up to $3.0 \times 10^{-1}$ S·cm$^{-1}$, up to $2.0 \times 10^{-1}$ S·cm$^{-1}$, up to $5.0 \times 10^{-2}$ S·cm$^{-1}$, up to $1.0 \times 10^{-2}$ S·cm$^{-1}$, up to $5.0 \times 10^{-3}$ S·cm$^{-1}$, up to $1.0 \times 10^{-3}$ S·cm$^{-1}$, up to $5.0 \times 10^{-4}$ S·cm$^{-1}$, up to $5.0 \times 10^{-4}$ S·cm$^{-1}$, up to $3.0 \times 10^{-4}$ S·cm$^{-1}$, up to $2.0 \times 10^{-4}$ S·cm$^{-1}$, up to $1.0 \times 10^{-4}$ S·cm$^{-1}$, up to $5.0 \times 10^{-5}$ S·cm$^{-1}$, or less at 23° C. Combinations of these ranges are possible. For example, in some embodiments, the thin film has a lithium ion conductivity of at least $1.0 \times 10^{-6}$ S·cm$^{-1}$ and up to 1.0 S·cm$^{-1}$ at 23°

C., or at least $1.0\times10^{-5}$ S·cm$^{-1}$ and up to $1.0\times10^{-2}$ S·cm$^{-1}$ at 23° C. In some embodiments, the thin film has a through-thickness lithium ion conductivity falling within any one of these ranges. In some embodiments, the thin film has an in-plane lithium ion conductivity falling within any one of these ranges.

In some, but not necessarily all embodiments, the thin film has a relatively high mixed ionic/electronic conductivity. Mixed ionic/electronic conductivity refers to the conductivity of the material (i.e., the movement of charge in response to an electric field) due to the mobility of a combination ionic and electronic charge (i.e., the sum of the total ionic conductivity and the electronic conductivity). Accordingly, in some embodiments, the thin film has both a relatively high ionic conductivity and a relatively high electronic conductivity. Materials having a high mixed ionic/electronic conductivity are referred to as mixed conductors. Having a relatively high mixed ionic/electronic conductivity can be beneficial for the thin films of lithium-containing materials in certain applications requiring mixed conductors, such as electrodes in electrochemical cells (e.g., in lithium ion batteries).

In some embodiments, the thin film has a mixed ionic/electronic conductivity of at least $1.0\times10^{-5}$ S·cm$^{-1}$ at 23° C. In some embodiments, the thin film has a mixed ionic/electronic conductivity of at least $1.2\times10^{-5}$ S·cm$^{-1}$, at least $1.5\times10^{-5}$ S·cm$^{-1}$, at least $2.0\times10^{-5}$ S·cm$^{-1}$, at least $2.5\times10^{-5}$ S·cm$^{-1}$, at least $3.0\times10^{-5}$ S·cm$^{-1}$, at least $5.0\times10^{-5}$ S·cm$^{-1}$, at least $1.0\times10^{-4}$ S·cm$^{-1}$, at least $5.0\times10^{-4}$ S·cm$^{-1}$, at least $1.0\times10^{-3}$ S·cm$^{-1}$, at least $1.0\times10^{-2}$ S·cm$^{-1}$, at least $1.0\times10^{-1}$ S·cm$^{-1}$, at least $1.0$ S·cm$^{-1}$, at least $1.0\times10^{1}$ S·cm$^{-1}$, at least $1.0\times10^{2}$ S·cm$^{-1}$, or at least $1.0\times10^{3}$ S·cm$^{-1}$. In some embodiments, the thin film has a mixed ionic/electronic conductivity of up to $7.0\times10^{5}$ S·cm$^{-1}$ at 23° C. In some embodiments, the thin film has a mixed ionic/electronic conductivity of up to $5.0\times10^{5}$ S·cm$^{-1}$, up to $5.0\times10^{5}$ S·cm$^{-1}$, up to $2.0\times10^{5}$ S·cm$^{-1}$, up to $1.0\times10^{5}$ S·cm$^{-1}$, up to $1.0\times10^{4}$ S·cm$^{-1}$, up to $1.0\times10^{3}$ S·cm$^{-1}$, up to $1.0\times10^{2}$ S·cm$^{-1}$, up to $1.0\times10^{1}$ S·cm$^{-1}$, up to $1.0$ S·cm$^{-1}$, or less at 23° C. Combinations of these ranges are possible. For example, in some embodiments, the thin film has a mixed ionic/electronic conductivity of at least $1.0\times10^{-5}$ S·cm$^{-1}$ and up to $7.0\times10^{5}$ S·cm$^{-1}$ at 23° C., or at least $2.0\times10^{-5}$ S·cm$^{-1}$ and up to $1.0$ S·cm$^{-1}$ at 23° C. In some embodiments, the thin film has a through-thickness mixed ionic/electronic conductivity falling within any one of these ranges. In some embodiments, the thin film has an in-plane mixed ionic/electronic conductivity falling within any one of these ranges.

As mentioned above, in some, but not necessarily all embodiments, it is beneficial for the thin film to have a relatively high electronic conductivity. In some embodiments, the thin film has an electronic conductivity of at least $1.0\times10^{-5}$ S·cm$^{-1}$, at least $2.0\times10^{-5}$ S·cm$^{-1}$, at least $5.0\times10^{-5}$ S·cm$^{-1}$, at least $1.0\times10^{-4}$ S·cm$^{-1}$, at least $5.0\times10^{-4}$ S·cm$^{-1}$, at least $1.0\times10^{-3}$ S·cm$^{-1}$, at least $1.0\times10^{-2}$ S·cm$^{-1}$, at least $1.0\times10^{-1}$ S·cm$^{-1}$, at least $1.0$ S·cm$^{-1}$, at least $1.0\times10^{1}$ S·cm$^{-1}$, at least $1.0\times10^{2}$ S·cm$^{-1}$, or at least $1.0\times10^{3}$ S·cm$^{-1}$. In some embodiments, the thin film has an electronic conductivity of up to $7.0\times10^{5}$ S·cm$^{-1}$ at 23° C. In some embodiments, the thin film has an electronic conductivity of up to $5.0\times10^{5}$ S·cm$^{-1}$, up to $5.0\times10^{5}$ S·cm$^{-1}$, up to $2.0\times10^{5}$ S·cm$^{-1}$, up to $1.0\times10^{5}$ S·cm$^{-1}$, up to $1.0\times10^{4}$ S·cm$^{-1}$, up to $1.0\times10^{3}$ S·cm$^{-1}$, up to $1.0\times10^{2}$ S·cm$^{-1}$, up to $1.0\times10^{1}$ S·cm$^{-1}$, up to $1.0$ S·cm$^{-1}$, or less at 23° C. Combinations of these ranges are possible. For example, in some embodiments, the thin film has an electronic conductivity of at least $1.0\times10^{-5}$ S·cm$^{-1}$ and up to $1.0\times10^{5}$ S·cm$^{-1}$ at 23° C., or at least $2.0\times10^{-5}$ S·cm$^{-1}$ at 23° C. and up to $1.0$ S cm$^{1}$ at 23° C.

In certain embodiments the thin film has a total ionic conductivity of at least $1.0\times10^{-6}$ S·cm$^{-1}$, at least $1.0\times10^{-5}$ S·cm$^{-1}$, at least $1.0\times10^{-4}$ S·cm$^{-1}$, at least $1.0\times10^{-3}$ S·cm$^{-1}$, or at least $1.0\times10^{-2}$ S·cm$^{-1}$, and a mixed ionic/electronic conductivity of at least $1.0\times10^{-5}$ S·cm$^{-1}$, at least $1.0\times10^{-4}$ S·cm$^{-1}$, at least $1.0\times10^{-3}$ S·cm$^{-1}$, at least $1.0\times10^{-2}$ S·cm$^{-1}$, at least $1.0\times10^{-1}$ S·cm$^{-1}$, or at least $1.0$ S·cm$^{-1}$.

In some embodiments, the thin film comprises one or more dopants. For example, in accordance with certain embodiments, thin film 100 comprises one or more dopants. In some embodiments, the thin film comprises a lithium-containing material (e.g., a lithium-containing material described above) and one or more dopants. In some embodiments, the thin film comprises a lithium-containing oxide (e.g., a lithium metal oxide described above) and one or more dopants. In certain embodiments, the thin film comprises lithium, lanthanum, zirconium, oxygen, and one or more dopants.

As used herein, a dopant is an element present in a material that is not a part of the host material of which the material is comprised. The host material is generally the predominant material having a repeating lattice unit in the solid. For example, the garnet material $Li_{6.25}Al_{0.25}La_3Zr_2O_{12}$ has a host material of LLZO ($Li_7La_3Zr_2O_{12}$), and aluminum as a dopant, because aluminum is not a part of the formula of the host material. The presence of one or more dopants can, in accordance with some embodiments, alter the properties of a solid material with respect to the host material. For example, the presence of a dopant can stabilize a certain phase of a material (e.g., a crystal phase) at certain temperatures. In some embodiments, the one or more dopants can be trace impurities present at very low concentrations. In some embodiments, the one or more dopants can be present at relatively high quantities (e.g., with respect to the elements present in the formula of the host material).

In some embodiments, the thin film comprises a host material. As described herein, a host material of a lithium-containing material has a chemical formula that excludes the dopants present at lattice sites. For example, as mentioned above, for the lithium-containing material $Li_{6.25}Al_{0.25}La_3Zr_2O_{12}$, the host material is $Li_7La_3Zr_2O_{12}$, as that is the formula of the predominant material having a repeating lattice unit in the solid. As such, the elements of the elements of the chemical formula of the host material of a lithium-containing material are all of the elements in included in the chemical formula of the lithium-containing material that are not dopant elements. Therefore, as an example, in the case in which the lithium-containing material of the thin film comprises $Li_{6.25}Al_{0.25}La_3Zr_2O_{12}$, the elements of the chemical formula of the host material of the lithium-containing material are lithium, lanthanum, zirconium and oxygen, because aluminum is a dopant and therefore not included in the chemical formula of the host material of the material.

In some cases, the elements of the chemical formula of the host material of the lithium-containing material (e.g., of the thin film and/or the first target) include lithium and a metal. In some cases, the chemical formula of the host material includes lithium, a metal, and oxygen (e.g., a lithium metal oxide). In some cases, the host material of the lithium-containing material comprises lithium, cobalt, and oxygen. In some such cases, the elements of the chemical formula of the host material are lithium, cobalt, and oxygen. Non-limiting examples include cases in which the lithium-containing material comprises $LiCoO_2$, or $Li_{0.85}Al_{0.05}CoO_2$, both of which have $LiCoO_2$ as their host material and therefore the elements of the chemical formula of the host material in these cases are lithium, cobalt, and oxygen. In some cases, the host material of the lithium-containing material comprises lithium, nickel, and oxygen. In some such cases, the elements of the chemical formula of the host material are lithium, nickel, and oxygen. In some cases, the host material of the lithium-containing material comprises lithium, iron, and oxygen. In some such cases, the elements of the chemical formula of the host material are lithium, iron, and oxygen. In some cases, the host material of the lithium-containing material comprises lithium, boron, and oxygen. In some such cases, the elements of the chemical formula of the host material are lithium, boron, and oxygen. In some cases, the host material of the lithium-containing material comprises lithium, manganese, and oxygen. In some such cases, the elements of the chemical formula of the host material are lithium, manganese, and oxygen. In some cases, the host material of the lithium-containing material comprises lithium, vanadium, and oxygen. In some such cases, the elements of the chemical formula of the host material are lithium, vanadium, and oxygen. In some cases, the host material comprises a combination of multiple different metals at lattice sites, and the elements of the host formula include the different metals. For example, in some cases, the host material of the lithium-containing material comprises lithium, nickel, manganese, and cobalt. In some such cases the elements of the chemical formula of the host material are lithium, nickel, manganese, and cobalt.

In some embodiments, the host material of the lithium-containing material comprises lithium, titanium, and oxygen. In some such cases, the elements of the chemical formula of the host material are lithium, titanium, and oxygen. For example, the host material of the lithium-containing material may be $Li_4Ti_5O_{12}$. In such an embodiment, the elements of the chemical formula of the host material are lithium, titanium, and oxygen. In some cases, the host material of the lithium-containing material comprises lithium, aluminum, and oxygen (e.g., lithium β-alumina). In some such cases, the elements of the chemical formula of the host material are lithium, aluminum, and oxygen. In some cases, the host material of the lithium-containing material comprises lithium, aluminum, silicon, and oxygen (e.g., $Li_9AlSiO_8$). In some such cases, the elements of the chemical formula of the host material are lithium, aluminum, silicon, and oxygen.

In certain embodiments, the host material of the lithium-containing material is a lithium-containing sulfide. In some cases, the host material of the lithium-containing material comprises lithium, germanium, phosphorus, and sulfur (e.g., $Li_{10}GeP_2S_{12}$). In some such cases, the elements of the chemical formula of the host material are lithium, germanium, phosphorus, and sulfur. In some embodiments, the host material of the lithium-containing material is a lithium-containing oxynitride. In some such cases, the host material of the lithium-containing material comprises lithium, phosphorus, oxygen, and nitrogen (e.g., LiPONs). In some such cases, the elements of the chemical formula of the host material of the material are lithium, phosphorus, oxygen, and nitrogen. In some embodiments, the host material of the lithium-containing material is a phosphate. In some such cases, the host material of the lithium-containing material comprises lithium, iron, phosphorus, and oxygen (e.g., $LiFePO_4$). In some such cases, the elements of the chemical formula of the host material are lithium, iron, phosphorus, and oxygen.

In some cases, a dopant is a substitutional element. A dopant that is a substitutional element replaces or substitutes for an element from the formula of the host material at a crystal lattice site. In some cases, the dopant does not replace an element at a lattice site. For example, in some cases a dopant is an interstitial element. An interstitial element is located in the space between lattice site locations in the material.

An example of one such case is that of dopants intercalated into a host material. As mentioned above, in some embodiments, the lithium-containing material of the thin film comprises a garnet-type material. In some embodiments, the thin film comprises a garnet-type material comprising lithium, lanthanum, zirconium, and oxygen. In some embodiments, the thin film comprises the cubic phase of $Li_aLa_bZr_cO_dX_e$, wherein X is at least one of the one or more dopants and e can be 0, and optionally wherein nitrogen replaces Li, La, Zr, O, and/or X at one or more of the lattice sites of the cubic lattice such that nitrogen is present in the $Li_aLa_bZr_cO_dX_e$ in an amount up to 1.0 atomic percent (at %). For example, referring back to FIG. 1, thin film 100 comprises, in accordance with certain embodiments, the cubic phase of $Li_aLa_bZr_cO_dX_e$, wherein X is at least one of the one or more dopants and e can be 0, and optionally wherein nitrogen replaces one or more of Li, La, Zr, O, and/or X at one or more of the lattice sites of the cubic lattice such that nitrogen is present in the $Li_aLa_bZr_cO_dX_e$ in an amount up to 1.0 at %. The presence of the cubic phase of $Li_aLa_bZr_cO_dX_e$ (with optional nitrogen substitution) may result in a thin film having a relatively high total ionic conductivity and/or high lithium ion conductivity and therefore a good suitability for use in certain applications (e.g., solid state electrolyte).

As used herein, the elements in the formula $Li_aLa_bZr_cO_dX_e$ refer to elements that occupy lattice sites of the cubic structure, and the subscripts a, b, c, d, and e are calculated accordingly. Additionally, when the formula $Li_aLa_bZr_cO_dX_e$ is recited along with the caveat that, optionally, nitrogen replaces Li, La, Zr, O, and/or X at one or more of the lattice sites of the cubic lattice, any of Li, La, Zr, O, and/or X can be replaced by nitrogen. In some embodiments, $Li_aLa_bZr_cO_dX_e$ optionally contains nitrogen at one or more of its lattice sites up to an atomic percentage of up to 0.01%, up to 0.1%, up to 0.5%, or up to 1.0%. The presence of nitrogen in the thin film is described further below. In some embodiments, the thin film comprises $Li_aLa_bZr_cO_dX_e$ (wherein optionally nitrogen replaces Li, La, Zr, O, and/or X at one or more of the lattice sites of the cubic lattice) and one or more interstitial elements. Such interstitial elements, when present, are not included in the formula used herein, because the formula corresponds to elements at lattice sites. In some embodiments, the interstitial elements include at least one of the one or more dopants in the thin film. In some embodiments, nitrogen is present as an interstitial element. As an example of how the formula $Li_aLa_bZr_cO_dX_e$ is used herein, in some embodiments, $Li_aLa_bZr_cO_dX_e$ refers to $Li_{6.25}La_3Zr_2O_{12}Al_{0.25}$, wherein nitrogen can, optionally, replace elements at one or more lattice sites of the $Li_{6.25}La_3Zr_2O_{12}Al_{0.25}$ lattice up to an atomic percentage of 1% (with respect to the atoms at lattice sites). Furthermore, in some embodiments, $Li_aLa_bZr_cO_dX_e$ refers to $Li_{6.25}La_3Zr_2O_{12}Al_{0.25}$, wherein at least one of the one or more dopants is present as an interstitial dopant (and therefore not included in the formula, despite being present). In each instance in which the cubic phase of $Li_aLa_bZr_cO_dX_e$ is mentioned herein, nitrogen may replace Li, La, Zr, O, and/or X at one or more of the lattice sites of the cubic lattice such that nitrogen is present in the $Li_aLa_bZr_cO_dX_e$ in an amount up to 1.0 at % (or up to 0.5 at %, up to 0.1 at %, or up to 0.01 at %). Of course, as noted elsewhere, nitrogen replacement is not required, and, accordingly, in each instance in which the cubic phase of $Li_aLa_bZr_cO_dX_e$ is mentioned herein, nitrogen may also be absent in the lattice structure.

Similarly, in each instance in which other chemical formulas for lithium-containing materials for the thin film are mentioned (e.g., for other lithium-containing metal oxides, or lithium-containing sulfides, phosphates, or oxynitrides), nitrogen may replace one of the elements listed in the chemical formula at one or more lattice sites. For example, in cases where the lithium-containing material of the thin film comprises $LiCoO_2$, nitrogen may replace Li, Co, or O at one or more of the lattice sites of the lattice such that nitrogen is present in the $LiCoO_2$ lattice in an amount up to 1.0 at % (or up to 0.5 at %, up to 0.1 at %, or up to 0.01 at %).

For a thin film comprising a material having the formula $Li_aLa_bZr_cO_dX_e$ (wherein optionally nitrogen replaces Li, La, Zr, O, and/or X at one or more of the lattice sites of the cubic lattice), the values of the stoichiometric coefficients (e.g., p b, c, d, and e) may fall within certain ranges. Having these stoichiometric coefficients within certain ranges, can, in some embodiments, lead to a material having a relatively high total ionic conductivity and/or lithium ion conductivity.

In some embodiments, a is in the range of from 4.0 to 9.0. In some embodiments, a is at least 4.0, at least 4.5, at least 5.0, at least 5.5, or at least 6.0. In some embodiments, a is less than or equal to 9.0, less than or equal to 8.5, less than or equal to 8.0, or less than or equal to 7.5. Combinations of these ranges are possible. For example, in some embodiments, a is at least 4.5 and less than or equal to 8.5. Other combinations are possible.

In some embodiments, b is in the range of from 1.5 to 4.0. In some embodiments, b is at least 1.5, at least 1.8, at least 2.0, at least 2.2, at least 2.5, or at least 2.8. In some embodiments, b is less than or equal to 4.0, less than or equal to 3.8, less than or equal to 3.5, less than or equal to 3.1, or less than or equal to 3.0. Combinations of these ranges are possible. For example, in some embodiments, b is at least 2.0 and less than or equal to 3.1. Other combinations are possible.

In some embodiments, c is in the range of from 1.5 to 2.1. In some embodiments, c is at least 1.5, at least 1.6, at least 1.7, at least 1.75, at least 1.8, or at least 1.9. In some embodiments, c is less than or equal to 2.1, or less than or equal to 2.0. Combinations of these ranges are possible. For example, in some embodiments, c is at least 1.75 and less than or equal to 2.0. Other combinations are possible.

In some embodiments, d is in the range of from 10.0 to 13.0. In some embodiments, d is at least 10.0, at least 10.5, at least 11.0, at least 11.5, or at least 11.8. In some embodiments, d is less than or equal to 13.0, less than or equal to 12.8, less than or equal to 12.5, less than or equal to 12.2, or less than or equal to 12.0. Combinations of these ranges are possible. For example, in some embodiments, d is at least 11.0 and less than or equal to 12.5. Other combinations are possible.

The stoichiometric coefficient e, as used herein, refers to the total combined stoichiometry of the one or more dopants (represented as X in the $Li_aLa_bZr_cO_dX_e$ formula) that are at lattice sites of the cubic $Li_aLa_bZr_cO_dX_e$ lattice (i.e., are substitutional dopants). For example, in some embodiments, aluminum is the only dopant and has a stoichiometry of 0.25. In such an embodiment, X is Al and e is 0.25. For example, in some embodiments, the thin film comprises the cubic phase of $Li_{6.25}La_3Zr_2O_{12}Al_{0.25}$ (wherein optionally nitrogen replaces Li, La, Zr, O, and/or X at one or more of the lattice sites of the cubic lattice). Referring back to FIG. 1, in accordance with certain embodiments, thin film 100 comprises the cubic phase of $Li_{6.25}La_3Zr_2O_{12}Al_{0.25}$ (wherein optionally nitrogen replaces Li, La, Zr, O, and/or X at one or more of the lattice sites of the cubic lattice).

As another example, in some embodiments, the one or more dopants comprise both calcium (having a stoichiometric coefficient of 0.2) and aluminum (having a stoichiometric coefficient of 0.25) at lattice sites. In such an embodiment, X refers to the combination of Ca and Al and e is 0.2+0.25=0.45. For example, in some embodiments, the thin film comprises the cubic phase of $Li_{6.25}La_{2.8}Zr_2O_{12}Ca_{0.2}Al_{0.25}$ (wherein optionally nitrogen replaces Li, La, Zr, O, and/or X at one or more of the lattice sites of the cubic lattice).

As another example, in some embodiments, the one or more dopants comprise both calcium (having a stoichiometric coefficient of 0.25) and niobium (having a stoichiometric coefficient of 0.25) at lattice sites. In such an embodiment, X refers to the combination of Ca and Nb and e is 0.25+0.25=0.50. For example, in some embodiments, the thin film comprises the cubic phase of $Li_7La_{2.75}Zr_{1.75}O_{12}Ca_{0.25}Nb_{0.25}$ (wherein optionally nitrogen replaces Li, La, Zr, O, and/or X at one or more of the lattice sites of the cubic lattice).

As another example, in some embodiments, the one or more dopants comprise niobium (having a stoichiometric coefficient of 0.25) at lattice sites. In such an embodiment, X refers to Nb and e is 0.25. For example, in some embodiments, the thin film comprises the cubic phase of $Li_7La_{2.75}Zr_{1.75}O_{12}Nb_{0.25}$ (wherein optionally nitrogen replaces Li, La, Zr, O, and/or X at one or more of the lattice sites of the cubic lattice). Other exemplary stoichiometries for $Li_aLa_bZr_cO_dX_e$ include, but are not limited to: $Li_{6.19}La_3Zr_{1.75}O_{12}Al_{0.28}Ta_{0.25}$, $Li_{6.19}La_3Zr_{1.75}O_{12}Al_{0.25}Ta_{0.25}$, $Li_{6.19}La_{2.75}Zr_{1.75}O_{12}Ca_{0.25}Ta_{0.25}$, $Li_{6.58}La_{2.75}Zr_{1.75}O_{12}Ga_{0.14}Ca_{0.25}Nb_{0.25}$, and/or $Li_{6.58}La_3Zr_{1.75}O_{12}Ga_{0.14}Nb_{0.25}$.

As mentioned above, regardless of the identity of X and the value of e, a thin film comprising $Li_aLa_bZr_cO_dX_e$, may optionally have nitrogen present at one or more lattice sites (replacing Li, La, Zr, O, and/or X at some sites), up to an atomic percentage of 1%, in accordance with certain embodiments. In some embodiments, the one or more dopants includes interstitial dopants, which may be present, but are not included in the formula $Li_aLa_bZr_cO_dX_e$ and do not affect the value of e. In some embodiments, e is in the range of from 0.0 to 4.0. In some embodiments, e is at least 0.01, at least 0.02, at least 0.05, at least 0.08, at least 0.1, at least 0.15, at least 0.2, at least 0.25, at least 0.3, at least 0.4, at least 0.5, at least 0.6, at least 0.8, at least 1.0, at least 1.2, at least 1.5, or at least 2.0. In some embodiments, e is less than or equal to 4.0, less than or equal to 3.8, less than or equal to 3.5, less than or equal to 3.0, less than or equal to 2.5, less than or equal to 2.0, less than or equal to 1.8, less than or equal to 1.5, less than or equal to 1.2, less than or equal to 1.0, less than or equal to 0.9, less than or equal to 0.8, less than or equal to 0.6, or less than or equal to 0.5. Combinations of the above ranges are possible. For example, in some embodiments, e is at least 0.1 and less than or equal to 0.5. Other combinations are possible.

As mentioned above, e can be 0, in accordance with certain embodiments, meaning that the presence of X is optional. In other words, in some embodiments, the thin film comprises a material of the formula $Li_aLa_bZr_cO_dX_e$ (wherein optionally nitrogen replaces Li, La, Zr, O, and/or X at one or more of the lattice sites of the cubic lattice), but the material does not comprise any dopants (i.e., any experimentally observable dopants) at lattice sites. For example, in accordance with certain embodiments, thin film 100 comprises the cubic phase of $Li_7La_3Zr_2O_{12}$. Again, even in such cases, nitrogen can optionally be present at one or more lattice sites (e.g., at an atomic percent of up to 1%).

In some embodiments, achieving thin films comprising the cubic phase of $Li_aLa_bZr_cO_dX_e$ (e.g., the cubic phase of LLZO) at the stoichiometries disclosed above is facilitated by the use of methods described herein. For example, in accordance with certain embodiments, the use of physical vapor deposition techniques (e.g., PLD, sputtering) with multiple targets (e.g., a first target and a second target comprising lithium and nitrogen (e.g., in the form of a lithium nitride, as described herein) to deposit such thin films may result in the films comprising the cubic phase of $Li_aLa_bZr_cO_dX_e$ with stoichiometries in the ranges disclosed above (e.g., with Li having a relatively high stoichiometric coefficient).

Garnet-type materials having formulas of the type $Li_aLa_bZr_cO_dX_e$, such as LLZO ($Li_7La_3Zr_2O_{12}$), can be polymorphic. In other words, the garnet-type materials can exist in one or more crystallographic phases. Examples of such phases include, but are not limited to, the cubic phase (phase group Ia3$^-$d), the tetragonal phase (phase group I4$_1$/acd), and the acentric cubic phase (phase group I-43d). In some embodiments, a thin film comprising the garnet-type material having one phase has different properties than thin films comprising the garnet-type material having one of the other phases. For example, in some embodiments, a thin film comprising the cubic phase of $Li_aLa_bZr_cO_dX_e$ has a greater total ionic conductivity than a thin film comprising the tetragonal phase of $Li_aLa_bZr_cO_dX_e$.

In some embodiments, stabilization of the one phase of a garnet-type material at certain temperatures is challenging. For example, it is typically difficult to stabilize the cubic phase of $Li_7La_3Zr_2O_{12}$ (e.g., toward polymorphism or delithiation), whereas it is generally less difficult to stabilize the tetragonal phase $Li_7La_3Zr_2O_{12}$. The presence of one or more dopant (e.g., aluminum) may, in accordance with certain embodiments and without wishing to be bound by any particular theory, help stabilize the cubic phase of $Li_7La_3Zr_2O_{12}$ at room temperature (23° C.). Additionally, in certain embodiments, the method by which a thin film is fabricated (e.g., via PVD with a first target and a second target comprising a lithium and nitrogen (e.g., in the form of a lithium nitride)) may also contribute to the stabilization of the cubic phase of $Li_aLa_bZr_cO_dX_e$ (e.g., $Li_7La_3Zr_2O_{12}$ or $Li_{6.25}Al_{0.25}La_3Zr_2O_{12}$) at room temperature.

As mentioned above, in some embodiments, the lithium-containing material of the thin film further comprises nitrogen. For example, in some embodiments, the thin film comprises lithium, lanthanum, zirconium, and oxygen, and further comprises nitrogen. Referring back to FIG. 1, thin film 100 comprises a lithium-containing material and nitrogen at a lattice site, in accordance with certain embodiments. For example, thin film 100 comprises lithium, lanthanum, zirconium, oxygen, and nitrogen, in accordance with certain embodiments. In some embodiments, the thin film comprises nitrogen at a lattice site. One such embodiment is that in which the film comprises the cubic phase of $Li_aLa_bZr_cO_dX_e$ and nitrogen has replaced Li, La, Zr, O, and/or X at one or more of the lattice sites of the cubic lattice. Another example is that in which the film comprises $LiCoO_2$ and nitrogen has replaced Li, Co, and/or O at one or more of the lattice sites of the cubic lattice. In some embodiments, the thin film comprises interstitial nitrogen. In some embodiments, a thin film comprising a lithium-containing material (e.g., a lithium-containing oxide) has a total ionic conductivity of at least $1.0 \times 10^6$ S·cm$^{-1}$ at 23° C. or at least $1.0 \times 10^{-5}$ S cm$^{-1}$ at 23° C. In some embodiments, a thin film comprising lithium, lanthanum, zirconium, oxygen, and nitrogen has a total ionic conductivity of at least $1.0 \times 10^{-5}$ S·cm$^{-1}$ at 23° C. As used herein, when a thin film is said to comprise nitrogen, the nitrogen being referred to is not in the form of molecular nitrogen ($N_2$). Rather, in such embodiments, the nitrogen in a thin film comprising nitrogen has an oxidation state other than zero. In some embodiments, the nitrogen is located at a lattice site in the thin film. In some embodiments, the nitrogen is distributed uniformly throughout the thin film. For example, referring back to FIG. 1, thin film 100 may comprise nitrogen that is uniformly distributed throughout thin film 100. Without wishing to be bound by any particular theory, it is possible that, in certain embodiments, the presence of the nitrogen in the thin film contributes, at least in part, to improved properties of the thin film. In some embodiments, the improved properties include, but are not limited to, increased total ionic conductivity, lithium ion conductivity, and/or mixed ionic/electronic conductivity.

The presence of nitrogen in the thin film is caused, in some embodiments, by the method of fabrication of the thin film. For example, in some embodiments, the thin film is formed by a PVD technique, and one of the targets for the PVD technique comprises a nitrogen-containing material (e.g., a lithium nitride, such as $Li_3N$). As a result, in some such embodiments, nitrogen from the nitrogen-containing target can be deposited and subsequently incorporated into the thin film during fabrication. For example, thin film 100 may be formed by a PVD technique in which a target comprises lithium and nitrogen (e.g., in the form of a lithium nitride), and as a result, thin film 100 may comprise nitrogen. In some embodiments, the thin film is formed initially as a multilayer film, and one of the layers comprises a nitrogen-containing material. For example, referring to FIG. 5, the thin film (e.g., thin film 100), in accordance with certain embodiments, may initially be formed as multilayer film 150, wherein multilayer film 150 comprises alternating layers of first layer 218 comprising a lithium-containing material (e.g., a lithium-containing oxide) and second layer 228, with second layer 228 comprising lithium and nitrogen (e.g., in the form of a lithium nitride). A post-processing step, such as annealing, may remove a majority (or nearly all) of the nitrogen in the multilayer film (e.g., due to thermal decomposition of the nitrogen-containing material in the multilayer film). However, in some embodiments, a detectable amount of nitrogen remains in the thin film, even after fabrication of the thin film is complete. For example, thin film 100, in accordance with certain embodiments, comprises nitrogen even after an annealing step. The presence of a detectable amount of nitrogen can therefore be used to determine whether a nitrogen-containing target (e.g., a target comprising lithium and nitrogen (e.g., in the form of a lithium nitride)) was used to form the thin film. It should be understood, however, that the absence of detectable nitrogen in a thin film does not necessarily preclude the possibility that such a nitrogen-containing target was used to form the thin film. The detectable nitrogen may be present at lattice sites of the thin film or as interstitial nitrogen.

In some embodiments, the thin film comprises a very small, but detectable, amount of nitrogen. The nitrogen in the thin film can be detected by using negative-ion time-of-flight secondary ion mass spectroscopy (TOF-SIMS) and observing a nitrogen signal above the detectable limit of the instrument (i.e., with an adequate signal to distinguish from noise in the data).

In some embodiments, a relatively high weight and/or atomic percentage of the thin film is made up of the lithium-containing material (e.g., a lithium-containing oxide, sulfide, phosphate, and/or oxynitride). Having a relatively high weight and/or atomic percentage of the thin film being made up of the lithium-containing material may result in the thin film having beneficial properties, such as high ionic conductivity, high mixed ionic/electronic conductivity, high activity as an electrode (e.g., in a lithium ion battery), and/or a high capacity for lithium intercalation/deintercalation. In some embodiments, at least 70 wt % of the thin film is made up of the lithium-containing material. In some embodiments, at least 75 wt %, at least 80 wt %, at least 85 wt %, at least 90 wt %, at least 95 wt %, at least 98 wt %, at least 99 wt %, or at least 99.9 wt % of the thin film is made up of the lithium-containing material. In some embodiments, a relatively high atomic percentage of the thin film is made up of the lithium-containing material. For example, in some embodiments, in terms of atomic percentage, at least 70% of the thin film is made up of the lithium-containing material. In some embodiments, in terms of atomic percentage, at least 75%, at least 80%, at least 85%, at least 90%, at least 95%, at least 98%, at least 99%, or at least 99.9% of the thin film is made up of a the lithium-containing material.

In some embodiments, a relatively high weight and/or atomic percentage of the thin film is made up of a combination of the elements that form the chemical formula of the host material of the lithium-containing material that the thin film comprises. Examples of materials that can be host materials in the thin film are described in more detail above and elsewhere herein. In some embodiments, at least 70 wt %, at least 75 wt %, at least 80 wt %, at least 85 wt %, at least 90 wt %, at least 95 wt %, at least 98 wt %, at least 99 wt %, or at least 99.9 wt % of the thin film is made up of a combination of the elements that form the chemical formula of the host material of the lithium-containing material. For example, in some embodiments, the lithium-containing material of the thin film has a host material having a chemical formula that includes only lithium, lanthanum, zirconium, and oxygen (e.g., a material such as $Li_aLa_bZr_cO_dX_e$), and at least 70 wt %, at least 75 wt %, at least 80 wt %, at least 85 wt %, at least 90 wt %, at least 95 wt %, at least 98 wt %, at least 99 wt %, or at least 99.9 wt % of the thin film is made up of a combination of lithium, lanthanum, zirconium, and oxygen.

In some embodiments, a relatively high atomic percentage of the thin film is made up of a combination of the elements that form the chemical formula of the host material of the lithium-containing material. For example, in some embodiments, in terms of atomic percentage, at least 70%, at least 75%, at least 80%, at least 85%, at least 90%, at least 95%, at least 98%, at least 99%, or at least 99.9% of the thin film is made up of a combination of the combination of the elements that form the chemical formula of the host material of the lithium-containing material. For example, in some embodiments, the thin film comprises $Li_aLa_bZr_cO_dX_e$, and, in terms of atomic percentage, at least 70%, at least 75%, at least 80%, at least 85%, at least 90%, at least 95%, at least 98%, at least 99%, or at least 99.9% of the thin film is made up of a combination of lithium, lanthanum, zirconium, and oxygen.

As another non-limiting example, in some embodiments, the lithium-containing material of the thin film has a host formula that includes only lithium, cobalt, and oxygen (e.g., the thin film comprises $LiCoO_2$, optionally wherein one or more dopants replaces Li, Co, and/or O at one or more lattice sites), and at least 70 wt %, at least 75 wt %, at least 80 wt %, at least 85 wt %, at least 90 wt %, at least 95 wt %, at least 98 wt %, at least 99 wt %, or at least 99.9 wt % of the thin film is made up of a combination of lithium, cobalt, and oxygen. In some embodiments, a relatively high atomic percentage of the thin film is made up of a combination of lithium, cobalt, and oxygen. For example, in some embodiments, in terms of atomic percentage, at least 70%, at least 75%, at least 80%, at least 85%, at least 90%, at least 95%, at least 98%, at least 99%, or at least 99.9% of the thin film is made up of a combination of lithium, cobalt, and oxygen. While $Li_aLa_bZr_cO_dX_e$, and $LiCoO_2$ have been given as explicit examples of lithium-containing materials for which the thin film may comprise a combination of the elements of the chemical formula of the host material of the lithium-containing material in the ranges disclosed above, the thin film may comprise a combination of the elements of the chemical formula of the host material of any of the lithium-containing materials described herein in the ranges for weight percentage and/or atomic percentage described above.

In some embodiments, a relatively high weight percentage of the thin film is made of the cubic phase of $Li_aLa_bZr_cO_dX_e$ (wherein optionally nitrogen replaces Li, La, Zr, O, and/or X at one or more of the lattice sites of the cubic lattice). For example, in some embodiments, at least 70 wt % of the thin film is made of the cubic phase of $Li_aLa_bZr_cO_dX_e$ (wherein optionally nitrogen replaces Li, La, Zr, O, and/or X at one or more of the lattice sites of the cubic lattice). Having a relatively high weight percentage of the thin film in the form of the cubic phase of $Li_aLa_bZr_cO_dX_e$ can lead to suitable performance by the thin film for certain applications) such as a solid-state electrolyte or electrode, for example, in a battery or microbattery), due to the cubic phase of $Li_aLa_bZr_cO_dX_e$ contributing to the thin film having a relatively high ionic conductivity. In some embodiments, at least 75 wt %, at least 80 wt %, at least 85 wt %, at least 90 wt %, at least 95 wt %, at least 98 wt %, at least 99 wt %, at least 99.9 wt % or more of the thin film is made of the cubic phase of $Li_aLa_bZr_cO_dX_e$ (wherein optionally nitrogen replaces Li, La, Zr, O, and/or X at one or more of the lattice sites of the cubic lattice). The formation of such a film, in some embodiments, may be facilitated by the use of methods described herein. For example, in accordance with certain embodiments, thin film 100 is deposited via a PVD technique involving a first target and a second target comprising lithium and nitrogen (e.g., in the form of a lithium nitride), and at least 70 wt % of thin film 100 comprises the cubic phase $Li_aLa_bZr_cO_dX_e$ wherein optionally nitrogen replaces Li, La, Zr, O, and/or X at one or more of the lattice sites of the cubic lattice (e.g., $Li_7La_3Zr_2O_{12}$ or $Li_{6.25}La_3Zr_2O_{12}Al_{0.25}$, optionally wherein nitrogen replaces Li, La, Zr, O, and/or X at one or more of the lattice sites of the cubic lattice).

In some embodiments, the combination of lithium, lanthanum, zirconium, and oxygen make up a relatively high weight percentage of the part of the thin film that is made of the cubic phase of $Li_aLa_bZr_cO_dX_e$. For example, in some embodiments, the combination of lithium, lanthanum, zirconium, and oxygen make up at least 80 wt % of the part of the thin film that is made of the cubic phase of $Li_aLa_bZr_cO_dX_e$ (wherein optionally nitrogen replaces Li, La, Zr, O, and/or X at one or more of the lattice sites of the cubic lattice). In some embodiments, the combination of lithium, lanthanum, zirconium, and oxygen make up at least 85 wt %, at least 90 wt %, at least 95 wt %, at least 98 wt %, at least 99 wt %, at least 99.9 wt % or more of the part of the thin film that is made of the cubic phase of $Li_aLa_bZr_cO_dX_e$ (wherein optionally nitrogen replaces Li, La, Zr, O, and/or X at one or more of the lattice sites of the cubic lattice).

In some embodiments, the part of the thin film that is made of the lithium-containing material has a relatively low weight percentage of elements that are not elements from the chemical formula of the host material. Examples of elements present in a lithium-containing material that are not elements from the chemical formula of the host material include both substitutional and interstitial dopants. For example, in some embodiments, the part of the thin film that is made of the lithium-containing material has a weight percentage of elements that are not a part of the chemical formula of the host material of less than or equal to 20 wt %, less than or equal to 10 wt %, less than or equal to 5 wt %, less than or equal to 2 wt %, less than or equal to 1 wt %, less than or equal to 0.1%, or less.

As a non-limiting example, in some embodiments, at least part of the thin film is made of the cubic phase of $Li_aLa_bZr_cO_dX_e$ (wherein optionally nitrogen replaces Li, La, Zr, O, and/or X at one or more of the lattice sites of the cubic lattice), and the part of the thin film that is made of the cubic phase of $Li_aLa_bZr_cO_dX_e$ (wherein optionally nitrogen replaces Li, La, Zr, O, and/or X at one or more of the lattice sites of the cubic lattice) has a weight percentage of elements that are not lithium, lanthanum, zirconium, or oxygen of less than or equal to 20 wt %, less than or equal to 10 wt %, less than or equal to 5 wt %, less than or equal to 2 wt %, less than or equal to 1 wt %, less than or equal to 0.1%, or less. As another non-limiting example, in some embodiments, at least part of the thin film is made of a lithium-containing material having a chemical formula of the host material that includes only lithium, cobalt, and oxygen (e.g., the thin film comprises $LiCoO_2$, optionally wherein one or more dopants replaces Li, Co, and/or O at one or more lattice sites), and that part has a weight percentage of elements that are not lithium, cobalt, or oxygen of less than or equal to 20 wt %, less than or equal to 10 wt %, less than or equal to 5 wt %, less than or equal to 2 wt %, less than or equal to 1 wt %, less than or equal to 0.1%, or less. These ranges for weight percent for the elements not in the host formula of the lithium-containing material contained in the thin film may apply to any of the lithium-containing materials described herein.

As described above, the thin films described herein can be formed by certain methods that allow for various problems typically associated with the fabrication of the thin films to be overcome (e.g., underlithiation of lithium-containing thin films such as those containing the lithium-containing materials described above, such as lithium-containing oxides like cubic LLZO or lithium-containing materials that comprise cobalt, titanium, aluminum, sulfides, etc.).

Figure 2A:
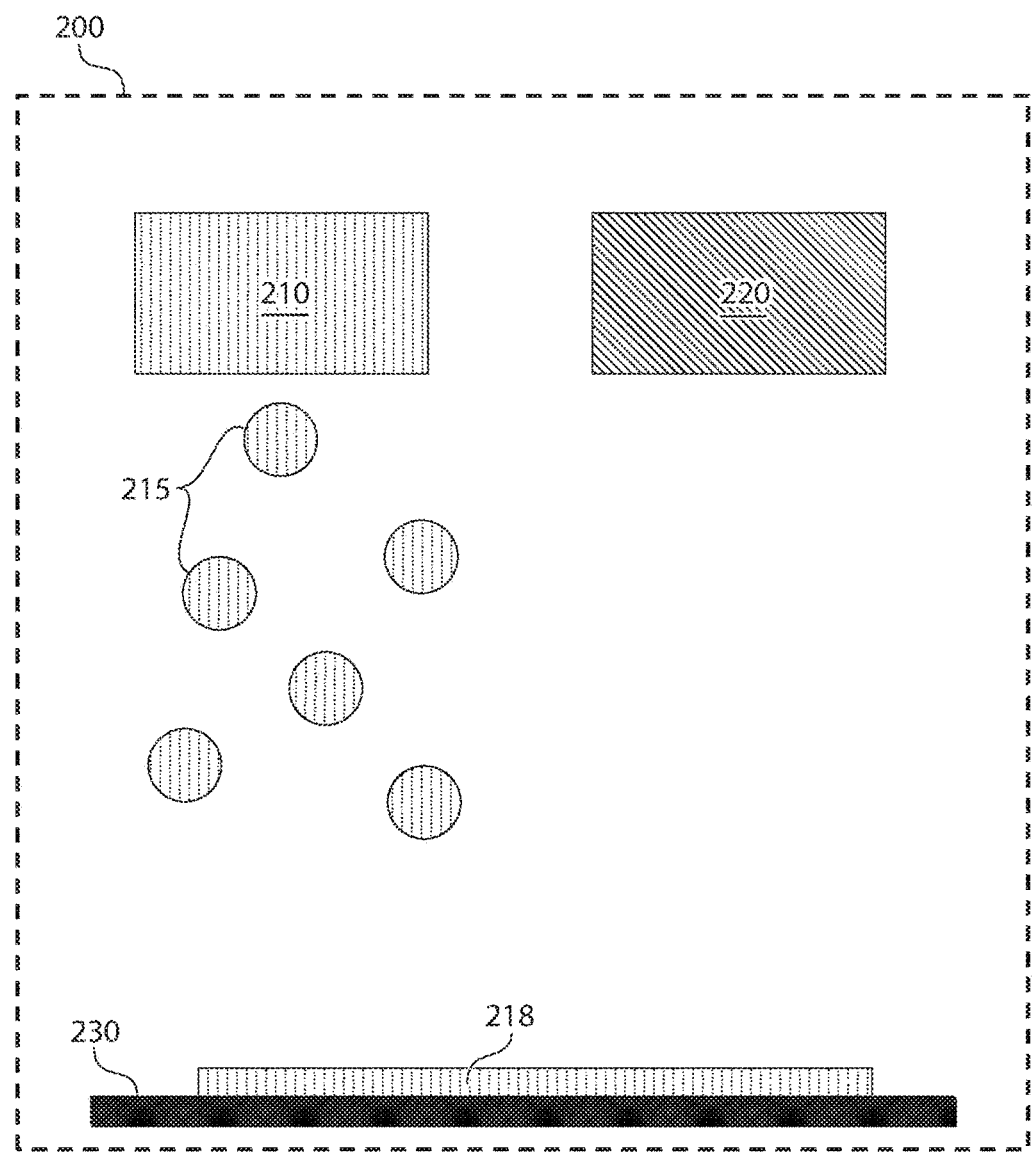
FIG. 2A shows a schematic illustration of the formation of a vapor from a target under vacuum conditions, according to certain embodiments.

In some embodiments, a method for forming a thin film comprises inducing formation of a first vapor from a first target. The formation of the first vapor can be caused by any number of suitable methods, as described below. For example, referring to FIG. 2A, in some embodiments, the method involves inducing formation of first vapor 215 from first target 210. In some embodiments, at least a portion of the formation of the first vapor occurs under vacuum conditions. Referring again to FIG. 2A, the step of inducing the formation of first vapor 215 from first target 210 occurs at least partially, in accordance with certain embodiments, under vacuum conditions. Vacuum conditions may be imposed, in some embodiments, by having the first target be located in a vacuum environment, such as a vacuum chamber. In FIG. 2A, first target 210 is located in a vacuum environment defined by dashed box 200. In accordance with certain embodiments, dashed box 200 corresponds to a vacuum chamber.

In some embodiments, the first target comprises a lithium-containing material. Referring to FIG. 2A, for example, first target 210 comprises a lithium-containing material. In some embodiments, the lithium-containing material of the first target comprises a lithium metal oxide (i.e., an oxide comprising lithium and at least one other metal). In some cases, the lithium-containing material comprises one or more transition metals. In some cases, the lithium-containing material is a lithium metal oxide comprising one or more transition metals. In some cases, the first target comprises lithium-containing material comprising cobalt, nickel, iron, boron, manganese, vanadium, or a combination thereof, at lattice sites. In some cases, the lithium-containing material comprises a lithium-containing oxide comprising cobalt, nickel, iron, boron, manganese, vanadium, or a combination thereof, at lattice sites. For example, in some embodiments, the lithium-containing material comprises lithium, cobalt, and oxygen. One, non-limiting example is the case in which the lithium-containing oxide comprises $LiCoO_2$, wherein optionally one or more dopants replaces Li, Co, and/or O at one or more lattice sites. In some embodiments, the first target comprises a lithium-containing material comprising lithium, nickel, and oxygen. In some cases, the lithium-containing oxide comprises $LiNiO_2$, wherein optionally one or more dopants replaces Li, Ni, and/or O at one or more lattice sites. In some embodiments, the lithium-containing material (e.g., a lithium-containing oxide) comprises lithium, iron, and oxygen. One such example would be the case where the lithium-containing oxide comprises $LiFeO_2$, wherein optionally one or more dopants replaces Li, Fe, and/or O at one or more lattice sites. As yet another example, in some embodiments, the first target comprises a lithium-containing material comprising lithium, boron, and oxygen, wherein optionally one or more dopants replaces Li, B, and/or O at one or more lattice sites. In some embodiments, the lithium-containing material comprises lithium, manganese, and oxygen. As a non-limiting example, in some embodiments, the lithium-containing oxide comprises $LiMn_2O_4$, wherein optionally one or more dopants replaces Li, Mn, and/or O at one or more lattice sites. Additionally, in some cases, the lithium-containing material comprises lithium, vanadium, and oxygen. For example, in some cases, the lithium-containing oxide comprises $LiVO_3$ or $LiV_2O_5$, wherein optionally one or more dopants replaces Li, V, and/or O at one or more lattice sites. As mentioned above, in some cases, the lithium-containing material (e.g., a lithium-containing oxide) comprises a combination of multiple metals (e.g., transition metals). One such example is the case where the lithium-containing oxide comprises lithium, nickel, manganese, cobalt, and oxygen. One such non-limiting example is the case where the lithium-containing oxide comprises $LiNiMnCoO_2$, wherein optionally one or more dopants replaces Li, Ni, Mn, Co, and/or O.

Another exemplary case is one in which the first target comprises a lithium-containing material (e.g., a lithium-containing oxide) comprising titanium. For example, in some embodiments, the lithium-containing material comprises lithium, titanium, and oxygen. One such example would be the case where the lithium-containing material comprises $Li_4Ti_5O_{12}$, wherein optionally one or more dopants replaces Li, Ti, and/or O at one or more lattice sites.

In some cases, the first target comprises a lithium-containing material comprising aluminum. For example, in some embodiments, the lithium-containing material comprises lithium β-alumina, wherein optionally one or more dopants replaces Li, Al, and/or O at one or more lattice sites. In other cases, the lithium-containing material comprises aluminum in combination with other elements at lattice sites. For example, in some embodiments, the lithium-containing material comprises aluminum and silicon at lattice sites. One such embodiment is the case in which the lithium-containing material comprises lithium, aluminum, silicon, and oxygen. For example, in some embodiments, the lithium-containing material comprises $Li_9AlSiO_8$, wherein optionally one or more dopants replaces Li, Al, Si, and/or O at one or more lattice sites.

In some embodiments, the first target comprises a lithium-containing material comprising a garnet (i.e., an oxide having the general garnet lattice structure). One non-limiting example of a case where the lithium-containing material comprises a garnet is when the lithium-containing material comprises lithium, lanthanum, zirconium, and oxygen. For example, referring back to FIG. 2A, first target 210 comprises lithium, lanthanum, zirconium, and oxygen, according to certain embodiments. In some embodiments, the first target comprises a lithium-containing material comprising a perovskite (i.e., an material satisfying the general perovskite lattice structure, e.g., an $ABO_3$ structure). One non-limiting example is the case in which the lithium-containing material comprises a lithium lanthanum titanate, wherein optionally one or more dopants replaces Li, La, Ti, and/or O at one or more lattice sites. In some cases, the first target comprises a LISICON.

The first target can comprise a variety of different lithium-containing materials besides oxides. For example, in some embodiments, the first target comprises a lithium-containing sulfide. Certain lithium-containing sulfides display beneficial properties for use as solid-state electrolytes. In some cases, first target comprises a lithium-containing material comprising germanium, phosphorus, and sulfur at lattice sites. As a particular example, in some embodiments, the lithium-containing material comprises $Li_{10}GeP_2S_{12}$, wherein optionally one or more dopants replaces Li, Ge, P, and/or S at one or more lattice sites. Other classes of lithium-containing materials include, but are not limited to, borates, phosphates, and/or oxynitrides. In some cases, the lithium-containing material comprises phosphorus, oxygen, and nitrogen at lattice sites. One such exemplary class of lithium-containing material comprises lithium phosphorus oxynitrides (LIPONs). In some embodiments, the lithium-containing material comprises closo-borates. In some embodiments, the lithium-containing material comprises lithium, one or more transition metals, and phosphates. For example, in some embodiments, the lithium-containing material comprises a lithium iron phosphate (e.g., $LiFePO_4$, wherein optionally one or more dopants replaces Li, Fe, P, and/or O at one or more lattice sites). Lithium vanadium phosphates are also possible lithium-containing materials as used herein. In some cases, the first target comprises a lithium-containing amorphous silicon material. In some other cases, first target comprises a lithium-containing amorphous antimony material In accordance with certain embodiments, inducing the first vapor from the first target results in the first vapor comprising a lithium-containing material (e.g., a lithium-containing oxide, sulfide, phosphate, oxynitride, etc.). For example, first vapor 215, in accordance with certain embodiments, comprises a lithium-containing material. In some cases, inducing the first vapor from the first target results in the first vapor comprising lithium, lanthanum, zirconium, and oxygen. For example, first vapor 215, in accordance with certain embodiments, comprises lithium, lanthanum, zirconium, and oxygen.

Having the first target comprise certain elements (i.e., elements of the lithium-containing material) may ultimately contribute to the formation of a thin film that also comprises these certain elements. In general, the thin film comprises the lithium-containing material of the first target, although the lithium-containing material of the first target and the lithium-containing material of the thin film may, in some cases, differ to some extent in terms of stoichiometry (e.g., lithium content), dopant content, and/or the presence of nitrogen. For example, in some cases the thin film comprises the lithium-containing material of the first target, but the thin film also comprises nitrogen (e.g., from the second target, as described below). In some cases, producing a thin film that comprises certain elements results in the thin film having favorable properties. In some cases, the first target comprises $Li_aLa_bZr_cO_dX_e$, wherein the stoichiometric coefficients a, b, c, d, and e are in the ranges described above. In some embodiments, the first target can be made from a powder that can be synthesized as described in the Examples below. As a non-limiting example of a case in which the thin film comprises the lithium-containing material of the first target, but with a different stoichiometry, the first target may comprise $Li_4Ti_5O_{12}$, while the thin film formed from the first target may comprise $Li_7Ti_5O_{12}$. Such a higher degree of lithiation found in the thin film, as compared to the first target, can be accomplished in embodiments by using the methods described herein, such as using a second target comprising lithium and nitrogen (e.g., in the form of a lithium nitride).

In some embodiments, a relatively high weight and/or atomic percentage of the first target is made up of the lithium-containing material (e.g., any of the lithium-containing materials described above with respect to the first target, such as a lithium-containing oxide, sulfide, phosphate, and/or oxynitride). Having a relatively high weight and/or atomic percentage of the first target being made up of the lithium-containing material may result in the first vapor, and consequently a resulting thin film, having a high percentage of the lithium-containing material. In some embodiments, at least 70 wt % of the first target is made up of the lithium-containing material. In some embodiments, at least 75 wt %, at least 80 wt %, at least 85 wt %, at least 90 wt %, at least 95 wt %, at least 98 wt %, at least 99 wt %, or at least 99.9 wt % of the first target is made up of the lithium-containing material. In some embodiments, a relatively high atomic percentage of the first target is made up of the lithium-containing material. For example, in some embodiments, in terms of atomic percentage, at least 70% of the first target is made up of the lithium-containing material. In some embodiments, in terms of atomic percentage, at least 75%, at least 80%, at least 85%, at least 90%, at least 95%, at least 98%, at least 99%, or at least 99.9% of the first target is made up of a the lithium-containing material.

In some embodiments, other ranges described herein for weight percentages and/or atomic percentages of elements, materials, and/or dopants of the thin film are also applicable to the first target. For example, in some embodiments, at least 70 wt %, at least 75 wt %, at least 80 wt %, at least 85 wt %, at least 90 wt %, at least 95 wt %, at least 98 wt %, at least 99 wt %, or at least 99.9 wt % of the first target is made up of a combination of the elements of the chemical formula of the host material of the lithium-containing material. In some embodiments, in terms of atomic percentage, at least 70%, at least 75%, at least 80%, at least 85%, at least 90%, at least 95%, at least 98%, at least 99%, or at least 99.9% of the first target is made up of a combination of the elements of the chemical formula of the host material of the lithium-containing material. As another example, in some embodiments, the part of the first target that is made of the lithium-containing material has a weight percentage of elements that are not a part of the chemical formula of the host material of the lithium-containing material of less than or equal to 20 wt %, less than or equal to 10 wt %, less than or equal to 5 wt %, less than or equal to 2 wt %, less than or equal to 1 wt %, less than or equal to 0.1%, or less.

In some embodiments, the first target comprises one or more dopants. Including dopants in the first target may allow for the inclusion of such dopants in the first vapor, and consequently, in some embodiments, in any thin film that may be formed from the first vapor. In some cases, the first target comprises a lithium-containing material and one or more dopants. As described above, in some cases, the first target comprises $Li_aLa_bZr_cO_dX_e$. In such a case, X is considered to be at least one of the one or more first target dopants. In other cases, the first target comprises a different lithium-containing material as well as one or more dopants, such as a lithium cobalt oxide (e.g., a cobalt oxide having a host formula of $LiCoO_2$, but also including one or more dopants either at lattice sites or at interstitial sites). In some embodiments, the first target comprises one or more dopants, and at least one of the one or more dopants is an interstitial dopant.

Figure 2B:
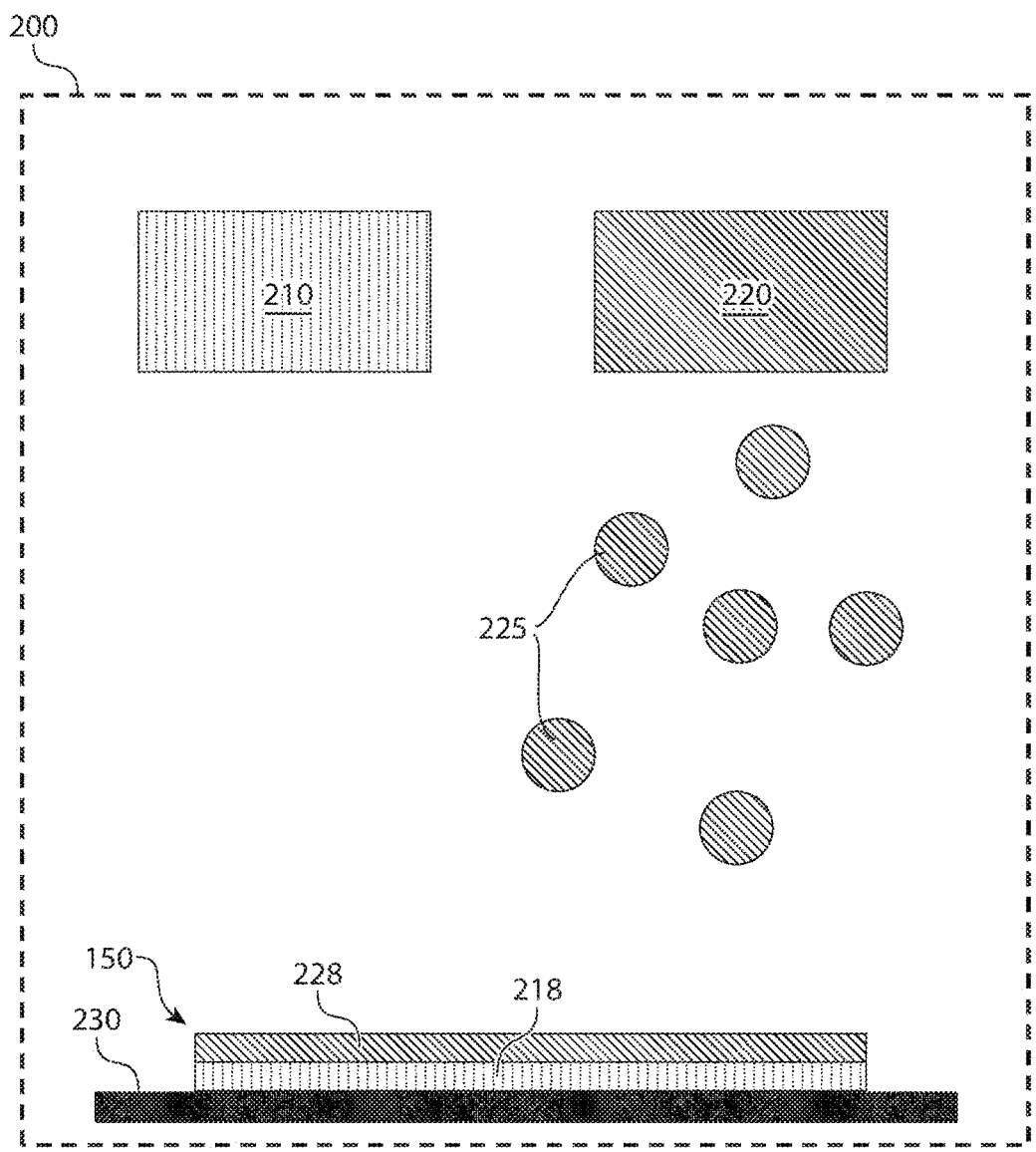
FIG. 2B shows a shows a schematic illustration of the formation of a vapor from a target under vacuum conditions, according to certain embodiments.

In some embodiments, the method for forming a thin film also comprises inducing the formation of a second vapor from a second target. As with the first vapor, the formation of the second vapor can be caused by a number of suitable methods as described below. In some embodiments, the action or phenomenon that induces the formation of the second vapor from the second target is the same action or phenomenon that induces the formation of the first vapor from the second target. However, in some embodiments the action or phenomenon that induces the formation of the second vapor from the second target is a different action or phenomenon than that which induces the formation of the first vapor from the first target. Referring to FIG. 2B, in some embodiments, the method involves inducing formation of second vapor 225 from second target 220. As with the case of the first vapor, in some embodiments, at least a portion of the formation of the second vapor occurs under vacuum conditions. In some embodiments, at least a portion of the formation of the first vapor and at least a portion of the formation of the second vapor occur under vacuum conditions (e.g., a vacuum chamber)

In some embodiments, the second target comprises lithium and nitrogen. For example, referring to FIG. 2B again, in some embodiments, second target 220 comprises lithium and nitrogen. Accordingly, in some embodiments, the second vapor comprises lithium and nitrogen. Having the second target comprise lithium and nitrogen may ultimately contribute to the thin film formed by these methods having favorable and/or distinct properties. For example, in some embodiments, having the second target comprise a lithium and nitrogen may result in the formation of a thin film having a relatively high total ionic conductivity and/or mixed ionic/electronic conductivity. In some embodiments, having the second target comprise lithium and nitrogen may result in the formation of a thin film comprising nitrogen.

In some embodiments, the second target comprises one or more dopants. Including dopants in the second target may allow for the inclusion of such dopants in the second vapor, and consequently, in some embodiments, in any thin film that may be formed from the second vapor. As described above, in some cases, the second target comprises lithium and nitrogen. In some such cases, one or more dopants may also be present in the second target as "second target dopants," replacing an atom at a lattice site or positioned interstitially.

In some embodiments, the second target comprises a lithium nitride. As used herein, a lithium nitride can be represented by the formula $Li_fN_gY_h$, wherein Y is at least one of the one or more second target dopants and h can be 0. For example, referring back to FIG. 2B, second target 220 comprises, in accordance with certain embodiments, $Li_fN_gY_h$, wherein Y is at least one of the one or more dopants and k can be 0. As used herein, the elements and stoichiometries in the formula $Li_fN_gY_h$ correspond to atoms at lattice sites of the lithium nitride lattice. In addition to the one or more dopants being at lattice cites (e.g., as Y), dopants may also be present in the lithium nitride as interstitial dopants.

For a material with the formula $Li_fN_gY_h$, the values of the stoichiometric coefficients (e.g., f, g, h,) may fall within certain ranges. Having these stoichiometric coefficients within certain ranges, can, in some embodiments, lead to the second target forming a second vapor having a relatively high lithium content.

In some embodiments, f is in the range of from 1.5 to 3.5. In some embodiments, f is at least 1.5, at least 1.75, at least 2.0, at least 2.25 at least 2.5, at least 2.6, at least 2.7, or at least at least 2.8. In some embodiments, f is less than or equal to 3.5, less than or equal to 3.4, less than or equal to 3.3, or less than or equal to 3.2. Combinations of these ranges are possible. For example, in some embodiments, f is at least 2.8 and less than or equal to 3.2. In some embodiments, f is 3. Other combinations are possible.

In some embodiments, g is in the range of from 0.5 to 1.5. In some embodiments, g is at least 0.5, at least 0.6, at least 0.7, or at least at least 0.8. In some embodiments, g is less than or equal to 1.5, less than or equal to 1.4, less than or equal to 1.3, or less than or equal to 1.2. Combinations of these ranges are possible. For example, in some embodiments, g is at least 0.8 and less than or equal to 1.2. In some embodiments, g is 1. Other combinations are possible.

The stoichiometric coefficient h, as used herein, refers to the total combined stoichiometry of the one or more dopants (represented as Y in the $Li_fN_gY_h$ formula) that are at lattice sites of the $Li_fN_gY_h$ lattice (i.e., are substitutional dopants). For example, in some embodiments, aluminum is the only dopant and has a stoichiometry of 0.25. In such an embodiment, Y is Al and k is 0.25. For example, in some embodiments, the thin film comprises the lithium nitride $Li_{2.25}NAl_{0.25}$. Referring back to FIG. 2B, in accordance with certain embodiments, second target 220 comprises $Li_{2.25}NAl_{0.25}$.

In some embodiments, h is in the range of from 0.0 to 0.5 In some embodiments, h is at least 0.01, at least 0.02, at least 0.05, at least 0.08, at least 0.1, at least 0.15, at least 0.2, at least 0.25, at least 0.3, or at least 0.4. In some embodiments, h is less than or equal to 0.5, less than or equal to 0.45, less than or equal to 0.4, less than or equal to 0.3, less than or equal to 0.25, or less than or equal to 0.2. Combinations of the above ranges are possible. For example, in some embodiments, h is at least 0.1 and less than or equal to 0.4. Other combinations are possible.

As mentioned above, h can be 0, in accordance with certain embodiments, meaning that the presence of Y is optional. In other words, in some embodiments, the thin film comprises a material of the formula $Li_fN_gY_h$, but the material does not comprise any dopants (i.e., any experimentally observable dopants) at lattice sites. In such a case, the second target may comprise the lithium nitride $Li_3N$. For example, in accordance with certain embodiments, second target 220 comprises $Li_3N$.

In some embodiments, the second vapor comprises a lithium nitride (e.g., $Li_fN_gY_h$, such as $Li_3N$). In some embodiments, the second vapor comprises a lithium nitride that becomes oxygenated, forming an (optionally doped) lithium oxynitride in the second vapor. Having the second target comprise a lithium nitride may ultimately contribute to the thin film formed by these methods having favorable and/or distinct properties. For example, in some embodiments, having the second target comprise a lithium nitride may result in the formation of a thin film having a relatively high total ionic conductivity, lithium ion conductivity, and/or mixed ionic/electronic conductivity. In some embodiments, having second target comprise a lithium nitride may result in the formation of a thin film comprising nitrogen.

In some embodiments, the formation of the first vapor and the formation of the second vapor are induced in such a way that the first vapor and the second vapor are deposited on a surface, resulting in the formation of a thin film. For example, referring to FIG. 2A, in accordance with certain embodiments, first vapor 215 is deposited on surface 230 to form first layer 218. Furthermore, in accordance with certain embodiments, second vapor 225 is also deposited on surface 230 to form second layer 228. It should be understood that second layer 228 can be deposited directly on to surface 230, or second layer 228 can be deposited directly on to first layer 218, as shown in FIG. 2B. Alternatively, it should be understood that first layer 218 can be deposited directly onto surface 230, as depicted in FIG. 2A, or first layer 218 can be deposited directly onto second layer 228. In some embodiments, individual and/or alternating layers formed by the deposition of the first vapor and the second vapor are combined and converted into a uniform and homogeneous thin film, as described below. In some embodiments, the first vapor and the second vapor are deposited on a surface in such a way that alternating layers are not formed, but rather a uniform and homogeneous thin film is formed, as is also described below.

In some embodiments, the thin film formed on the surface as a result of the deposition of the first vapor and the second vapor comprises a lithium-containing material. The lithium-containing material of the thin film formed on the surface may be any of the lithium-containing materials described above and herein (e.g., a lithium-containing oxide such as a lithium cobalt oxide, a lithium-containing perovskite, etc.) For example, in some embodiments, the thin film formed on the surface as a result of the deposition of the first vapor and the second vapor comprises lithium, lanthanum, zirconium, and oxygen. In accordance with certain embodiments, the thin film formed on the surface as a result of the deposition of the first vapor (e.g., first vapor 215) in the second vapor (e.g., second vapor 225) results in the formation of thin film 100, as described herein. In some embodiments, the thin film has a total ionic conductivity of at least $1.0 \times 10^6$ S·cm$^{-1}$ or at least $1.0 \times 10^5$ S·cm$^{-1}$ at 23° C. (and/or a lithium ion conductivity of at least $1.0 \times 10^{-6}$ S·cm$^{-1}$ at 23° C.). In certain embodiments, the thin film has the properties, composition, and characteristics of the thin films described herein. For example, in some embodiments, the thin film further comprises nitrogen. In some embodiments, the thin film comprises one or more dopants (e.g., due to the presence of the one or more dopant in either the first target and/or the second target, as described above). In some embodiments, the thin film comprises a cubic phase of $Li_aLa_bZr_cO_dX_e$, wherein X is the one or more dopants and e can be 0, wherein optionally nitrogen replaces Li, La, Zr, O, and/or X at one or more of the lattice sites of the cubic lattice such that nitrogen is present in the $Li_aLa_bZr_cO_dX_e$ in an amount up to 1.0 at %, as described herein.

As described above, in some cases the methods described herein occur under vacuum conditions. For example, in some embodiments, at least a portion of the formation of the first vapor and at least a portion of the formation of the second vapor occur under vacuum conditions. Vacuum conditions generally refer to conditions in which there is a reduced pressure relative to an external environment (e.g., in the case of a vacuum chamber, the environment external to the vacuum chamber). For example, a process occurring under vacuum conditions may occur under a pressure well below that of normal atmospheric pressure. A perfect vacuum is not required for vacuum conditions. In other words, conditions corresponding to a partial vacuum, can, in some cases, correspond to vacuum conditions. Suitable pressure ranges for the vacuum conditions of the method described herein are described below. Vacuum conditions can be introduced, for example, by the use of a vacuum chamber. In some embodiments, the formation of at least a portion of the first vapor and the formation of at least a portion of the second vapor are induced in a vacuum chamber. For example, referring to FIG. 2A, first target 210, second target 220, and surface 230, are, in accordance with certain embodiments, located in vacuum chamber 200 during the formation of at least a portion of first vapor 210 and second vapor 220. Vacuum conditions can be useful for certain deposition techniques, such as physical vapor deposition (PVD).

In some embodiments, the formation of the first vapor and the formation of the second vapor is induced sequentially. In other words, in some embodiments, the inducing of the formation of the first vapor occurs during a first period of time, and the inducing of the formation of the second vapor occurs during a second period of time. In some embodiments, there is no overlap between the first period of time in the second period of time. Referring to FIG. 2A, in accordance with certain embodiments, the methods described herein comprise inducing first vapor 215 from first target 210 during a first period of time, during which no vapor from second target 220 is formed. In some embodiments, the formation of first vapor 215 from first target 210 during the first period of time results in the deposition of first layer 218 on surface 230. Subsequently, in accordance with certain embodiments and referring to FIG. 2B, the formation of vapor from first target 210 ceases, and the method comprises inducing the formation of second vapor 225 from second target 220 during a second period of time. In some embodiments, the formation of second vapor 225 from second target 220 during the second period of time results in the deposition of second layer 228 on surface 230 (e.g., direct deposition on first layer 218). Such a sequential process may, in accordance with certain embodiments, results in the formation of a multilayer film on the surface. In some embodiments, the multilayer film comprises alternating layers of material. Referring to FIG. 2B, in accordance with certain embodiments, multilayer film 150 comprising first layer 218 and second layer 228 is deposited on surface 230 as a result of the sequential formation of first vapor 215 from first target 210 and second vapor 225 from second target 220 under vacuum conditions. In some embodiments, the formation of a first vapor comprising elements from a lithium-containing material (e.g., from the first target) is induced during the first period of time, and, subsequently, the formation of the second vapor comprising lithium and nitrogen (e.g., in the form of a lithium nitride, from the second target) is induced during the second period of time. For example, in some embodiments, the formation of a first vapor comprising lithium, lanthanum, zirconium, and oxygen (e.g., from the first target) is induced during the first period of time, and, subsequently, the formation of the second vapor comprising lithium and nitrogen (e.g., in the form of a lithium nitride, from the second target) is induced during the second period of time. In some embodiments a multilayer film comprising alternating layers of material, such as a first layer, and a second layer is deposited on the surface as a result. In some embodiments the first layer comprises a lithium-containing material (e.g., a lithium-containing oxide, sulfide, phosphate, oxynitride, etc.) and the second layer comprises lithium and nitrogen (e.g., in the form of a lithium nitride, $Li_fN_gY_h$). As a non-limiting example, in some embodiments the first layer comprises lithium, lanthanum, zirconium, and oxygen, and the second layer comprises lithium and nitrogen (e.g., in the form of a lithium nitride, $Li_fN_gY_h$). In some cases, the second layer comprises a lithium oxynitride (and optionally one or more dopants).

In some embodiments, the order in which the first vapor and the second vapor are induced is the reverse of that described in the previous paragraph. In other words, in some embodiments, the formation of the first vapor and the formation of the second vapor is induced sequentially, with the formation of the second vapor occurring before the formation of the first vapor. Referring to FIG. 2B, in accordance to certain embodiments, the formation of second vapor 225 is induced from second target 220, and then subsequently, the formation of first vapor 215 is induced from first target 210, resulting in the deposition of multilayer film 150, wherein second layer 228 is deposited directly on surface 230 and first layer 218 is deposited directly on second layer 228 (this configuration is not pictured).

Figure 5:
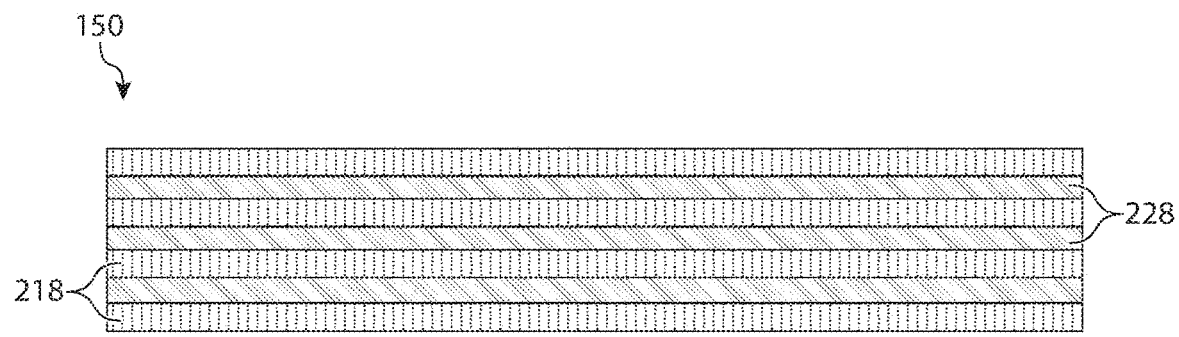
FIG. 5 shows a cross-sectional schematic of an exemplary multilayer film, according to certain embodiments.

The sequential inducing of the formation of the first vapor from the first target in the second vapor from the second target can, in accordance with certain embodiments, be repeated multiple times. For example, in some embodiments, the formation of the first vapor is induced during a first period of time, the formation of a second vapor is induced during a second period of time, and subsequently, the formation of the first vapor is induced again during a third period of time (and, optionally, the formation of the second vapor is induced again during a fourth period of time). This repetition of alternating sequential inductions of vapors from the first target in the second target may result in the deposition of a multilayer film on the surface having multiple alternating layers of material (e.g., alternating layers of material originating from the first vapor and the second vapor, respectively). FIG. 5 depicts a schematic cross-section of exemplary multilayer film 150 formed, in accordance with certain embodiments, under these repeating sequential vapor inductions. Multilayer film 150, in accordance with certain embodiments, comprises multiple alternating domains or layers of first layer 218 and second layer 228. In some embodiments, the multilayer film comprises alternating layers of a first layer comprising a lithium-containing material (e.g., a lithium-containing oxide such as a lithium cobalt oxide or a lithium titanate) and a second layer comprising a lithium and nitrogen (e.g., in the form of a lithium nitride). For example, in some embodiments, the multilayer film comprises alternating layers of a first layer comprising lithium, lanthanum, zirconium, and oxygen, and a second layer comprising a lithium nitride. In some embodiments, there is at least one first layer and one second layer in the multilayer film. In some embodiments, there is at least two (or three, or four, or five, or more) first layers and at least two (or three, or four, or five, or more) second layers in the multilayer film. The formation of such a multilayer film can be helpful in providing an intermediate heterostructured material that can in turn be converted (e.g., via heating as described below) into a thin film having beneficial properties (such as a high lithium content, a high lithium-ion conductivity, and/or a high mixed ionic/electronic conductivity). In some embodiments, the first layer of the multilayer film comprises a material with a lithium deficit, while the second layer comprises a material with a high lithium content (e.g., $Li_3N$). In some embodiments, conversion of the multilayer film into a thin film involves merging of the first layers (which may have a lower lithium concentration than the second layers) and the second layers (which may have a higher lithium concentration than the first layers) such that a thin film having a relatively high lithium content uniformly distributed throughout is formed.

In some embodiments, the first target and the second target are both located in the vacuum chamber during the formation of at least a portion of the first vapor and the formation of at least a portion of the second vapor. For example, FIG. 2A illustrates an embodiment in which both first target 210 and second target 220 are present in vacuum chamber 200 during the formation of at least a portion of first vapor 215 and at least a portion of second vapor 225 (not pictured). Having both the first target and the second target both present in the chamber at the same time may allow for convenient toggling between inducing the formation of vapor from one target and inducing the formation of vapor from the other target (e.g., toggling between targets without requiring the vacuum chamber to be opened or the vacuum conditions to be interrupted). Having both targets in the vacuum chamber can be useful both for embodiments in which the first vapor and the second vapor are induced sequentially, or in cases in which the first vapor and second vapor are induced simultaneously, as described below.

In embodiments in which the first target and a second target are both located in the vacuum chamber during the formation of at least a portion of the first vapor and the formation of at least a portion of the second vapor, the first target and the second target may be positioned relatively similarly with respect to the surface in the vacuum chamber (e.g., are equidistant to the surface). In some such embodiments, the position of the first target and the position of the second target remain substantially unchanged during the formation of the thin film (e.g., via sequential formation of the first vapor in the second vapor). However, in some embodiments, the first target and the second target are not positioned relatively similarly with respect to the surface and the vacuum chamber. In some such embodiments the positions of the first target and the second target are not fixed during the formation of the thin film. For example, in some embodiments, the first target and the second target are positioned in a movable target holder (e.g., a turret) that can position one of the targets such that vapor from that target can be induced while positioning the other target such that vapor from that target cannot be induced (e.g., positioned away from the source of the vapor induction). Such a configuration with the first target and a second target on a movable target holder can be useful for automatic toggling between targets during sequential inducing the formation of the first vapor in the formation of the second vapor without requiring realignment of a vapor induction source (e.g., an e-beam or a laser).

Figure 3A:
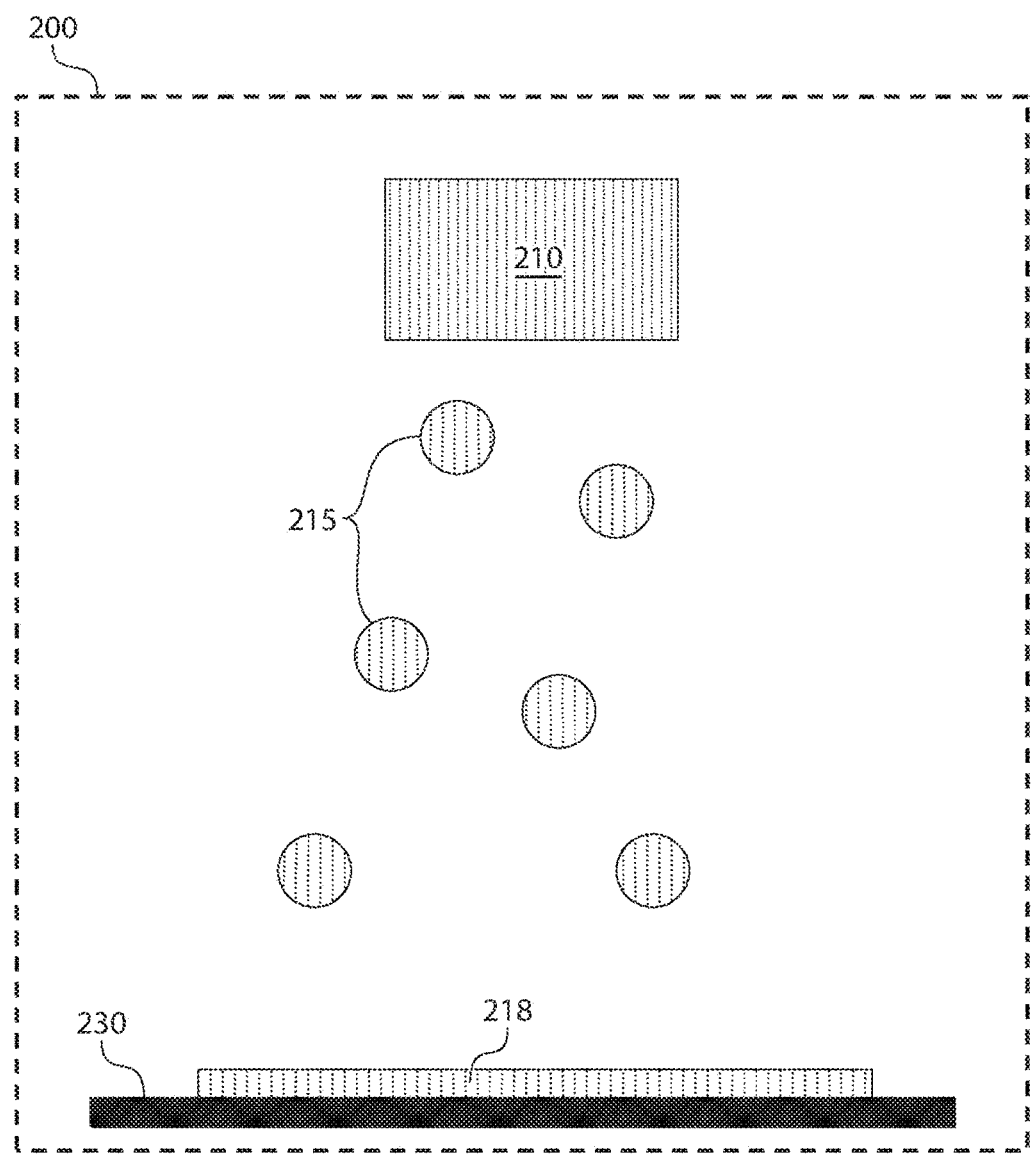
FIG. 3A shows a schematic illustration of the formation of a vapor from a target under vacuum conditions, according to certain embodiments.
Figure 3B:
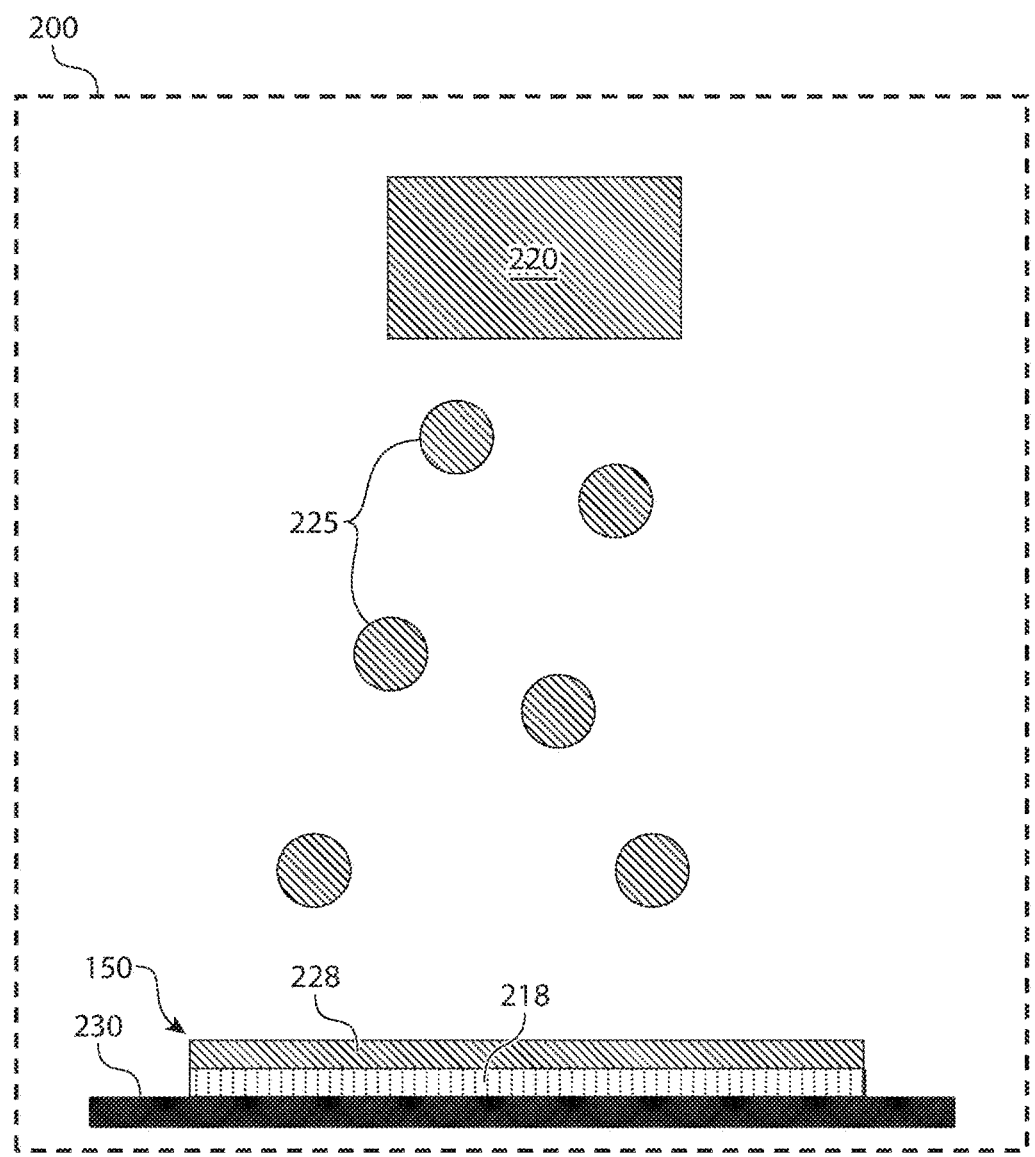
FIG. 3B shows a schematic illustration of the formation of a vapor from a target under vacuum conditions, according to certain embodiments.

In some embodiments, the second target is not located in the vacuum chamber during the formation of at least a portion of the first vapor. For example, FIG. 3A shows, in accordance with certain embodiments, the formation of first vapor 215 from first target 210 in vacuum chamber 200, wherein second target 220 is not present during the formation of first vapor 215. In some embodiments, the vacuum chamber contains only the first target during the formation of at least a portion of the first vapor, and then, at different point in time, the second target is introduced to the vacuum chamber, at which point formation of the second vapor can occur. The opposite can be true. In some embodiments, the first target is not located in the vacuum chamber during the formation of at least a portion of the second vapor. For example, FIG. 3B shows, in accordance with certain embodiments, the formation of second vapor 225 from second target 220 in vacuum chamber 200, wherein first target 210 is not present during the formation of second vapor 215. In some embodiments, the vacuum chamber contains only the second target during the formation of at least a portion of the second vapor, and then, at a different point in time, the first target is introduced to the vacuum chamber, at which point formation of the first vapor can occur.

In some embodiments, only one target is present at a time. For example, in some embodiments, the first vapor is formed from the first target while the second target is not present in the vacuum chamber, and upon introduction of the second target to the vacuum chamber, the first target is removed. The opposite case, in which the second vapor is formed from the second target while the first target is not present in the vacuum chamber, and upon introduction of the first target to the vacuum chamber, the second target is removed, can also occur.

In some embodiments, the first target is located in a first vacuum chamber and the second target is located in a second vacuum chamber. For example, in accordance with certain embodiments, first target 210 is located in vacuum chamber 200, while second target 220 is located in a second vacuum chamber (not pictured). The thin film described herein may be formed in such an embodiment by, for example, inducing the formation of a first vapor from the first target in the first vacuum chamber, resulting in the deposition of a first layer on the surface, and then removing the surface comprising the first layer from the first vacuum chamber and transporting it to the second vacuum chamber comprising a second target. Then, in some embodiments, the method may comprise inducing the formation of a second vapor from the second target in the second vacuum chamber, resulting in the formation of a multilayer film or the thin film described herein.

Figure 4:
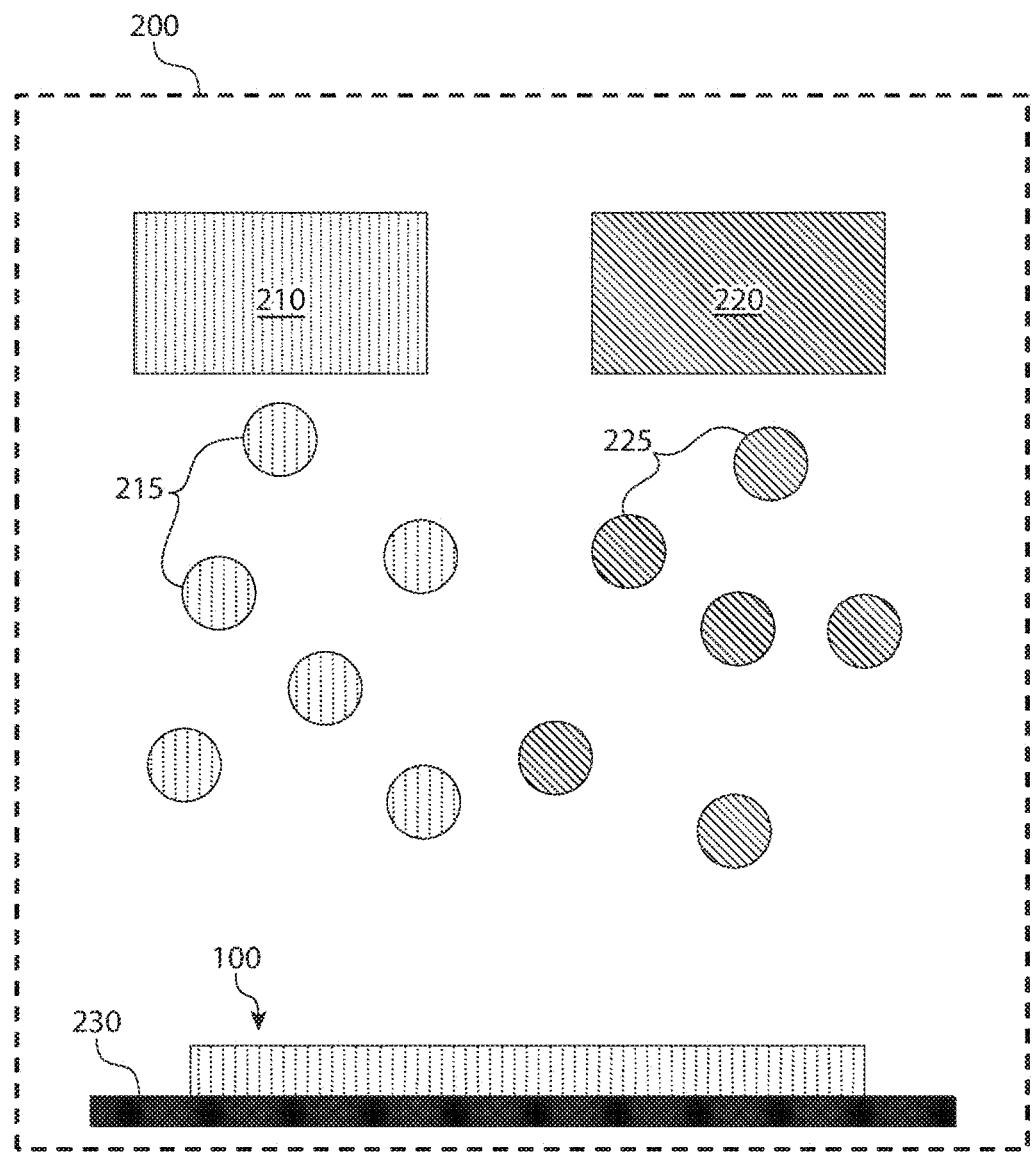
FIG. 4 shows a schematic illustration of the simultaneous formation of a first vapor and a second vapor, according to certain embodiments.

In some embodiments, the formation of the first vapor and the formation of the second vapor is induced simultaneously. For example, FIG. 4 depicts, in accordance with certain embodiments, the simultaneous induction of the formation of first vapor 215 and the formation of second vapor 225 from first target 210 and second target 220, respectively. In some such embodiments, the simultaneous presence of the first vapor and the second vapor under vacuum conditions results in the deposition of a thin film on the surface. For example, referring again to FIG. 4, in some embodiments, the formation of first vapor 215 and the formation of second vapor 225 occur simultaneously, resulting in the formation of thin film 100 on surface 230. In some embodiments, the thin film formed under simultaneous induction of the first vapor and the second vapor is substantially uniform (e.g., in composition, morphology, phase, etc., see below), even without deposition occurring at elevated temperatures or a post-annealing step occurring. In some embodiments, the thin film formed on the surface comprises elements contributed from the first vapor and/or the second vapor (e.g., via the deposition of elements from the first vapor and/or the second vapor to form the thin film). In some embodiments, the thin film formed under simultaneous induction of the first vapor (e.g., comprising a lithium-containing material such as one comprising lithium, lanthanum, zirconium, and oxygen, or comprising cobalt, or titanium, or aluminum, etc.) and the second vapor (e.g., comprising lithium and nitrogen (e.g., in the form of a lithium nitride)) comprises the lithium-containing material such as one comprising lithium, lanthanum, zirconium, and oxygen, or comprising cobalt, or titanium, or aluminum, etc. In some embodiments, the thin film further comprises nitrogen. In some embodiments, the thin film has a relatively high total ionic conductivity, lithium ion conductivity, and/or mixed ionic/electronic conductivity (e.g., greater than or equal to $1.0 \times 10^{-5}$ S·cm$^{-1}$ at 23° C.).

In some embodiments, the surface and/or the thin film are held at a certain temperature for at least a portion of the time during the formation of the thin film. For example, in FIG. 4, according to certain embodiments, during the formation of thin film 100, surface 230 and/or thin film 100 are held at a certain temperature. The temperature at which the surface and/or the thin film are held during the thin film formation process may be determined by a variety of factors such as the type of material being deposited, the desired morphology of the film, and/or the composition of the film.

In some embodiments, holding the surface and/or the thin film at or above a certain minimum temperature contributes, at least in part, to the formation and stabilization of a certain crystallographic phase of a material (e.g., the cubic phase of $Li_aLa_bZr_cO_dX_e$) in the thin film. As another example, in some embodiments, holding the surface and/or the thin film at or above a certain minimum temperature may contribute, at least in part, to the merging of the alternating layers of a multilayer film into a uniform homogeneous film. Without wishing to be bound by theory, in some embodiments, holding a multilayer film comprising alternating layers of a lithium-containing material (e.g., a lithium-containing oxide, such as a lithium cobalt oxide) and a lithium nitride at or above a certain minimum temperature causes the lithium ions from the lithium nitride layer (which has a relatively high lithium concentration) to partially diffuse into a lithium-poor lithium-containing material layer and causes the evaporation of a portion of the nitrogen, resulting in a uniform thin film comprising the lithium-containing material with a relatively high lithium content. As an example, and without wishing to be bound by theory, in some embodiments, holding a multilayer film comprising alternating layers of $Li_aLa_bZr_cO_dX_e$ and a lithium nitride at or above a certain minimum temperature causes the lithium ions from the lithium nitride layer (which has a relatively high lithium concentration) to partially diffuse into a lithium-poor $Li_aLa_bZr_cO_dX_e$ layer and causes the evaporation of a portion of the nitrogen, resulting in a uniform thin film comprising the cubic phase of $Li_aLa_bZr_cO_dX_e$ with a relatively high lithium content. In some embodiments, this merging of the layers of a multilayer film occurs during the step of inducing the formation of the first vapor and/or the second vapor.

In some embodiments, holding the surface and/or the thin film at or below a certain maximum temperature for at least a portion of the time during the formation of the thin film is beneficial. For example, for some thin films, the composition and/or morphology of the thin film may change if the thin film reaches or exceeds a certain temperature. In some embodiments, holding the surface and/or the thin film at or below the certain maximum temperature helps, at least in part, to avoid such a change in composition and/or morphology of the thin film. As a specific sample, in accordance with certain embodiments, the thin film comprises the cubic phase of $Li_aLa_bZr_cO_dX_e$, as described elsewhere herein. In some cases, if the thin film comprising the cubic phase of $Li_aLa_bZr_cO_dX_e$ is held at too high a temperature, the thin film delithiates into a lithium-free pyrochlore material.

In some embodiments, the surface and/or the thin film are held at a temperature of between 580° C. and 800° C. for at least a portion of the time during the formation of the thin film. In some embodiments, the surface and/or the thin film are held at a temperature of at least 200° C., of at least 300° C., of at least 400° C., of at least 500° C., at least 520° C., at least 535° C., at least 550° C., at least 580° C., at least 585° C., at least 590° C., at least 600° C., at least 615° C., at least 630° C., at least 660° C., at least 700° C., at least 710° C., at least 740° C., or higher. In some embodiments, the surface and/or the thin film are held at a temperature of less than or equal to 900° C., less than or equal to 850° C., less than or equal to 800° C., less than or equal to 790° C., less than or equal to 780° C., less than or equal to 760° C., less than or equal to 740° C., less than or equal to 720° C., less than or equal to 700° C., or less. Combinations of the above ranges are possible. For example, in some embodiments, the surface and/or the thin film are held at a temperature of at least 200° C. and less than or equal to 900° C., at least 400° C. and less than or equal to 800° C., at least to 400° C. and less than or equal to 900° C., at least 580° C. and less than or equal to 810° C., or at least 660° C. and less than or equal to 740° C. Other combinations are possible. In other embodiments, other temperatures outside these ranges may be used. In some embodiments, a thin film comprising the cubic phase of $Li_aLa_bZr_cO_dX_e$ as described herein is held at a temperature in the above ranges during at least a portion of the time during its formation. For example, in some embodiments, a thin film comprising the cubic phase of $Li_aLa_bZr_cO_dX_e$ is held at a temperature of between 580° C. and 800° C. for at least a portion of the time during the formation of the thin film.

In some embodiments, the surface and/or the thin film are held at a temperature in one of the abovementioned temperature ranges (e.g., a range of between 400° C. and 900° C. or between 580° C. and 800° C.) during at least a portion of the step of inducing of the formation of the first vapor and the formation of the second vapor. In other words, the temperature can be held in one of the above ranges during the deposition process. Referring again to FIG. 4, in accordance to certain embodiments, during the formation of first vapor 215 from first target 210 and/or the formation of second vapor 225 from second target 220, which results in the deposition of thin film 100 on surface 230, thin film 100 and/or surface 230 are held at a temperature at one of the abovementioned temperature ranges. The holding of the surface and/or the thin film at a temperature at one of the above ranges during at least a portion of the formation of the first vapor and the formation of the second vapor can be employed in methods comprising inducing the first vapor and the second vapor sequentially or in methods comprising inducing the first vapor and the second vapor simultaneously. It is also possible that the surface and/or the thin film is held at different temperatures during the formation of the first vapor from the first target and the second vapor from the second target.

In some embodiments, the surface and/or the thin film are held at a temperature of between 15° C. and 35° C. for at least a portion of time during the formation of the thin film. In some embodiments, the surface and/or the thin film are held at a temperature of 23° C. for at least a portion of time during the formation of the thin film. In some embodiments, the thin film is held at one of these temperature ranges (e.g., between 15° C. and 35° C. or at 23° C.) during the entirety of the formation of the thin film. Depositing the thin film at such relatively mild, near-room-temperature conditions may beneficial during the fabrication of certain thin films for certain applications, such as amorphous thin films for use as active electrodes in batteries.

In some embodiments, the surface and/or the thin film are held at a first temperature for at least a portion of the time during the formation of the thin film, and then held at a second temperature following the formation of the thin film. For example, in accordance to certain embodiments, surface 230 and/or multilayer film 150 are held at a first temperature during formation of the multilayer film via sequential formation of first vapor 215 from first target 210 (as shown in FIG. 2A) and second vapor 225 from second target 220 (as shown in FIG. 2B). Then, after formation of multilayer film 150 is complete, multilayer 150 and/or surface 230 on which it is deposited is held at a second temperature. In some embodiments, holding the thin film at a second temperature following the formation of the thin film results in a change in the composition, phase, and/or morphology of the thin film. For example, a deposited multilayer film being held at a second temperature after being deposited at a first temperature may result in the conversion of the multilayer film into a uniform thin film as described herein. This process of depositing a thin film at a first temperature and then holding it at a second temperature may be useful in allowing the film to be exposed to a second environment, distinct from the vacuum conditions of the deposition environment, during a high temperature treatment (e.g., post-annealing treatment) at the second temperature. For example, the thin film, in certain embodiments, can be exposed to a higher partial pressure of a reactive gas (see below) when being held at the second temperature following formation of the first temperature, resulting in the formation of the thin film of different composition and/or superior properties.

In some embodiments, the first temperature and the second temperature are different. In some embodiments, the second temperature is greater than the first temperature (e.g., in the case of a post-annealing step following the deposition of a thin film or multilayer film). In some embodiments, the second temperature is at least 100° C. higher than the first temperature. In some such cases in which the second temperature is significantly higher than the first temperature, favorable properties of the resulting thin film are achieved. In some embodiments, a multilayer film comprising alternating layers of a lithium-containing material and a lithium nitride is formed at a first temperature under vacuum conditions, and then following the formation of the multilayer film, the multilayer film is held at a second temperature at least 100° C. higher than the first temperature, resulting in the conversion from the multilayer film into a uniform thin film comprising the lithium-containing material having favorable properties (e.g., a high lithium content, a high ionic conductivity, a high mixed ionic/electronic conductivity, high density, uniform morphology). For example, In some embodiments, a multilayer film comprising alternating layers of $Li_aLa_bZr_cO_dX_e$ and a lithium nitride is formed at a first temperature (e.g., 300° C.) under vacuum conditions, and then following the formation of the multilayer film, the multilayer film is held at a second temperature at least 100° higher than the first temperature (e.g., the second temperature may be in the range of between 580° C. and 800° C.), resulting in the conversion from the multilayer film into a uniform thin film comprising the cubic phase of $Li_aLa_bZr_cO_dX_e$ having favorable properties (e.g., a high lithium content, a high ionic conductivity, high density, uniform morphology).

In some embodiments, the first temperature (i.e., the temperature at which the thin film and/or the surface are held during at least a portion of the time during the formation of the thin film) is in the range of from 15° C. to 450° C. In some embodiments, the first temperature is at least 20° C., at least 35° C., at least 50° C., at least 75° C., at least 100° C., at least 150° C., at least 200° C., at least 225° C., at least 250° C., at least 275° C., or at least 300° C. In some embodiments, the first temperature is less than or equal to 450° C., less than or equal to 425° C., less than or equal to 400° C., less than or equal to 375° C., less than or equal to 350° C., or less than or equal to 325° C. Combinations of the above ranges are possible. For example, in some embodiments the first temperature is greater than or equal to 15° C. and less than or equal to 450° C., greater than or equal to 200° C. and less than or equal to 450° C. or greater than or equal to 250° C. and less than or equal to 400° C. Other combinations are possible. In other embodiments, other temperatures outside these ranges can be used.

In some embodiments, the surface and/or the thin film are held at a temperature of between 580° C. and 800° C. following the formation of the thin film. In other words, in some embodiments, the second temperature (i.e., the temperature at which the thin film and/or the surface are held following the formation of the thin film) is between 580° C. and 800° C. In some embodiments, the surface and/or the thin film are held at a temperature of at least 200° C., of at least 300° C., of at least 400° C., of at least 500° C., at least 520° C., at least 535° C., at least 550° C., at least 580° C., at least 585° C., at least 590° C., at least 600° C., at least 615° C., at least 630° C., at least 660° C., at least 700° C., at least 710° C., at least 740° C., or higher. In some embodiments, the surface and/or the thin film are held at a temperature of less than or equal to 900° C., less than or equal to 850° C., less than or equal to 800° C., less than or equal to 790° C., less than or equal to 780° C., less than or equal to 760° C., less than or equal to 740° C., less than or equal to 720° C., less than or equal to 700° C., or less. Combinations of the above ranges are possible. For example, in some embodiments, the surface and/or the thin film are held at a temperature of greater than or equal to 200° C. and less than or equal to 900° C., greater than or equal to 400° C. and less than or equal to 800° C., greater than or equal to 400° C. and less than or equal to 900° C., greater than or equal to 580° C. and less than or equal to 810° C., or greater than or equal to 660° C. and less than or equal to 740° C. In other embodiments, other temperatures outside these ranges can be used.

As mentioned above, in some embodiments, the second temperature is higher than the first temperature (e.g., the second temperature is at least 100° C. higher than the first temperature), resulting in a thin film having favorable properties. In some embodiments, the second temperature is at least 115° C., at least 130° C., at least 130° C., at least 150° C., at least 175° C., at least 200° C., at least 250° C., at least 300° C., at least 350° C., and/or up to 450° C., up to 500° C., up to 600° C., or more greater than the first temperature.

The inducing of the formation of the first vapor and the formation of the second vapor, and the resulting formation of a thin film on the surface (at least a portion of which occurs under vacuum conditions), can be achieved using a variety of suitable techniques. Examples of suitable techniques include physical vapor deposition (PVD) techniques. The technique (or parameters) used for inducing formation of the first vapor may be the same as the technique used for inducing formation of the second vapor. However, in some embodiments, the technique (or parameters) used for inducing formation of the first vapor may be different than the technique used for inducing formation of the second vapor.

In some embodiments, the formation of the first vapor comprises inducing a plasma state of at least a portion of the first target. In addition, in some embodiments, the formation of the second vapor comprises inducing a plasma state of at least a portion of the second target. The plasma state of the first target and/or the second target can be induced by various PVD techniques. For example, in some embodiments, the formation of the first vapor comprises sputtering, evaporation, and/or pulsed laser irradiation of at least a portion of the first target. Referring to FIG. 2A, in accordance with certain embodiments, formation of first vapor 215 (e.g., comprising lithium, lanthanum, zirconium, and oxygen) comprises sputtering (e.g., bombarding with plasma, electrons, and/or other high energy particles) at least a portion of first target 210. In accordance with certain embodiments, formation of first vapor 215 comprises evaporating (e.g., by heating under vacuum conditions) at least a portion of first target 210. In accordance with certain embodiments, formation of first vapor 215 comprises irradiating at least a portion of first target 210 with laser pulses (the formation of films using this technique is referred to as pulsed laser deposition, PFD).

Similarly, in some embodiments, the formation of the second vapor comprises sputtering, evaporation, and/or pulsed laser irradiation of at least a portion of the second target. Referring to FIG. 2B, in accordance with certain embodiments, formation of second vapor 225 (e.g., comprising lithium and nitrogen (e.g., in the form of a lithium nitride)) comprises sputtering at least a portion of second target 220. In accordance with certain embodiments, formation of second vapor 225 comprises evaporation of at least a portion of second target 220. In accordance with certain embodiments, formation of second vapor 225 comprises irradiating at least a portion of second target 220 with laser pulses. As mentioned above, in some embodiments, different parameters are used for the formation of the first vapor than are used for the formation of the second vapor by PVD (or other such as RF-sputtering) techniques. For example, when inducing the formation of the first vapor and the formation of the second vapor using PLD, different pulse repetition rates, laser wavelengths, pulses energies, and/or pulse durations are used inducing vapor/plasma from the respective targets. As one non-limiting example, a KrF excimer laser of 248 nm wavelength can be used with a 10 Hz pulse repetition rate for forming a first vapor from a first target comprising $Li_{6.25}La_3Zr_2O_{12}Al_{0.25}$ and used with a 5 Hz pulse repetition rate for forming a second vapor from a second target comprising $Li_3N$. Using different parameters for forming vapor from the first target and the second target may be beneficial when the first target and the second target have different chemical (e.g., composition), physical (e.g., vapor pressure, density), structural (e.g., morphology), or mechanical properties.

A variety of pressure ranges are suitable for the vacuum conditions used in the methods described herein. In some embodiments, the pressure used may depend, at least in part, on the deposition technique being employed and or the materials being deposited (e.g., due to different materials having different volatilities). In some embodiments, the vacuum conditions correspond to a pressure of less than or equal to $1\times10^3$ Pa, less than or equal to $5\times10^2$ Pa, less than or equal to $2\times10^2$ Pa, less than or equal to $1\times10^2$ Pa, less than or equal to $5\times10^1$ Pa, less than or equal to $2\times10^1$ Pa, less than or equal to $1\times10^1$ Pa, less than or equal to 5 Pa, less than or equal to 2 Pa, less than or equal to 1 Pa, less than or equal to $5\times10^{-1}$ Pa, less than or equal to $2\times10^{-1}$ Pa, less than or equal to $1\times10^{-1}$ Pa, less than or equal to $5\times10^{-2}$ Pa, less than or equal to $2\times10^{-2}$ Pa, less than or equal to $1\times10^{-2}$ Pa, less than or equal to $5\times10^{-3}$ Pa, less than or equal to $2\times10^{-3}$ Pa, less than or equal to $1\times10^{-3}$ Pa, less than or equal to $5\times10^{-4}$ Pa, less than or equal to $2\times10^{-4}$ Pa, less than or equal to $1\times10^{-4}$ Pa, less than or equal to $5\times10^{-5}$ Pa, less than or equal to $2\times10^{-5}$ Pa, less than or equal to $1\times10^{-5}$ Pa, or less. In some embodiments, the vacuum conditions correspond to a pressure of greater than or equal to $1\times10^{-7}$ Pa, greater than or equal to $2\times10^{-7}$ Pa, greater than or equal to $5\times10^{-7}$ Pa, greater than or equal to $1\times10^{-6}$ Pa, greater than or equal to $2\times10^{-6}$ Pa, greater than or equal to $5\times10^{-6}$ Pa, greater than or equal to $1\times10^{-5}$ Pa, greater than or equal to $2\times10^{-5}$ Pa, greater than or equal to $5\times10^{-5}$ Pa, greater than or equal to $1\times10^{-4}$ Pa, greater than or equal to $2\times10^{-4}$ Pa, greater than or equal to $5\times10^{-4}$ Pa, greater than or equal to $1\times10^{-3}$ Pa, greater than or equal to $2\times10^{-3}$ Pa, greater than or equal to $5\times10^{-3}$ Pa, greater than or equal to $1\times10^{-2}$ Pa, greater than or equal to $2\times10^{-2}$ Pa, greater than or equal to $5\times10^{-2}$ Pa, or greater than or equal to $1\times10^{-1}$ Pa. Combinations of the above ranges are possible. For example, in some embodiments, the vacuum conditions correspond to a pressure of greater than or equal to $1\times10^{-7}$ Pa and less than or equal to 1 Pa, or greater than or equal to $1\times10^{-4}$ Pa and less than or equal to less than or equal to $1\times10^{-2}$ Pa. Other combinations are possible.

In certain embodiments, aspects of the methods used herein, such as the use of the second target comprising lithium and nitrogen (e.g., in the form of a lithium nitride), may provide an opportunity for the use of vacuum conditions at a lower pressure than would otherwise be used for the deposition of a given material (e.g., the deposition of a potentially volatile material, such as a lithium-containing material).

In some embodiments, certain gases may be present under the vacuum conditions. For example, in some embodiments, exogenous gases (i.e., gases not resulting from any vapor formed from the targets) are introduced into the vacuum environment in which the first vapor and/or the second vapor are formed (e.g., a vacuum chamber). Referring to FIG. 2A, in accordance with certain embodiments, certain gases (e.g., exogenous gases) are present inside the vacuum chamber 200 during the inducing of the formation of first vapor 215 from first target 210. In certain embodiments, the exogenous gases are used to react with the first target, the second target, the first vapor, the second vapor, the thin film deposited on the surface, and/or any other layers on the surface. Examples of exogenous gases that may be present under the vacuum conditions during the inducing of the formation of the first vapor and/or the second vapor include, but are not limited to, oxygen ($O_2$), nitrogen ($N_2$), helium (He), argon (Ar), neon (Ne), krypton (Kr), carbon dioxide ($CO_2$) and any mixtures thereof.

An exogenous gas may be present (e.g., in the vacuum chamber) at a certain partial pressure during the inducing of the formation of the first vapor and/or the second vapor. For example, an exogenous gas present during the inducing of the formation of the first vapor and/or the second vapor has a partial pressure of at least $1\times10^{-1}$ Pa, at least $2\times10^{-1}$ Pa, at least $5\times10^{-1}$ Pa, at least 1 Pa, at least 2 Pa, at least $5\times10^{-1}$ Pa, at least $1\times10^1$ Pa, or more. In some embodiments, an exogenous gas present during the inducing of the formation of the first vapor and/or the second vapor has a partial pressure of less than or equal to $1\times10^2$ Pa, less than or equal to $8\times10^1$ Pa, less than or equal to $5\times10^1$ Pa, less than or equal to $3\times10^1$ Pa, less than or equal to $2\times10^1$ Pa, less than or equal to $1\times10^1$ Pa, less than or equal to 8 Pa, less than or equal to 5 Pa, less than or equal to 3 Pa, less than or equal to 2 Pa, or less than or equal to 1 Pa. Combinations of the above ranges are possible. For example, in some embodiments, an exogenous gas present during the inducing of the formation of the first vapor and/or the second vapor has a partial pressure of at least $1\times10^{-1}$ Pa and less than or equal to $1\times10^2$ Pa. In some embodiments, $O_2$ is present during the inducing of the formation of the first vapor and/or the second vapor at a partial pressure in one of the ranges described above. In some embodiments, the partial pressure of an exogenous gas is in a first range during the inducing of the formation of the first vapor, and the partial pressure of the exogenous gas is in a second range during the inducing of the formation of the second vapor. In some embodiments the first range and a second range of partial pressures are different. In some embodiments, the first range is greater than the second range. In some embodiments the second range is greater than the first range.

In some embodiments, a relatively high weight percentage of the second target is made up of a combination of lithium and nitrogen. For example, in some embodiments, at least 70 wt % of the second target is made up of a combination of lithium and nitrogen. In some embodiments, at least 75 wt %, at least 90 wt %, at least 95 wt %, at least 98 wt %, at least 99 wt %, or at least 99.9 wt % of the second target is made up of a combination of lithium and nitrogen. In some embodiments, a relatively high atomic percentage of the second target is made up of a combination of lithium and nitrogen. For example, in some embodiments, in terms of atomic percentage, at least 70% of the second target is made up of a combination of lithium and nitrogen. In some embodiments, in terms of atomic percentage, at least 75%, at least 90%, at least 95%, at least 98%, at least 99%, or at least 99.9% of the second target is made up of a combination of lithium and nitrogen.

In some embodiments, a relatively high weight percentage of the second target is made of $Li_fN_gY_h$. For example, in some embodiments, at least 70 wt % of the second target is made of $Li_fN_gY_h$. Having a relatively high weight percentage of the second target in the form of $Li_fN_gY_h$ can lead to the formation of thin films with suitable performance for certain applications, such as a solid-state electrolyte or electrode in a battery or microbattery, due to second vapor formed from the second target comprising $Li_fN_gY_h$ contributing to the thin film a relatively high lithium content and therefore relatively high total ionic conductivity, lithium ion conductivity, and/or mixed ionic/electronic conductivity. In some embodiments, at least 75 wt %, at least 90 wt %, at least 95 wt %, at least 98 wt %, at least 99 wt %, at least 99.9 wt % or more of the second target is made of $Li_fN_gY_h$. The formation of thin films having beneficial properties, in some embodiments, may be facilitated by the use of methods described herein. For example, in accordance with certain embodiments, thin film 100 is deposited via a PVD technique involving first target 210 and second target 220, and at least 70 wt % of second target 200 comprises the $Li_fN_gY_h$ (e.g., $Li_3N$).

In some embodiments, the combination of lithium and nitrogen make up a relatively high weight percentage of the part of the second target that is made of $Li_fN_gY_h$. For example, in some embodiments, the combination of lithium and nitrogen make up at least 80 wt % of the part of the second target that is made of $Li_fN_gY_h$. In some embodiments, the combination of lithium and nitrogen make up at least 85 wt %, at least 90 wt %, at least 95 wt %, at least 98 wt %, at least 99 wt %, at least 99.9 wt % or more of the part of the second target that is made of $Li_fN_gY_h$.

In some embodiments, the part of the second target that is made of $Li_fN_gY_h$ has a relatively low weight percentage of elements that are not lithium or nitrogen. For example, in some embodiments the part of the second target that is made $Li_fN_gY_h$ has weight percentage of elements that are not lithium or nitrogen of less than or equal to 20 wt %, less than or equal to 10 wt %, less than or equal to 5 wt %, less than or equal to 2 wt %, less than or equal to 1 wt %, less than or equal to 0.1%, or less.

The use of the methods described herein may have a variety of advantages. As described above, the use of these methods (e.g., PVD methods comprising forming vapor from multiple targets, one of which comprises lithium and nitrogen (e.g., in the form of lithium nitride)), can help achieve the formation of lithium-containing thin films with a higher total ionic conductivity, lithium ion conductivity, mixed ionic/electronic conductivity and/or more uniform morphology than is achieved using traditional thin film deposition techniques. The methods described herein, including, in accordance with certain embodiments, the use of targets comprising lithium and nitrogen (e.g., a lithium nitride of the form $Li_fN_gY_h$) (which have a relatively high lithium concentration) may also result allow for broader temperature ranges to be employable for forming films comprising certain materials (e.g., thin films comprising lithium-containing materials such as lithium-containing intercalation-type electrode materials, lithium-containing conversion-type electrode materials, lithium metal oxides, cubic LLZO, lithium-containing perovskites, lithium-containing sulfides, phosphates, oxynitrides, etc.). Additionally, the use of the methods described herein may also, in accordance with certain embodiments, result in less time being required for forming certain thin films (e.g., lithium-containing thin films for solid state electrolyte or electrode applications, such as LLZO, $LiCoO_2$, etc.). These improvements might contribute to reduced process costs or processing time when manufacturing some such thin films.

As described above, in some embodiments, the thin film described herein comprises one or more dopants. In some embodiments, the one or more dopants are chosen in order to improve the properties of the thin film, such as its lithium ion conductivity, its mixed ionic/electronic conductivity, and/or the stability of a particular phase of the film (e.g., the cubic phase of $Li_aLa_bZr_cO_dX_e$).

Exemplary elements that the one or more dopants may comprise include, but are not limited to aluminum, gallium, iron, indium, calcium, barium, magnesium, niobium, neodymium, tantalum, scandium, titanium, vanadium, hafnium, silicon, germanium, and/or tin. In some embodiments, the thin film comprises only one dopant, and the dopant is one of the elements listed above. However, in some embodiments, the thin film comprises a combination of the elements mentioned above (e.g., the one or more dopant comprises both aluminum and calcium, or the one or more dopant comprises tantalum and aluminum, or gallium and niobium).

In some embodiments, the thin film comprises one or more dopants, and the one or more dopants has a certain weight percentage in the thin film. Having too high a doping level, may, in accordance with certain embodiments, lead to deleterious effects on the performances the thin film for various applications. For example, having too high a doping level may cause a reduction in the total ionic conductivity and/or the lithium ion conductivity, or a change in phase of a material the thin film comprises. In some embodiments, the one or more dopants has a weight percentage of less than 20 wt % of the thin film. In some embodiments, the one or more dopants has a weight percentage of less than 15 wt %, less than 10 wt %, less than 8 wt %, less than 5 wt %, less than 3 wt %, less than 2 wt %, less than 1 wt %, less than 0.8 wt %, less than 0.5 wt %, less than 0.3 wt %, less than 0.2 wt %, or less than 0.1 wt % in the thin film. In some embodiments, the one or more dopants has a weight percentage of at least 0 wt %, at least 0.01 wt %, at least 0.02 wt %, at least 0.03 wt %, at least 0.04 wt %, at least 0.05 wt %, at least 0.08 wt %, at least 0.01 wt %, at least 0.1 wt %, at least 0.2 wt %, at least 0.3 wt %, at least 0.4 wt %, at least 0.5 wt %, at least 0.8 wt %, at least 1.0 wt %, at least 2.0 wt %, at least 3.0 wt %, or at least 5% of the thin film.

In some embodiments, the thin film has a thickness as well as two orthogonal lateral dimensions that are orthogonal to each other as well as orthogonal to the thickness. For example, referring to FIG. 1, in accordance with certain embodiments, thin film 100 has thickness 103, lateral dimension 105, and a second lateral dimension (not pictured) orthogonal to both thickness 103 and lateral dimension 105 (which would run into and out of the plane of the drawing in FIG. 1).

In some embodiments, the thin film has a relatively small thickness. Having a relatively small thickness can be useful in certain applications of the thin film, such as in the case of solid-state electrolytes in solid state batteries having relatively small sizes (e.g., microbatteries). Having a relatively thin solid-state electrolyte can, for example, help reduce the bulk resistance of the battery and/or increase the energy density of the battery. Thin films having a relatively small thickness while maintaining a high total ionic conductivity, lithium-ion conductivity, mixed ionic/electronic conductivity and/or suitable morphology can be made, in accordance with certain embodiments, using methods discussed herein.

In some embodiments, the thin film has a thickness of less than or equal to 50 μm. In some embodiments, the thin film has a thickness of less than or equal to 30 μm, less than or equal to 25 μm, less than or equal to 8 μm, less than or equal to 20 μm, less than or equal to 15 μm, less than or equal to 10 μm, less than or equal to 8 μm, less than or equal to 6 μm, less than equal to 5 μm, less than equal to 3 μm, less than or equal to 2 μm, less than or equal to 1 μm, less than or equal to 0.8 μm, less than or equal to 0.7 μm, less than or equal to 0.6 μm, less than or equal to 0.5 μm, or less. In some embodiments, the thin film has a thickness of greater than or equal to 50 nm, greater than or equal to 75 nm, greater than or equal to 0.1 μm, greater than or equal to 0.15 μm, greater than or equal to 0.2 μm, greater than or equal to 0.3 μm, greater than or equal to 0.4 μm, or greater than equal to 0.5 μm. Combinations of these ranges are possible. For example, in some embodiments, the thin film has a thickness of greater than or equal to 50 nm and less than or equal to 50 μm. Other combinations are possible.

In some embodiments, the thin film has at least one thickness that satisfies the thickness ranges described above.

In some embodiments, the thin film has an average thickness that satisfies the thickness ranges described above. The average thickness of the thin film can be measured by taking a statistically significant number of measurements at different locations of the film and averaging. For example, the average thickness of the thin film can be measured by taking 25 measurements distributed evenly across the film so as to be representative of the thin film in its entirety, and taking the arithmetic mean of the 25 measurements.

In some embodiments, at least one of the lateral dimensions of the thin film is greater than the thickness of the thin film. For example, in accordance with certain embodiments, lateral dimension 105 is greater than thickness 103 of thin film 100. In some embodiments, at least one of the lateral dimensions is at least 5 times, at least 10 times, at least 100 times, at least 1000 times, at least 10,000 times, at least 100,000 times, or at least 1 million times greater than the thickness of the thin film. In some embodiments, both of the lateral dimensions are at least 5 times, at least 10 times, at least 100 times, at least 1000 times, at least 10,000 times, at least 100,000 times, or at least 1 million times greater than the thickness of the thin film.

In some embodiments, the thin film has a relatively high density. For example, in some embodiments, thin film 100 has a relatively high density (e.g., mass to volume density). Having a high density can, in some cases, contribute to improved performance of the thin film for certain applications. For example, in the case of thin films used as solid-state electrolytes in batteries, having a low density can lead to a lower volumetric lithium ion concentration (and therefore a reduced lithium ion conductivity) and a lower volumetric energy density. Moreover, as described above, thin films of a given composition having a low density (e.g., due to loose packing of the material in the thin film) may, in some cases, be susceptible to the promotion of paths for lithium dendrite propagation, thereby degrading performance of, for example, a solid-state lithium-ion battery. According to some embodiments, thin films having a relatively high density can be fabricated using methods described herein.

In some embodiments, the thin film has a density of at least 5.0 g/cm$^3$. In some embodiments, the thin film has a density of at least 1.5 g/cm$^3$, at least 2.0 g/cm$^3$, at least 3.0 g/cm$^3$, at least 4.0 g/cm$^3$, at least 4.5 g/cm$^3$, at least 4.75 g/cm$^3$, at least 4.9 g/cm$^3$, at least 5.0 g/cm$^3$, at least 5.05 g/cm$^3$, or at least 5.1 g/cm$^3$. In some embodiments, the thin film has a density of less than or equal to 15 g/cm$^3$, less than or equal to 12 g/cm$^3$, less than or equal to 11 g/cm$^3$, less than or equal to 10 g/cm$^3$, less than or equal to 8 g/cm$^3$, less than or equal to 7 g/cm$^3$, less than or equal to 6 g/cm$^3$, less than or equal to 5.5 g/cm$^3$, less than or equal to 5.35 g/cm$^3$, less than or equal to 5.25 g/cm$^3$, less than or equal to 5.2 g/cm$^3$, or less than or equal to 5.15 g/cm$^3$. Combinations of these ranges are possible. For example, in some embodiments, the thin film has a density of at least 1.5 g/cm$^3$ and less than or equal to 15 g/cm$^3$, or least 4.75 g/cm$^3$ and less than or equal to 5.35 g/cm$^3$, or greater than or equal to 5.0 g/cm$^3$ and less than or equal to 5.2 g/cm$^3$, or greater than or equal to 5.05 g/cm$^3$ and less than or equal to 5.15 gm/cm$^3$. Other ranges are possible. In some cases, the density range of the thin film may depend on the presence of the one or more dopants.

In some embodiments, the thin film has a relatively high relative density with respect to the theoretical density of the predominant material of which the thin film is made. For example, a thin film comprising a lithium-containing material (e.g., a lithium-containing oxide) may have a high relative density with respect to the theoretical density of the lithium-containing material. For example, a thin film comprising the cubic phase of $Li_aLa_bZr_cO_dX_e$ (e.g., $Li_{6.25}La_3Zr_2O_{12}Al_{0.25}$ or $Li_7La_3Zr_2O_{12}$) may have a high relative density with respect to the theoretical density of the cubic phase of $Li_aLa_bZr_cO_dX_e$. In some embodiments, the thin film has a relative density of at least 80%, at least 90%, at least 95%, at least 98%, or more with respect to the theoretical density of the predominant material of which the thin film is made. For example, a thin film comprising a lithium-containing material as the predominant material of which the thin film is made may have a relative density of at least 80%, at least 90%, at least 95%, at least 98%, or more with respect to the theoretical density of the lithium-containing material. As one non-limiting example, in some embodiments, the thin film is predominantly made of the cubic phase of $Li_aLa_bZr_cO_dX_e$ (e.g., over 70 wt %), and the thin film has a relative density of at least 80%, at least 90%, at least 95%, at least 98%, or more with respect to the theoretical density of the cubic phase of $Li_aLa_bZr_cO_dX_e$.

In some embodiments, the thin film is substantially uniform. The thin film may be substantially uniform in terms of phase, composition/stoichiometry, morphology, and/or thickness. For example, in FIG. 1, thin film 100, according to certain embodiments, is substantially uniform in terms of phase, composition, morphology, and thickness.

In some embodiments, the thin film is substantially uniform with respect to the crystallographic phase of the thin film. For example, in some embodiments, the thin film comprises the cubic phase of $Li_aLa_bZr_cO_dX_e$, and the relative abundance of the cubic phase of $Li_aLa_bZr_cO_dX_e$ in the thin film is substantially uniform throughout the dimensions of the thin film (e.g., along the thickness and/or one or more of the lateral dimensions of the thin film). In other words, when the thin film comprises a certain crystallographic phase of a material (e.g., the cubic phase of $Li_aLa_bZr_cO_dX_e$), the material having that crystallographic phase is not isolated to islands or domains surrounded by the material having a different crystallographic phase/polymorph (e.g., the tetragonal phase of $Li_aLa_bZr_cO_dX_e$). The uniformity of the thin film with respect to crystallographic phase can be assessed using, for example thin film X-ray diffraction (XRD) at a statistically representative number of locations on the thin film.

In some embodiments, the thin film is substantially uniform with respect to the composition of the thin film. For example, in accordance with certain embodiments, thin film 100 is substantially uniform with respect to composition along one or more of its dimensions, such as thickness 103, lateral dimension 105, or the lateral dimension orthogonal to both thickness 103 and lateral dimension 105. In some embodiments, thin film 100 is substantially uniform with respect to composition along all of its dimensions. Uniformity of composition generally refers to the distribution of the different materials or compositions of which the thin film is made, as well as the stoichiometry of the material (e.g., amount of Li$^+$ present, or a in the formula $Li_aLa_bZr_cO_dX_e$), and/or doping levels. Uniformity of composition does not require that only one material be present, but rather, that the spatial distribution of the materials be substantially homogeneous throughout the film. In some embodiments, the thin film is a mixture or alloy of multiple materials, the mixture being distributed homogeneously throughout the dimensions of the thin film. In some embodiments, however, only one material (e.g., a lithium metal oxide, or the cubic phase of $Li_aLa_bZr_cO_dX_e$) is present. A thin film that is substantially uniform with respect to the composition of the thin film does not have isolated islands or domains of a first material surrounded by domains of a second material. The uniformity of a thin film with respect to composition can be assessed using, for example, Raman vibrational spectroscopy and/or elemental analysis (such as energy-dispersive X-ray spectroscopy, EDX).

In some embodiments, the thin film is substantially uniform with respect to certain elements, but not others. For example, in some cases, the thin film is substantially uniform with respect to the spatial distribution of elements of the chemical formula of a host material, but not uniform with respect to the spatial distribution of the dopant. As a non-limiting example, in certain embodiments, the thin film comprises $Li_aLa_bZr_cO_dX_e$, optionally wherein nitrogen replaces Li, La, Zr, O, and/or X at one or more of the lattice sites of the cubic lattice, and the Li, La, Zr, and O are distributed substantially uniformly throughout the thin film but a dopant X (e.g., Al) is distributed non-uniformly. In some cases, for example, a dopant (e.g., X) is distributed in a periodic pattern throughout the thickness of the thin film. Without being bound by any particular theory, such a periodic distribution of an element (such as a dopant) may be, in certain cases, a residual effect of an intermediate multilayer structure (e.g., multilayer 150 in FIG. 5) formed as part of certain of the methods described herein. In some cases, there is a higher abundance of the dopant in domains corresponding to one set of layers of the multilayer structure (e.g., those corresponding to the first layer), and a lower abundance of the dopant occurring in domains in domains corresponding to another set of layer of the multilayer structure (e.g., those corresponding to the second layer).

In some, but not necessarily all embodiments, the thin film has a substantially uniform morphology. For example, in accordance with certain embodiments, thin film 100 has a substantially uniform morphology along one or more of its dimensions, such as thickness 103, lateral dimension 105, or the lateral dimension orthogonal to both thickness 103 and lateral dimension 105. For thin films having a substantially uniform morphology, the shape, physical structure, and/or micro structure of the thin film does not substantially vary along the dimensions of the thin film (e.g., along the lateral dimensions of the thin film). It should be noted that a thin film that is poly crystalline (see below) may still have a substantially uniform morphology. A thin film having a substantially uniform morphology does not possess observable cracks, pinholes, or other structural defects, other than the grain boundaries and/or crystallites having differing orientations that may exist in cases in which the thin film is polycrystalline. The presence of cracks, and/or pinholes may contribute to poor performance thin films in certain applications, such as solid-state electrolytes or electrodes. The morphology of the thin film can be assessed, for example, by examining SEM images of the thin film.

In some embodiments, the thin film has a relatively small number of through-thickness defects. As used herein, through-thickness defects include pinholes and cracks, but do not include grain boundaries that may exist in cases in which the thin film is polycrystalline. Having a relatively small number of through-thickness defects may, in accordance with certain embodiments, limit certain problems associated with thin films in certain applications, such as dendrite propagation or short circuiting in solid state lithium batteries. In some embodiments, the thin film has fewer than 10 through-thickness defects per $cm^2$. In some embodiments, the thin film has fewer than 5, fewer than 2, fewer than 1, fewer than 0.5, fewer than 0.1, fewer than 0.05, fewer than 0.01, or fewer through-thickness defects per $cm^2$.

In some embodiments, the thin film has a substantially uniform density. For example, in accordance with certain embodiments, thin film 100 has a substantially uniform density along one or more of its dimensions, such as thickness 103, lateral dimension 105, or the lateral dimension orthogonal to both thickness 103 and lateral dimension 105. In some embodiments, the thin film has a substantially uniform density along each of its dimensions. In some embodiments, the density of the thin film varies less than 10%, less than 5%, less than 2%, less than 1%, or less than 0.5% along each of its dimensions.

In some embodiments, the thin film has a substantially uniform thickness. For example, in accordance with certain embodiments, thin film 100 has a substantially uniform thickness 103 along lateral dimension 105 or the lateral dimension orthogonal to both thickness 103 and lateral dimension 105. In some embodiments, the thin film has a substantially uniform thickness along each of its lateral dimensions. In some embodiments, the thickness of the thin film varies less than 150%, less than 100%, less than 75%, less than 50%, less than 35%, less than 20%, than 10%, less than 5%, less than 2%, less than 1%, or less than 0.5% along at least one of its lateral dimensions. In some embodiments, the thickness of the thin film varies less than 150%, less than 100%, less than 75%, less than 50%, less than 35%, less than 20%, less than 10%, less than 5%, less than 2%, less than 1%, or less than 0.5% along each of its lateral dimensions. The thickness of the thin film can be measured using SEM. The percentage to which the thickness varies along a lateral dimension can be determined by measuring a statistically representative number of locations spread evenly along the dimension (e.g., 25), and calculating the percent difference of each location from the average thickness along the dimension, and taking the average of those percent differences.

In some, but not necessarily all embodiments, the thin film is crystalline. In some such embodiments, the thin film is polycrystalline. A thin film being polycrystalline generally refers to the thin film possessing a multitude of different crystallographic domains (i.e., crystallites), each having the same composition, that are either oriented randomly or with a preferred orientation. In other embodiments, the thin film comprises a single crystal (i.e., the thin film is single crystalline). In some embodiments, a relatively high percentage of the volume of the thin film is crystalline (e.g., poly crystalline or a single crystal). For example, in accordance with certain embodiments, a relatively high percentage of the volume of thin film 100 is crystalline. Generally, a portion of a volume of a material is crystalline if it is structurally ordered (i.e., has a repeating lattice structure). A portion of a volume of the material is not crystalline if it is amorphous. Having a high degree of crystallinity (i.e., a high percentage of a volume being crystalline) can be beneficial in certain applications. For example, the mobility of lithium ions in a lithium containing solid-state electrolyte thin film may be higher than the mobility lithium ions and a thin film of the same material that that has a low degree of crystallinity (i.e., has a high degree of amorphous material). In some embodiments, the volume of the thin film that is crystalline is at least 80%, at least 90%, at least 95%, at least 98%, at least 99%, or at least 99.9%. In some embodiments, the thin film is crystalline. A thin film is crystalline if it does not contain amorphous material. The global degree crystallinity of a thin film can be determined by analyzing the XRD pattern of the thin film, and local crystallinity can be assessed by Raman vibrational spectroscopy.

In some embodiments, the percentage of volume of the thin film that is crystalline is substantially uniform. For example, in accordance with certain embodiments, the percentage of volume of thin film 100 that is crystalline is substantially uniform along one or more of its dimensions, such as thickness 103, lateral dimension 105, or the lateral dimension orthogonal to both thickness 103 and lateral dimension 105. In some embodiments, the percentage of volume of the thin film that is crystalline is substantially uniform along each of its dimensions. In some embodiments, the percentage of volume of the thin film that is crystalline varies less than 10%, less than 5%, less than 2%, less than 1%, or less than 0.5% along one or more of its dimensions. In some embodiments, the percentage of volume of the thin film that is crystalline varies less than 10%, less than 5%, less than 2%, less than 1%, or less than 0.5% along each of its dimensions.

In some embodiments, the thin film is amorphous. An amorphous thin film may be useful in certain applications, such as active electrode in solid-state batteries. For example, in some embodiments, the thin film comprises lithium-containing amorphous silicon, or lithium-containing amorphous antimony, both of which can be used as electrodes in certain applications. In some cases, amorphous films are useful for certain applications, such as electrode materials. In some embodiments, a relatively high percentage of the volume of the thin film is amorphous. In some embodiments, the volume of the thin film that is amorphous is at least 80%, at least 90%, at least 95%, at least 98%, at least 99%, or at least 99.9%.

In some embodiments, the thin film is stable with respect to one or more of the properties described above (e.g., crystallographic phase, composition, lithium content, total ionic conductivity and/or lithium ion conductivity, morphology, crystallinity, etc.) at room temperature (23° C.). For example, in some embodiments, the thin film comprises the cubic phase of $Li_aLa_bZr_cO_dX_e$, and the thin film is stable with respect the amount of the thin film that is made of the cubic phase of $Li_aLa_bZr_cO_dX_e$ at 23° C.

A thin film is stable with respect to a property if the property remains substantially unchanged (i.e., changes by less than 5%) for a certain period of time. For example, in some embodiments, the thin film comprises the cubic phase of $Li_aLa_bZr_cO_dX_e$, and the thin film is stable with respect to that crystallographic phase if the amount of the thin film that is made of the cubic phase of $Li_aLa_bZr_cO_dX_e$ remains substantially unchanged for a certain period of time at room temperature (23° C.). In some embodiments, the certain period of time over which a property of a thin film that is stable with respect to the property remains substantially unchanged at room temperature (23° C.) is at least five minutes, at least 10 minutes, at least one hour, at least six hours, at least 12 hours, at least one day, at least two days, at least one week, at least one month, or more.

A property is substantially unchanged if less than a 5% change in the property is experimentally observed after the certain period of time when compared to experimental observations made before the certain period of time elapsed. For example, the crystallographic phase of a material is substantially unchanged if a comparison of XRD patterns of the material shows less than a 5% change in phase from the original phase to other phases of the material after the certain period of time. Other techniques can be used for determining the stability of other properties (e.g., Raman vibrational spectroscopy can be used to determine the stability of the composition of the thin film).

EXAMPLES

The following examples are intended to illustrate certain embodiments of the present invention, but do not exemplify the full scope of the invention. In particular, the examples show exemplary methods of fabrication thin films of exemplary lithium-containing materials.

Example 1

Figure 6:
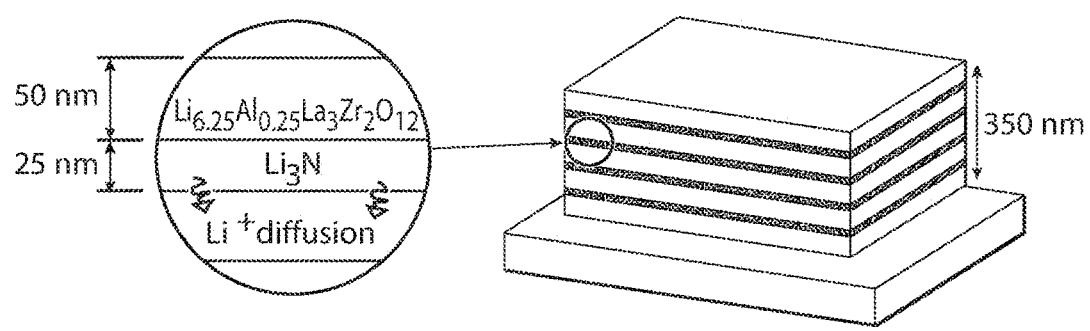
FIG. 6 shows a three-dimensional cross-sectional schematic of an exemplary multilayer film, according to certain embodiments.

This example describes experimentation, embodiments, and non-limiting theories regarding the mechanisms and parameters guiding the fabrication of Li-containing thin film electrolytes and electrodes. The materials and parameter values described in this example are non-limiting and by way of example, only. In particular, this example demonstrates an exemplary method of fabrication of dense and crack-free thin films of the cubic phase of LLZO. The highly lithium conductive cubic phase was achieved by deposition of a multilayer of $Li_3N$ and $Li_{6.25}Al_{0.25}La_3Zr_2O_{12}$ by means of pulsed laser deposition (PLD), either directly at 660° C. or depositing at a reduced temperature of 300° C. followed by a short (15 minute) post-annealing step under pure oxygen. FIG. 6 depicts an exemplary illustration of a multilayer of $Li_3N$ and $Li_{6.25}Al_{0.25}La_3Zr_2O_{12}$, in accordance with certain embodiments. For both methods, the merging of the individual layers and incorporation of the excess lithium from the sacrificial $Li_3N$ into the garnet structure were successfully demonstrated. The appearance and formation of islands of delithiated pyrochlore phase $La_2Zr_2O_7$ were only observed upon excessive heating to 980° C. This indirectly confirmed the already observed behavior of successive lithium loss in bulk LLZO also for the first time in thin film deposited form.

Material Synthesis of Li-Garnet Electrolyte Pellet Substrates $Li_{6.25}Al_{0.25}La_3Zr_2O_{12}$ powder was synthesized based on a method described in the following reference: Van Den Broek J, Afyon S, Rupp JL. Interface-Engineered All-Solid-State Li-Ion Batteries Based on Garnet-Type Fast Li$^+$ Conductors. Advanced Energy Materials. 2016; 6(19), which is incorporated by reference herein in its entirety. Stable precursor sols were obtained by dissolution of stoichiometric amounts of $LiNO_3$ (99.99%, Merck), $La(NO_3)_3(H_2O)_6$ (99.9%, Alfa Aesar), and zirconium(IV) 2,4-pentanedionate (Alfa Aesar) in a water and ethanol mixture which was calcined at 600-650° C. after drying. After uniaxial as well as isostatic pressing (440 bar for 3 min), sintering took place at 1050° C. for 12 hours. A sintered pellet of 30 mm in diameter was obtained with >85% of theoretical density. This electrolyte pellet was later used as a target material for thin film deposition by pulsed laser deposition.

Material Synthesis of Pellet $Li_3N$ $Li_3N$ powder (Sigma Aldrich, ≥99.5%) was used as received. Uniaxial pressing inside an Ar-filled glovebox at 10 tons for 3 minutes was followed by isostatic pressing (440 bar for 3 min). Direct sintering of the pellet buried in parent powder at 600° C. for 6 hours under 50 sccm of ultra-pure $N_2$ led to a sintered pellet of 30 mm in diameter with >85% of theoretical density. Exposure of the $Li_3N$ material to ambient atmosphere with was avoided due to the fast degradation of $Li_3N$ in humid air.

Thin Film Processing of $Li_3N/Li_{6.25}Al_{0.25}La_3Zr_2O_{12}$ Multilayered Electrolyte Thin films of repeating layers of $Li_3N$ and $Li_{6.25}Al_{0.25}La_3Zr_2O_{12}$ were deposited by pulsed laser deposition (PLD). The equipment for deposition (PLD, Surface, Germany) included a KrF excimer laser of 248 nm wavelength at a frequency of 5 Hz and 10 Hz for the $Li_3N$ and $Li_{6.25}Al_{0.25}La_3Zr_2O_{12}$ targets, respectively. Both PLD targets were thoroughly polished prior to transfer into the vacuum chamber. The target-to-substrate distance was kept constant at 70 mm, and background pressures during deposition were fixed at 0.013 hPa $O_2$ in the case of $Li_{6.25}Al_{0.25}La_3Zr_2O_{12}$-layers and 0.04 hPa $O_2$ in the case of $Li_3N$-layers. Each deposited film was made of exactly 9 individual layers: 5 were chosen to be 50 nm-thick layers of $Li_{6.25}Al_{0.25}La_3Zr_2O_{12}$ (including the top layer and bottom layer) and 4 intermediate layers were chosen to be 25 nm-thick layers of $Li_3N$. The temperature of the substrate was kept constant at 300° C. for all thin film that were later post-annealed. Thin films that were not post-annealed were directly deposited as a multilayer structure at a constant temperature of 660° C. As a substrate, 10 mm×10 mm (001) oriented MgO (Crystec, Germany) was used for all thin film structural and electrochemical analysis.

Structural Characterization of Thin Films as Well as Bulk Pellet Materials.

The electrolyte target pellet was characterized by X-Ray diffraction (XRD, Bruker D8, USA) with Cu $K_\alpha$ radiation in Bragg-Brentano geometry. An extraction voltage of 40 kV at 40 mA current was used between $2\Theta=25°-55°$. Thin film samples on (001) oriented MgO were investigated using a thin film-XRD machine (Bruker Discovery D8, USA) operating with Cu $K_\alpha$ radiation in Bragg-Brentano geometry in a range of $2\Theta=15°-32.5°$. Microstructure features of the as deposited as well as post annealed thin films were investigated by cross sectional scanning electron microscopy (SEM, Leo 1530, Germany).

Post Annealing and In-Situ/Ex-Situ Raman Spectroscopy Investigation.

After deposition, selected thin films were broken into 4 shards, 5 mm×5 mm each, and annealed separately under 20 sccm pure $O_2$ in a high temperature annealing stage equipped with an optical window (Linkam T95-HT, Linkam Scientific, UK), at different temperatures ranging from 300° C. to 980° C. for 15 minutes at a strict heating and cooling rate of 10° C./min, which was enforced by active water cooling. Optical Raman spectroscopy was conducted at 10 mW power and 532 nm wavelength (WiTec, Germany, spectral resolution 0.7 $cm^{-1}$) used for near order structural analysis. The Raman vibrational spectra of the post-annealed samples were acquired ex-situ after cooldown to room temperature whereas for the in-situ experiment, Raman vibrational spectra were directly measured through a tiny optical quartz window in the heating stage at the end of each of the 15 minute annealing steps.

Electrochemical Characterization of Thin Film Transport Properties.

Electrical impedance spectroscopy was performed with an in-plane geometry on selected thin films, with 100 nm thick electron beam evaporated platinum electrodes of lateral dimensions of 3.25 mm×0.5 mm, separated 0.25 mm (Plassys MEB 550, France). An impedance measurement device (Zahner IM6, Germany) was attached to a heated Linkam stage (Linkam Scientific, UK) and the respective Nyquist data in the frequency range of 1 Hz to 1 MHz was analyzed with ZView 3.4f and OriginPro 9.1 software. Arrhenius activation energies of the thin films were measured by heating the films between 50° C. to 400° C. under synthetic air flow of 50 sccm. At each temperature, samples were stabilized for 15 minutes to assure an equilibrium was reached before any measurements took place.

Thin Film Negative-Ion TOF-SIMS for Qualitative Elemental Analysis.

To observe the elemental distribution in the multilayered structure, negative-ion time-of-flight secondary ion mass spectroscopy (TOF.SIMS, ION-TOF GmbH, Germany) was conducted on post annealed samples. For the TOF-SIMS analysis, a primary beam with 25 keV $Bi^+$ primary ions at a measured current of 3.52 pA was used. The sputtering was performed with 2 keV $Cs^+$-ion on a grater of 500 μm×500 μm. The analysis area was 200 μm×200 μm. The profiling was performed alternating 2.6 seconds of sputtering, 100 microseconds of analyzing with 0.5 seconds of waiting and stabilization time in between. The raster analysis area was random with a 128×128 pixel resolution. The emission current was set to 1 pA during the entire measurement.

Example 2

This example describes further experimentation, embodiments, and non-limiting theories regarding the mechanisms and parameters guiding the fabrication of Li-containing thin film electrolytes and electrodes. The materials and parameter values described in this example are non-limiting and by way of example, only.

Figure 7A:
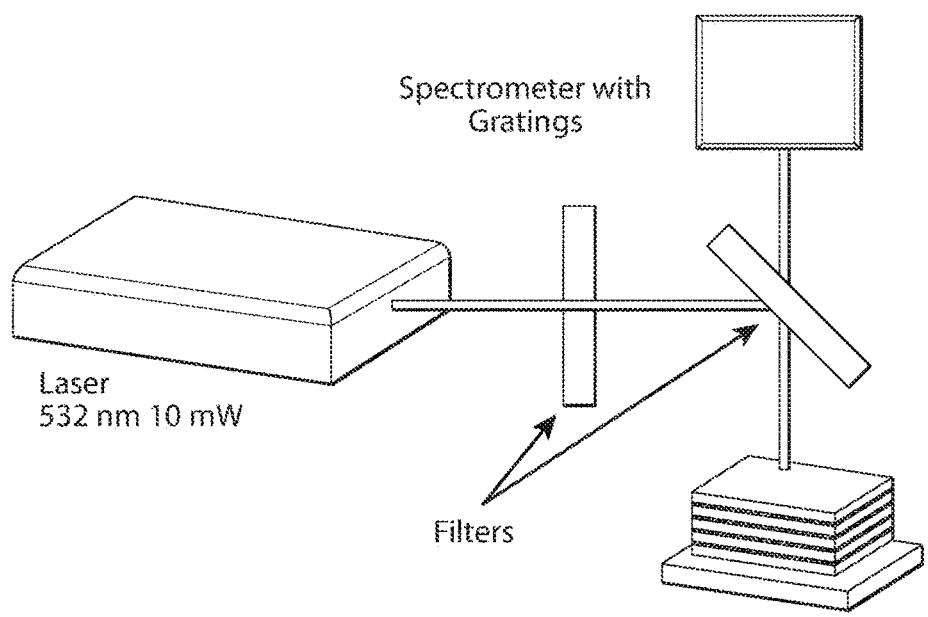
FIG. 7A shows a schematic of a Raman vibrational spectroscopy experimental setup, according to certain embodiments.
Figure 7B:
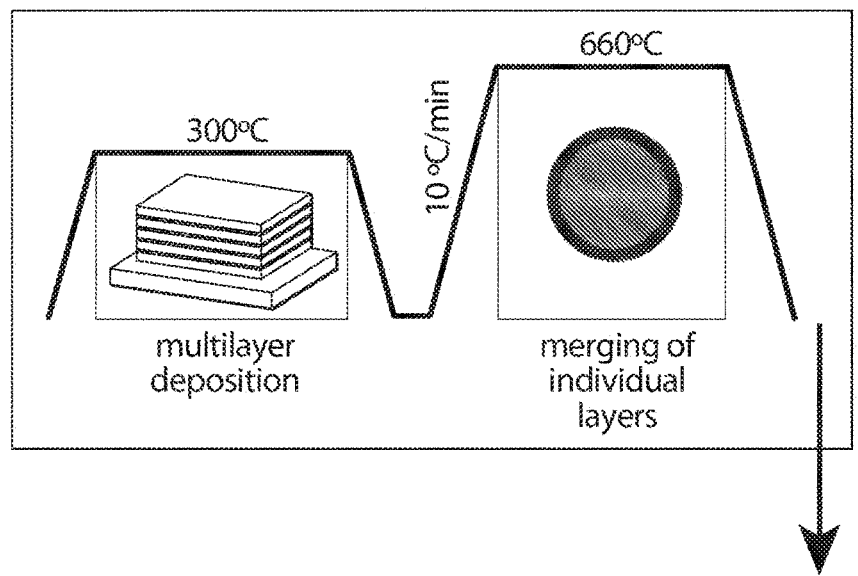
FIG. 7B shows schematics for two different approaches for fabricating thin films comprising the cubic phase of LLZO, according to certain embodiments
Figure 7B:
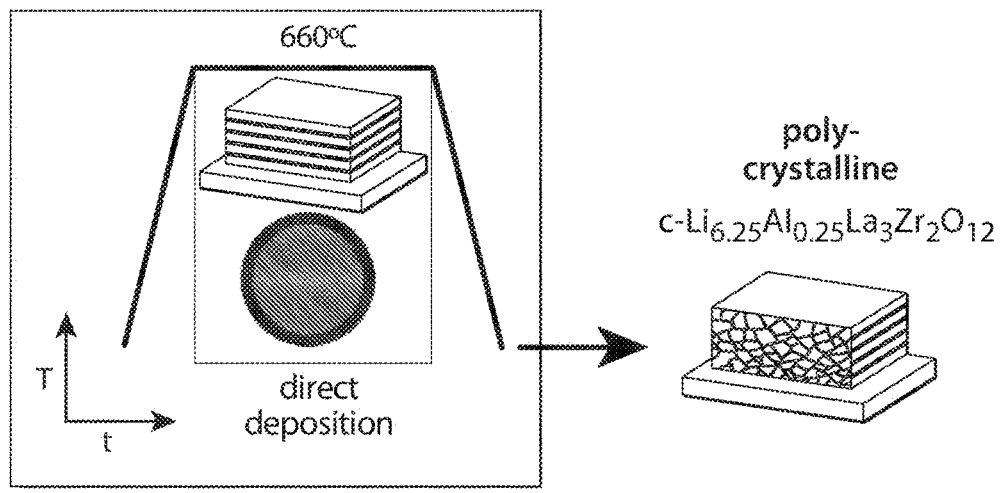
Figure 8:
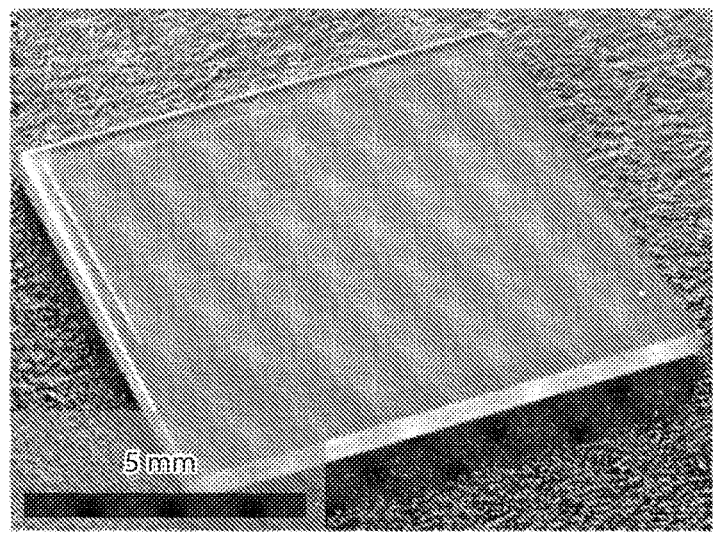
FIG. 8 shows an optical microscopy image of a thin film deposited on an MgO substrate, according to certain embodiments.
Figure 9A:
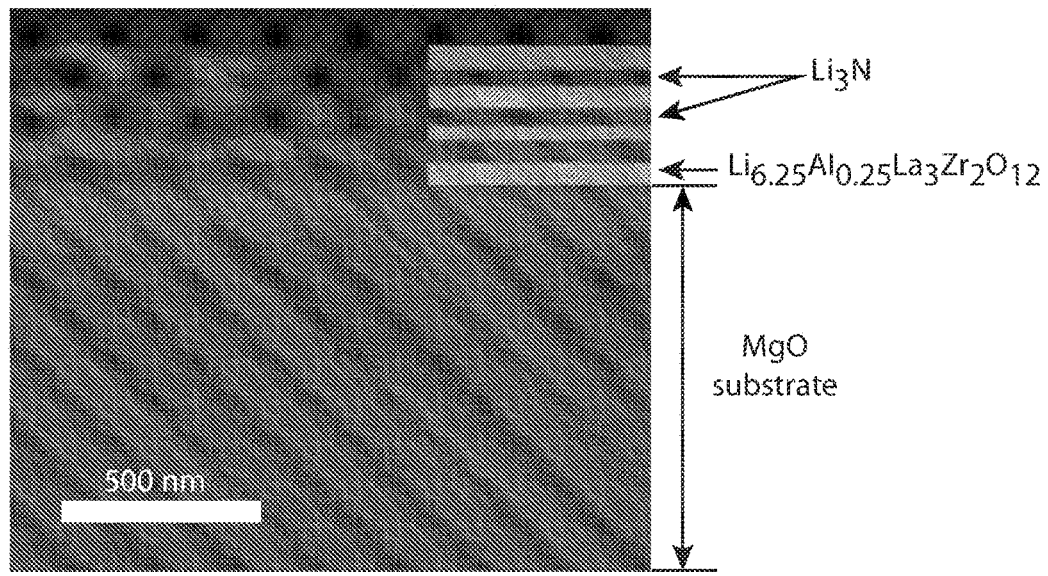
FIG. 9A shows a cross-sectional SEM images of a thin film deposited at 300° C., according to certain embodiments.
Figure 9B:
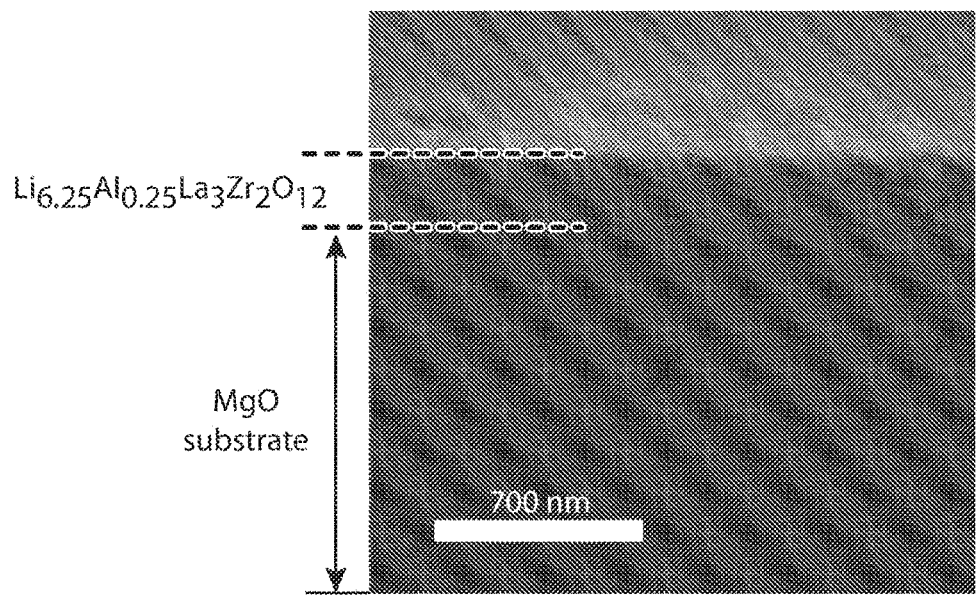
FIG. 9B shows a cross-sectional SEM images of a thin film deposited at 660° C., according to certain embodiments.
Figure 17:
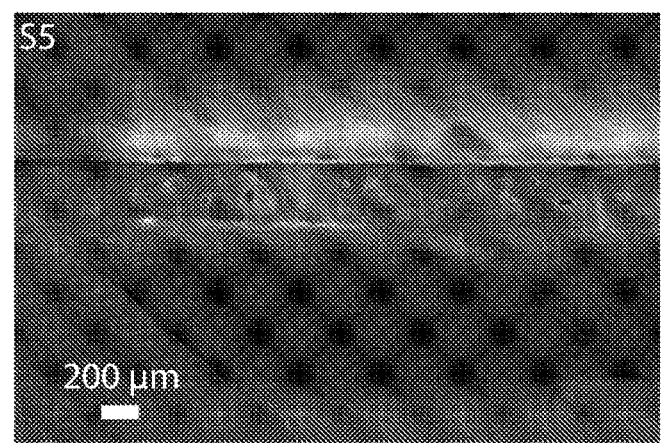
FIG. 17 shows an SEM image of a thin film, according to certain embodiments.

FIG. 6 depicts a schematic illustration of the multilayer approach used for experimentation. Nine repeating distinct layers of $Li_{6.25}Al_{0.25}La_3Zr_2O_{12}$ and $Li_3N$ were deposited on top of each other by PLD on a polished (001) oriented MgO substrate. An in-situ as well as ex-situ Raman vibrational spectroscopy investigation was carried out, with the Raman experimental setup depicted in FIG. 7A. FIG. 8 shows a light microscopy image of the as-deposited film at 300° C. (i.e., a film deposited at 300° C. with no post-annealing step), with no signs of delamination or reaction of individual layers from the process of deposition. SEM imaging, as shown in FIG. 9, was employed on the sample in order to examine the microstructure of the as-deposited thin film. As seen in FIG. 9A, the presence of the individual repeating layers of $Li_{6.25}Al_{0.25}La_3Zr_2O_{12}$ and $Li_3N$ could be clearly observed in the films deposited at 300° C. However the SEM image in FIG. 9B shows that, for a film that was deposited with the same multilayer approach, but was deposited at 660° C. instead of 300° C., the distinct multilayers united and underwent a merging so that no more repeating separate layers could be observed. FIG. 17 shows an SEM image demonstrating the same merging effect of individual layers deposited at 300° C. after a post annealing under pure $O_2$ at 660° C. FIG. 7B illustrates schematic diagrams explaining the two approaches for fabricating the $Li_{6.25}Al_{0.25}La_3Zr_2O_{12}$: approach 1, where the film is deposited at 300° C. and then post-annealed at 660° C., and approach 2, where the film is deposited at 660° C.

Figure 10A:
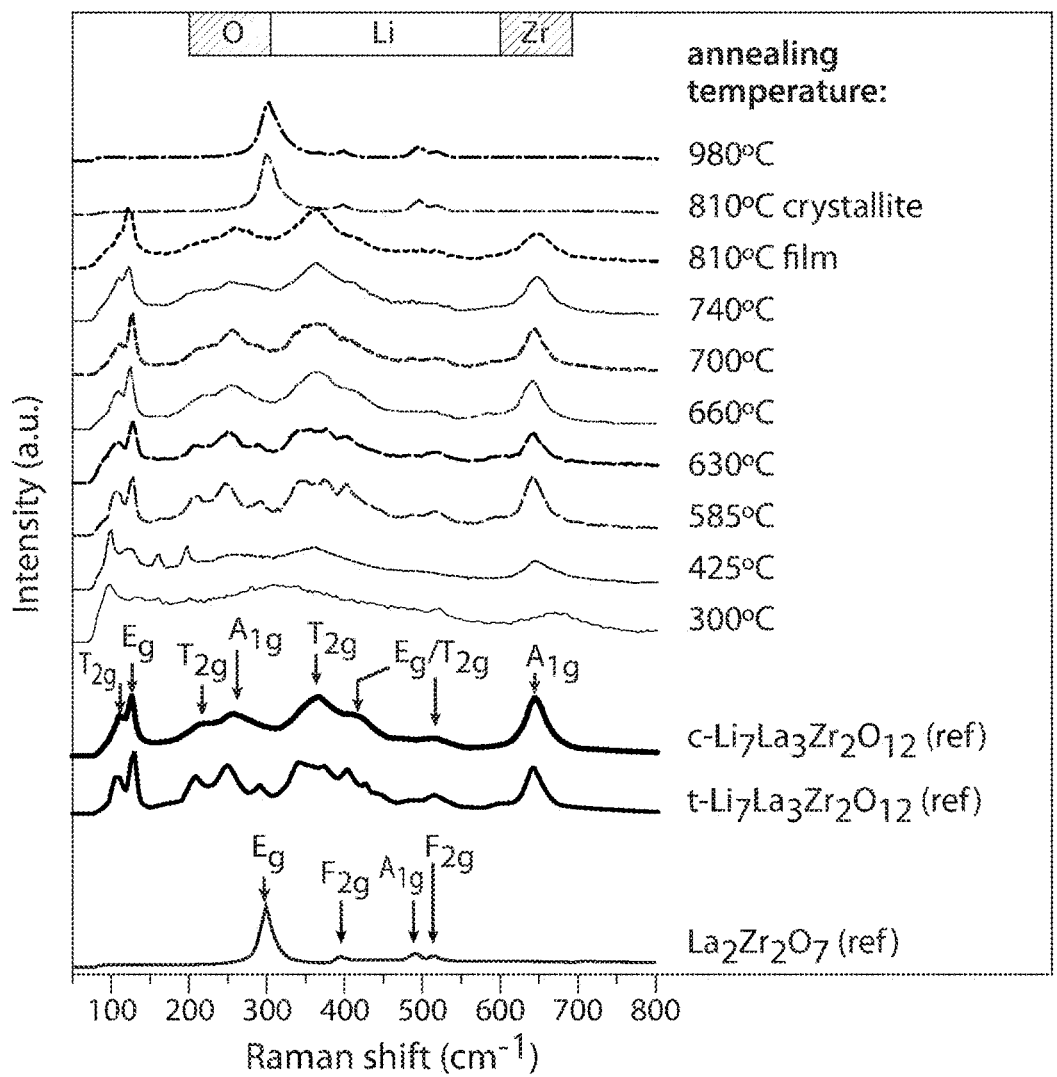
FIG. 10A shows a plot of Raman spectra at various temperatures, according to certain embodiments.
Figure 10B:
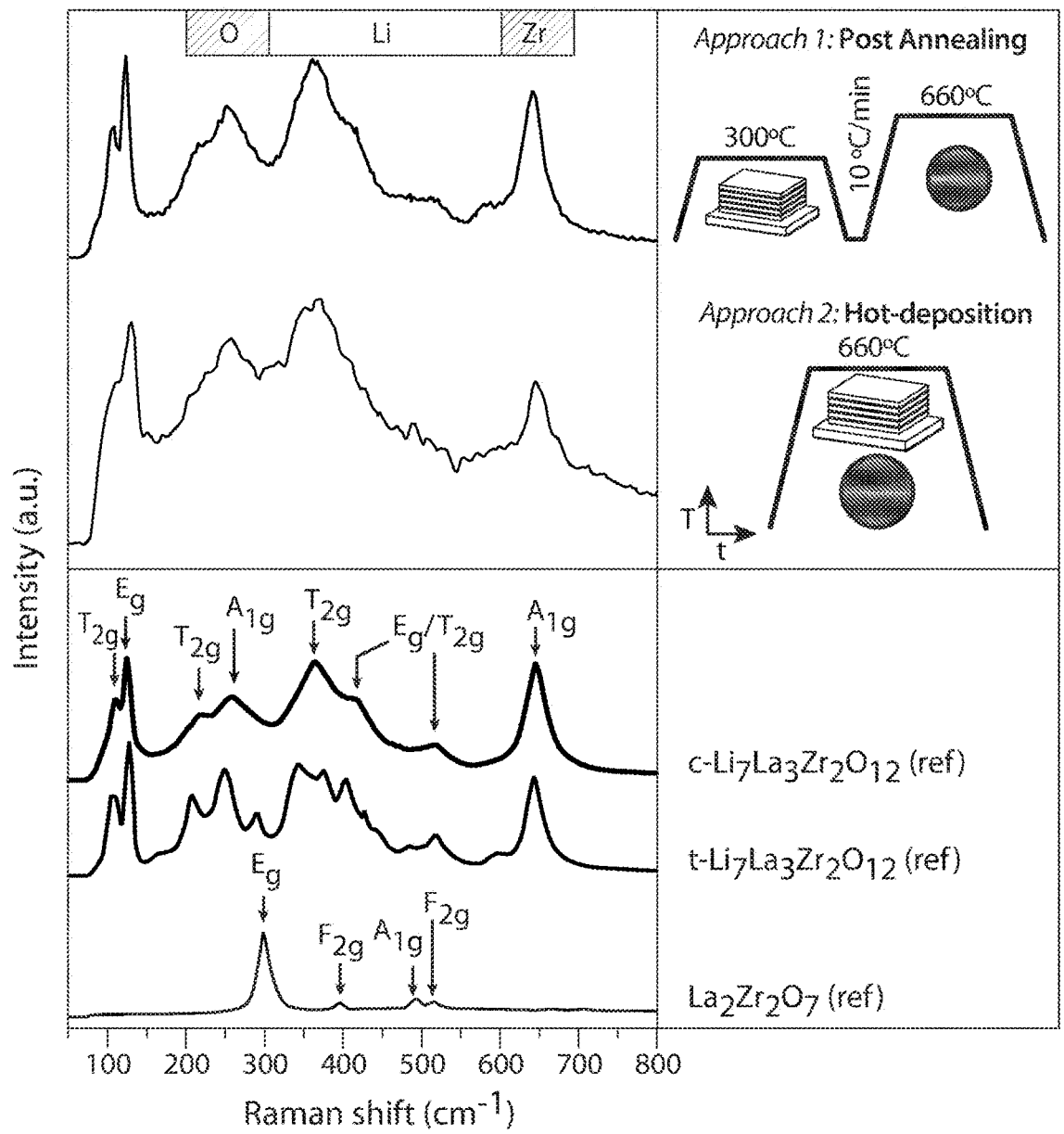
FIG. 10B shows a plot of Raman spectra of thin films fabricated using two different approaches, according to certain embodiments
Figure 10C:
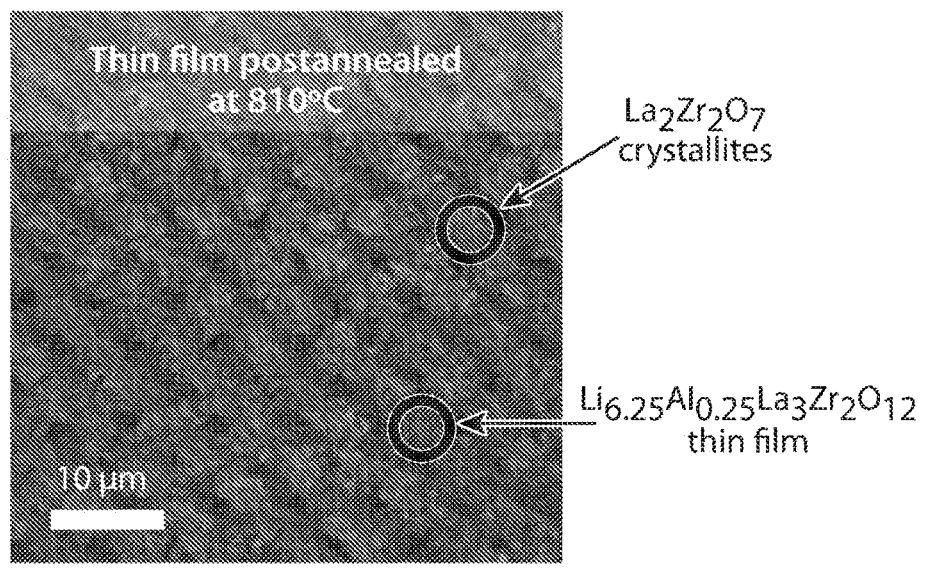
FIG. 10C shows an optical microscopy image of a thin film after being heated above 810° C., according to certain embodiments.

FIG. 10A shows the ex-situ Raman vibrational spectra of multilayered films deposited at 300° C. Each sample was heated, following deposition, to the temperature indicated under pure $O_2$, and then measured by Raman spectroscopy after cooldown to room temperature. Below 300° C., the multilayered structures only revealed a broad amorphous signal in Raman with local maxima around 300 $cm^{-1}$. Upon heating to 425° C., first distinct peaks between 100 $cm^{-1}$ and 200 $cm^{-1}$ started to appear, indicating the start of a crystallization process. At 585° C., full development of the tetragonal phase of $Li_{6.25}Al_{0.25}La_3Zr_2O_{12}$ could be observed with characteristic peaks at 100 cm$^{-1}$ assigned to $T_{2g}$ vibrational modes as well as the triplet between 200 cm$^{-1}$ and 300 cm$^{-1}$ with $T_{2g}$ and $A_{1g}$ vibrational modes, respectively. Notably, at this temperature a peak at 650 cm$^{-1}$ (assigned to $A_{1g}$ vibrational modes) also emerged and remained present over all further post annealing temperatures up to 710° C. Upon further heating from 585° C. upward, a transformation from the tetragonal LLZO to cubic form could be observed. At around 660° C., the full structure of cubic LLZO was developed. Clear peaks of the $E_g$ Lanthanum-sublattice around 100 cm$^{-1}$ could be distinguished as well as oxygen vibrational modes ($T_{2g}$ and $A_{1g}$) between 180 cm$^{-1}$ and 300 cm$^{-1}$ and characteristic lithium vibrations ($T_{2g}$ and $E_g$) between 300 cm$^{-1}$ and 600 cm$^{-1}$. The signal corresponding to the cubic phase persisted upon higher annealing temperatures up to a value of 710° C. At the even more elevated temperature of 810° C., the appearance of the common delithiated phase $La_2Zr_2O_7$ (pyrochlore) started emerging over the film with peaks at 299 cm$^{-1}$, 394 cm$^{-1}$, 492 cm$^{-1}$, 516 cm$^{-1}$ for $E_g$, $F_{2g}$, $A_{1g}$ and $F_{2g}$, respectively. As shown in a light microscopy picture in FIG. 10B, the appearance of this $La_2Zr_2O_7$ phase did not happen homogeneously. The appearance of $La_2Zr_2O_7$ started in islands, whereas the remaining part of the thin film still showed the full featureset of cubic LLZO in Raman. This inhomogeneous appearance of the delithiated phase was confirmed by Raman spot measurements focusing on each region of the remaining film, as indicated in FIG. 3B. After annealing at 980° C., the entire thin film was transformed to the delithiated $La_2Zr_2O_7$, and no remaining regions with features of cubic LLZO could be found by Raman. The same behavior as the one just described could also be observed in an in-situ Raman experiment. However, due to the experimental setup, the background noise was much higher, as described below. FIG. 10B shows ex situ Raman spectra of thin films fabricated using the two different approaches (approach 1 and approach 2 illustrated in FIG. 7B) and described above, as well as reference Raman spectra for cubic LLZO, tetragonal LLZO, and $La_2Zr_2O_7$. The Raman spectra of the thin films fabricated by the two different approaches were largely similar.

Figure 13:
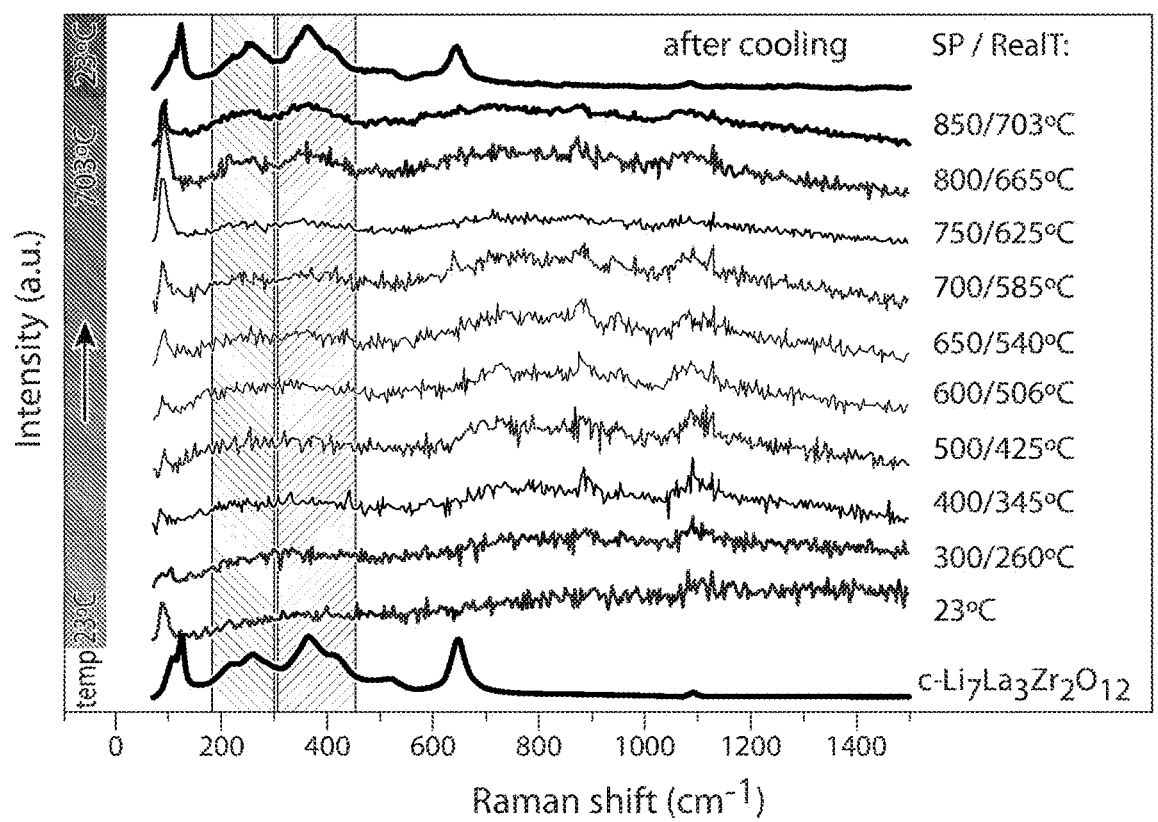
FIG. 13 shows a plot of Raman spectra at various temperatures, according to certain embodiments.

The observation of the transformation from $Li_3N/Li_{6.25}Al_{0.25}La_3Zr_2O_{12}$ multilayered electrolyte thin film could also be observed in-situ by heating a sample to different temperatures while at the same time observing its Raman vibrational spectroscopy signal. Due to the long working distance between the sample inside the heater and Raman microscope, only a low numerical aperture 50× lens could be used. This use of a low numerical aperture lens led to much higher background noise levels than for the study conducted ex-situ. Still, observations as in the ex-situ analysis could be attained, and a temperature range of 23° C.-700° C. was found adequate for the crystallization of cubic LLZO from the grown multilayers of amorphous nature. In-situ Raman allowed for an assessment of the annealing times required to obtain the different phases. FIG. 13 shows the in situ Raman spectra acquired. Surprisingly, —unlike in pellet processing of LLZO, in-situ Raman indicated that a duration of only 15 minutes of annealing time at each of the measured temperatures was sufficient to establish the respective phases over the entire surface of the thin film. Based on this results, 15 minutes was fixed as the annealing time for the ex-situ experiments.

Figure 11:
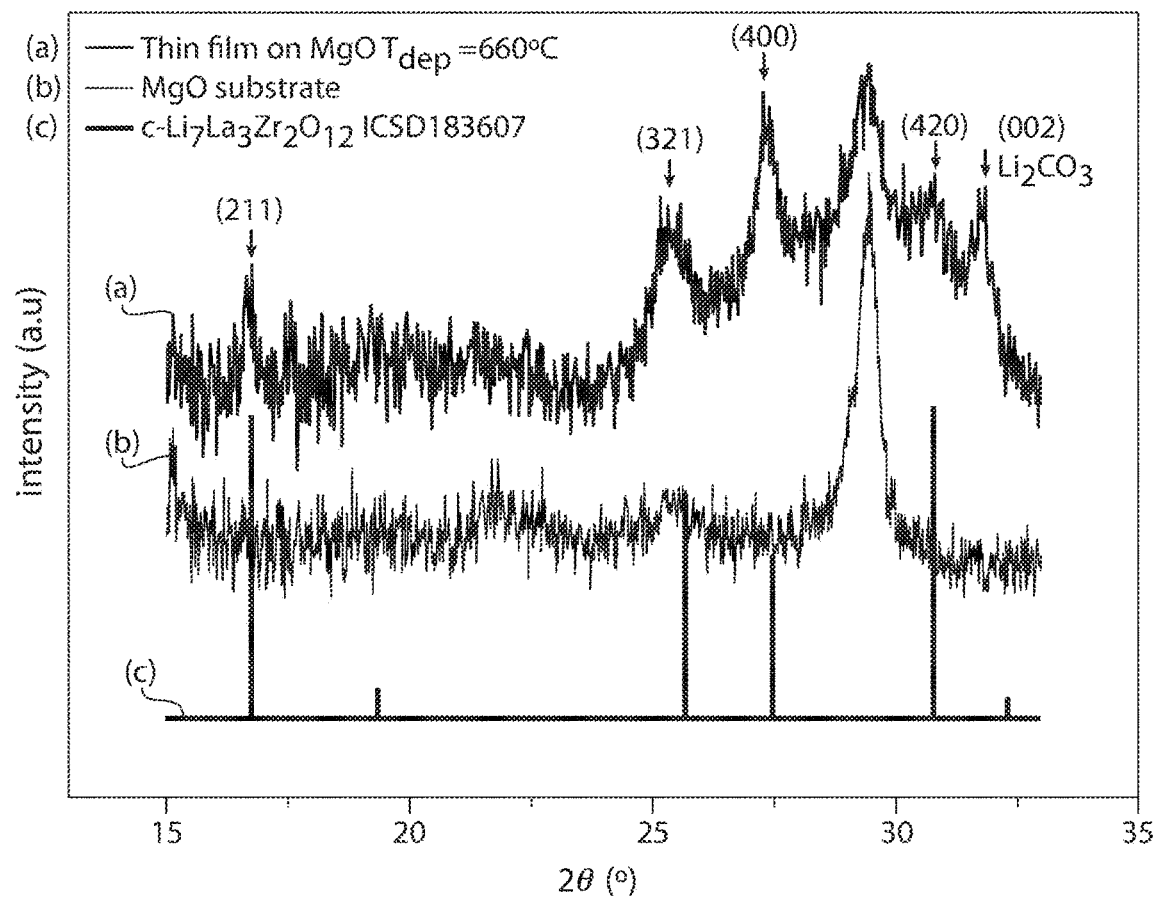
FIG. 11 shows the thin film X-ray diffraction (XRD) pattern of a thin film, according to certain embodiments.

FIG. 11 shows a grazing incidence XRD measurement that was performed on a thin film that was deposited at 660° C. with the same multilayer procedure. As can be seen, diffraction peaks of cubic LLZO of the respective orientations (211), (321), (400) and (420) between 15° and 32.5° 2θ could be observed. Furthermore, it is important to note that peaks corresponding to the (002) orientation of $Li_2CO_3$ were also detected. Without wishing to be bound by theory, the observation of the peaks corresponding to $Li_2CO_3$ was likely due to the long exposure of the thin film to humid ambient atmosphere during the measurement.

Figure 15:
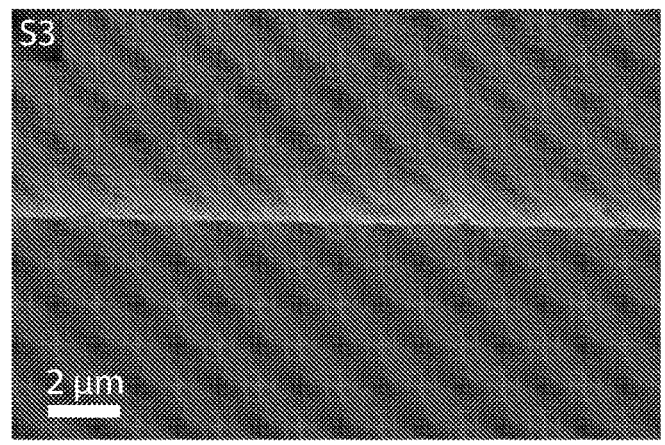
FIG. 15 shows a scanning electron microscopy (SEM) image of a thin film, according to certain embodiments.
Figure 16:
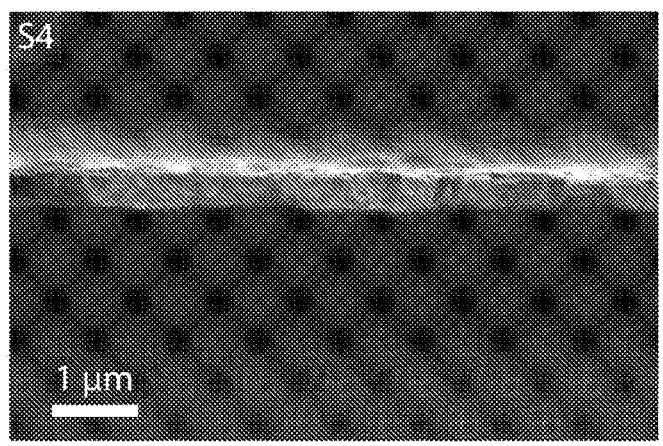
FIG. 16 shows an SEM image of a thin film, according to certain embodiments.

As an additional technique for characterizing the extent to which the initial multilayer thin film merged upon annealing to form a homogeneous cubic LLZO film, additional cross-sectional SEM images were been taken. As observed in the FIG. 15, FIG. 16, and FIG. 17, merging was attained for both fabrication approaches, i.e., for the films directly deposited at 660° C. without a further post annealing step (FIG. 15 and FIG. 16), and for the films deposited at 300° C. followed by a post annealing at 660° C. in pure $O_2$ (FIG. 17).

Electrical Impedance Measurement of Cubic LLZO Thin Films.

Figure 12:
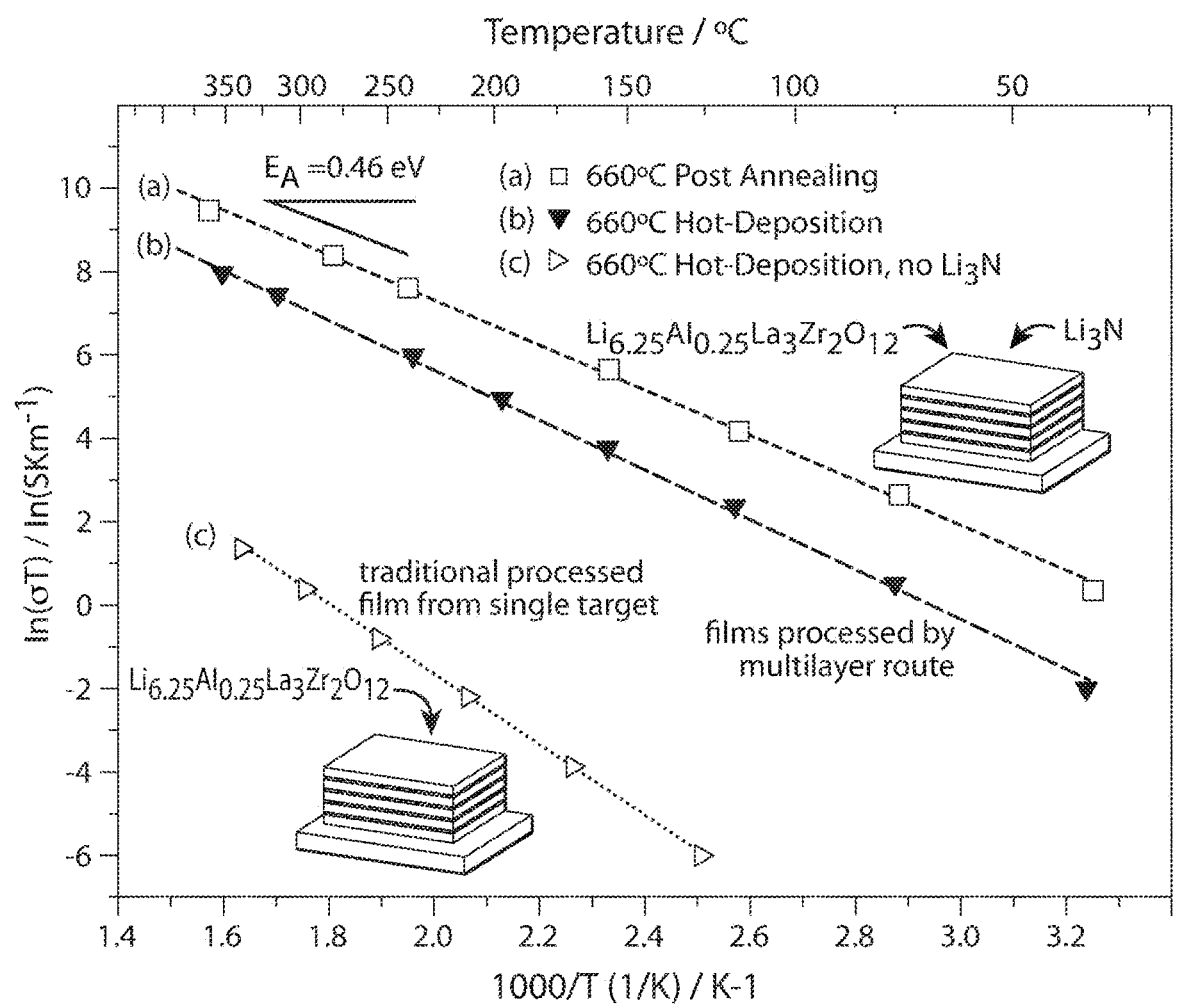
FIG. 12 shows a plot of the temperature dependence of the in-plane total conductivity of selected thin films, according to certain embodiments.

FIG. 12 shows a comparison of the conductivity of thin films assessed in an in-plane geometry with platinum electrodes. Three different thin films were measured in the temperature range from room temperature to 450° C. Two films were deposited with a $Li_3N$ second target, while a third, comparative film was deposited using at 660° C. with the same first LLZO first target as the other two films but without the use of a $Li_3N$ second target. In the direct comparison of the multilayered thin films either deposited directly at 660° C. (labeled as "Hot-Deposition" in FIG. 12) or at 300° C. with post annealing under pure $O_2$ at 660° C. (labeled as "Post-Annealing" in FIG. 12), it could be seen that in the latter, a higher total conductivity as well as a lower activation energy of 0.42 eV could be observed. A total ionic conductivity of $2.9(5)\times10^{-5}$ S·cm$^{-1}$ at room temperature (23° C.) was determined for the Post-Annealing film, and a total ionic conductivity of $0.26(5)\times10^{-5}$ S·cm$^{-1}$ at room temperature (23° C.) was determined for the "Hot-Deposition" film. Without wishing to be bound by theory, this increased conductivity could be explained by the better access to oxygen if exposed to 1 atm of $O_2$ and therefore facilitated transformation and loss of nitrogen than in the case of low partial pressure of oxygen in the PLD vacuum chamber when grown directly. The SEM images of the two films, shown in FIG. 16 and FIG. 17, respectively, show slightly different morphologies of the thin films when comparing their cross sectional images, suggesting that another possible explanation could be differing morphologies. Post annealing at higher temperature of 700° C. enlarged the activation energy and corresponding thin films showed lower conductivity. As can be seen in FIG. 12, both the Post-Annealing thin film and the Hot-Deposition thin film had significantly higher total ionic conductivity than the comparative film (labeled as "Hot-Deposition, no $Li_3N$") that was not deposited with a $Li_3N$ second target. A total ionic conductivity of $5.96(5)\times10^{-11}$ S·cm$^{-1}$ at room temperature (23° C.) was determined for the comparative "Hot-Deposition, no $Li_3N$" film, indicating that the use of an $Li_3N$ second target during deposition significantly increases the total ionic conductivity of the thin film.

Figure 14:
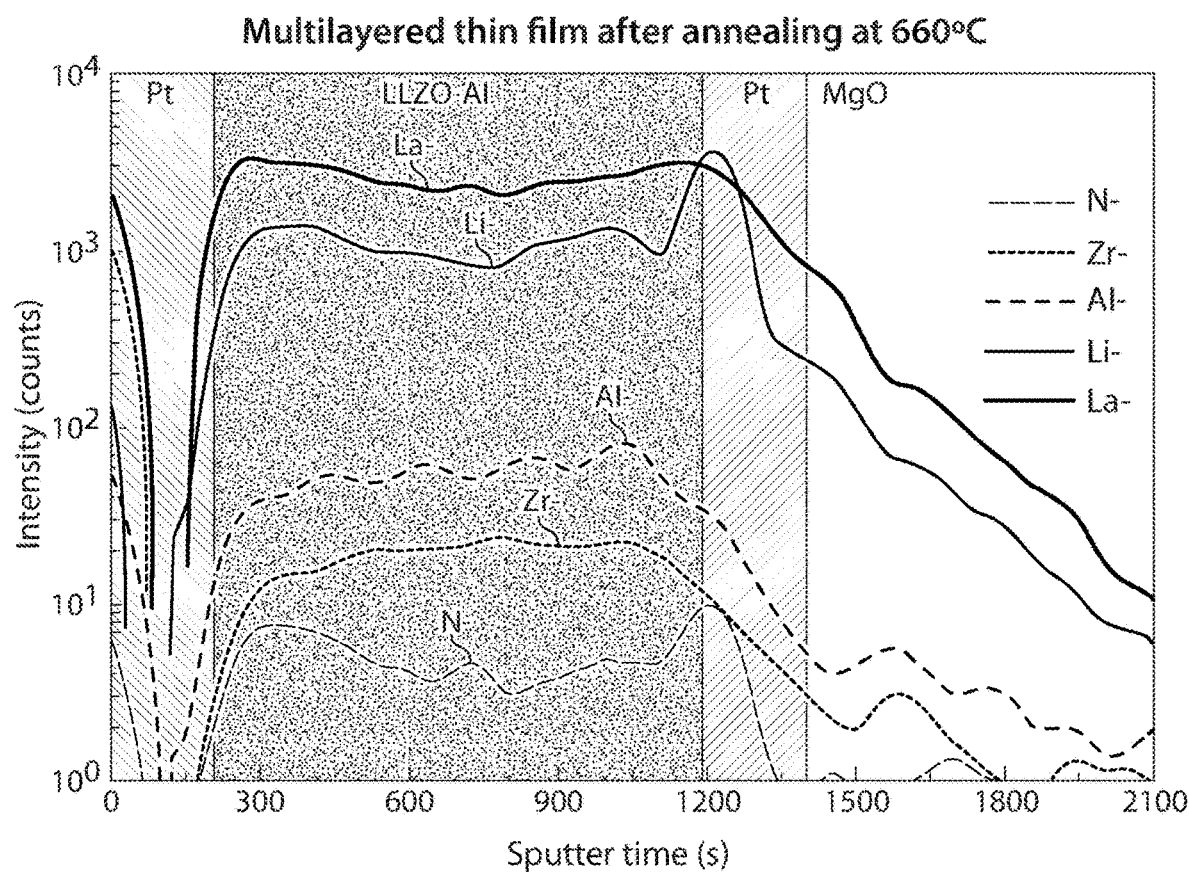
FIG. 14 shows a plot of negative ion time-of-flight secondary ion mass spectroscopy data of a thin film, according to certain embodiments.

In order to assess the extent of transformation of the initial multilayered structure, negative ion time-of-flight secondary ion mass spectroscopy (negative ion TOF-SIMS) was employed on films deposited at 300° C. followed by a post annealing treatment (15 min. at 660° C., under 20 sccm pure $O_2$). As can be seen in FIG. 14, the signal of nitrogen after annealing at 660° C. decreased to almost the detection limit of TOF-SIMS (<10 cpm). Without wishing to be bound by theory, one possible explanation is the near complete decomposition of the initial Li$_3$N layer and lithium diffusion into the neighboring Li$_{6.25}$Al$_{0.25}$La$_3$Zr$_2$O$_{12}$ layers aiding and facilitating the formation of the cubic phase of Li$_{6.25}$Al$_{0.25}$La$_3$Zr$_2$O$_{12}$ in the thin film form. Notably, the oscillatory nature of the aluminum signal in FIG. 14 reveals the periodic nature of the initial multilayers as they were deposited.

These examples demonstrate a systematic and reproducible method for depositing the cubic phase of garnet LLZO solid state electrolyte in the form of thin films using PLD using an approach combining LLZO with Li$_3$N layers, thus compensating the typical lithium loss during PLD deposition of the garnet. Two sets of deposition conditions were demonstrated to be successful for the stabilization of the cubic phase: a direct multilayer deposition at a relatively high temperature of 660° C. and a low temperature (300° C.) deposition followed by post-annealing. Thin films fabricated by the latter approach were measured to have an ionic conductivity of $2.89 \times 10^{-5}$ S·cm$^{-1}$ at room temperature (23° C.) and a low activation energy of 0.42 eV.

Example 3

This example describes experimentation, embodiments, and non-limiting theories regarding the mechanisms and parameters guiding the fabrication of Li-containing thin film electrolytes and electrodes. In particular, this example describes the formation of an exemplary thin film of an anode electrode material comprising lithium, titanium, and oxygen using methods described herein. The materials and parameter values described in this example are non-limiting and by way of example, only.

Two thin films were fabricated—one comparative film (labeled "LTO" in FIG. 18) deposited using only a first target comprising Li$_4$Ti$_5$O$_{12}$, and one film (labeled "LTO-LN" in FIG. 18) deposited using both the first target comprising Li$_4$Ti$_5$O$_{12}$ and a second target comprising Li$_3$N (made according to the same procedure as described in Example 1). Both films were deposited by pulsed laser deposition (PLD). The equipment for deposition (PLD, Surface, Germany) included a KrF excimer laser of 248 nm wavelength that operated at a pulse repetition rate of 10 Hz and 5 Hz for the Li$_3$N and Li$_4$Ti$_5$O$_{12}$ targets, respectively. Both PLD targets were thoroughly polished prior to transfer into the vacuum chamber. The target-to-substrate distance was kept constant at 70 mm, and background pressures during deposition were fixed at $1.7 \times 10^{-2}$ hPa O$_2$ in the case of Li$_4$Ti$_5$O$_{12}$-layers and 0.04 hPa O$_2$ in the case of Li$_3$N-layers. The LTO-LN film deposited with both targets was made of exactly 9 individual layers during deposition: 5 were chosen to be 50 nm-thick layers of Li$_4$Ti$_5$O$_{12}$ (including the top layer and bottom layer) and 4 intermediate layers were chosen to be 25 nm-thick layers of Li$_3$N. The temperature of the substrate was kept constant at 660° C. during the deposition of the LTO-LN as a multilayer structure (e.g., the LTO-LN was "hot-deposited"). As a substrate, 10 mm×10 mm (001) oriented MgO (Crystec, Germany) was used for all thin film structural and electrochemical analysis.

Figure 18:
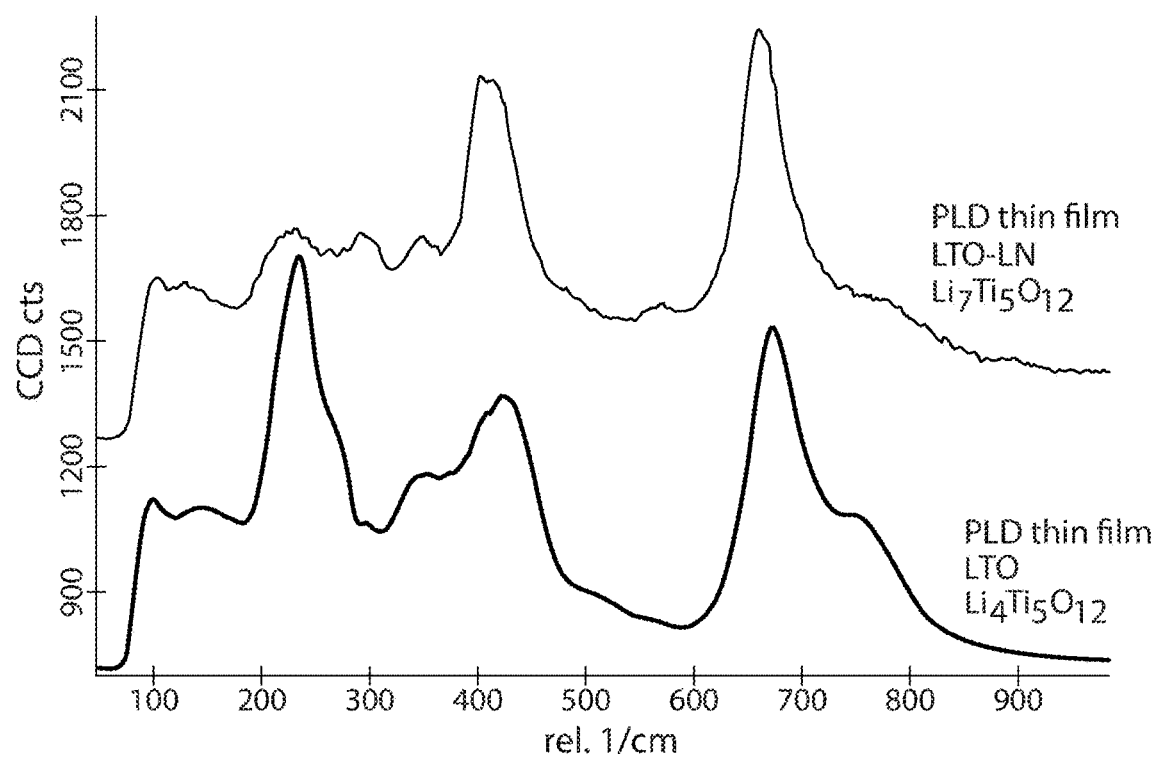
FIG. 18 shows a plot comparing Raman spectra, according to certain embodiments.

The compositions of the comparative LTO thin film and the LTO-LN thin films were investigated using ex-situ Raman spectroscopy using the same procedures as described in Example 1 (532 nm laser excitation, 10 mW laser power). FIG. 18 shows a plot of the Raman spectra of each film (vertically offset for clarity). As seen in FIG. 18, distinct Raman spectra are observed for the comparative LTO film (bottom spectrum) and the LTO-LN (top spectrum) film. The comparative LTO thin film shows a spectrum corresponding to that of Li$_4$Ti$_5$O$_{12}$, while the LTO-LN shows a spectrum corresponding to that of Li$_7$Ti$_5$O$_{12}$. This experiment demonstrates that the use of a second target comprising lithium and nitrogen can lead to the formation of thin films having a higher lithium content than those formed from the same primary target, but in the absence of a second target comprising lithium and nitrogen.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein in the specification and in the claims, the phrase "at least a portion" should be understood to mean at least some or all, and, in some embodiments, at least 10%, at least 25%, at least 50%, at least 75%, at least 90%, at least 95%, or at least 99%.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method, comprising:
    (1) inducing formation of a first vapor from a first target comprising a lithium-containing material and formation of a second vapor from a second target comprising lithium and nitrogen such that the first vapor and the second vapor are deposited on a surface, resulting in the formation of a thin film comprising a lithium-containing material on the surface,
    wherein:
        the formation of the first vapor and the formation of the second vapor are induced sequentially,
        at least a portion of the formation of the first vapor and at least a portion of the formation of the second vapor occur under vacuum conditions,
        the thin film on the surface comprises:
            (a) nitrogen at a lattice site, and/or
            (b) interstitial nitrogen, and
        the thin film on the surface comprises a multilayer film comprising alternating layers of a first layer comprising the lithium-containing material of the thin film and a second layer comprising lithium and nitrogen; and
    (2) removing a majority of nitrogen in the multilayer film and/or merging the alternating layers.

2. The method of claim 1, wherein the formation of the first vapor comprises inducing a plasma state of at least a portion of the first target.

3. The method of claim 1, wherein the formation of the first vapor comprises sputtering, evaporation, and/or pulsed laser irradiation of at least a portion of the first target.

4. The method of claim 1, wherein the formation of the second vapor comprises inducing a plasma state of at least a portion of the second target.

5. The method of claim 1, wherein the formation of the second vapor comprises sputtering, evaporation, and/or pulsed laser irradiation of at least a portion of the second target.

6. The method of claim 1, wherein the surface and/or the thin film are held at a temperature of between 580° C. and 800° C. for at least a portion of time during the formation of the thin film.

7. The method of claim 1, wherein the surface and/or the thin film are held at a temperature of between 15° C. and 35° C. for at least a portion of time during the formation of the thin film.

8. The method of claim 1, wherein the surface and/or the thin film are held at a temperature of between 200° C. and 900° C. for at least a portion of time during the formation of the thin film.

9. The method of claim 1, wherein the surface and/or the thin film are held at a first temperature for at least a portion of time during the formation of the thin film and then held at a second temperature following the formation of the thin film, wherein the second temperature is at least 100° C. higher than the first temperature.

10. The method of claim 1, wherein the surface and/or the thin film are held at a temperature of between 580° C. and 800° C. following the formation of the thin film.

11. The method of claim 1, wherein the surface and/or the thin film are held at a temperature of between 200° C. and 900° C. following the formation of the thin film.

12. The method of claim 1, wherein the thin film comprises nitrogen at a lattice site.

13. The method of claim 1, wherein the thin film comprises interstitial nitrogen.

14. The method of claim 1, wherein the lithium-containing material of the first target and/or the lithium-containing material of the thin film comprises a lithium-containing oxide.

15. The method of claim 1, wherein the lithium-containing material of the first target and/or the lithium-containing material of the thin film comprises a lithium metal oxide.

16. The method of claim 1, wherein lithium-containing material of the first target and/or the lithium-containing material of the thin film comprises one or more transition metals.

17. The method of claim 1, wherein the lithium-containing material of the first target and/or the lithium-containing material of the thin film comprises a garnet.

18. The method of claim 1, wherein the lithium-containing material of the first target and/or the lithium-containing material of the thin film comprises a perovskite.

19. The method of claim 1, comprising removing a majority of nitrogen in the multilayer film.

20. The method of claim 19, wherein at least 80 volume percent of the thin film is single crystalline or polycrystalline following the removing step.

21. The method of claim 1, wherein the lithium-containing material of the thin film comprises lanthanum, zirconium, and oxygen.

22. The method of claim 21, wherein the lithium-containing material of the thin film comprises one or more dopants.

23. The method of claim 22, wherein the lithium-containing material of the thin film comprises a cubic phase of $Li_aLa_bZr_cO_dX_e$, wherein X is at least one of the one or more dopants and e can be 0, and wherein optionally nitrogen replaces Li, La, Zr, O, and/or X at one or more of the lattice sites of the cubic lattice such that nitrogen is present in the $Li_aLa_bZr_cO_dX_e$ in an amount up to 1.0 at %.

24. The method of claim 23, wherein a is in the range of from 4.0 to 9.0, b is in the range of from 1.5 to 4.0, c is in the range of from 1.5 to 2.1, d is in the range of from 10.0 to 13.0, and e is in the range of from 0 to 4.0.

25. The method of claim 24, wherein a is 6.25, b is 3, c is 2, d is 12, and X is Al, and e is 0.25.

26. The method of claim 24, wherein the lithium-containing material the thin film comprises $Li_7La_{2.75}Zr_{1.75}O_{12}Ca_{0.25}Nb_{0.25}$, $Li_7La_3Zr_{1.75}O_{12}Nb_{0.25}$, $Li_{6.19}La_3Zr_{1.75}O_{12}Al_{0.28}Ta_{0.25}$, $Li_{6.19}La_3Zr_{1.75}O_{12}Al_{0.25}Ta_{0.25}$, $Li_{6.19}La_{2.75}Zr_{1.75}O_{12}Ca_{0.25}Ta_{0.25}$, $Li_{6.58}La_{2.75}Zr_{1.75}O_{12}Ga_{0.14}Ca_{0.25}Nb_{0.25}$, and/or $Li_{6.58}La_3Zr_{1.75}O_{12}Ga_{0.14}Nb_{0.25}$.

27. The method of claim 1, comprising merging the alternating layers.

28. A method, comprising:
(1) inducing formation of a first vapor from a first target comprising a lithium-containing material and formation of a second vapor from a second target comprising lithium and nitrogen such that the first vapor and the second vapor are deposited on a surface, resulting in the formation of a thin film on the surface, the thin film comprising a multilayer film comprising alternating layers of a first layer comprising a lithium-containing material and a second layer comprising lithium and nitrogen, and
(2) removing a majority of nitrogen in the multilayer film and/or merging the alternating layers,
wherein:
the formation of the first vapor and the formation of the second vapor are induced sequentially,
at least a portion of the formation of the first vapor and at least a portion of the formation of the second vapor occur under vacuum conditions.

* * * * *